(12) United States Patent
Ochiai et al.

(10) Patent No.: US 12,155,947 B2
(45) Date of Patent: Nov. 26, 2024

(54) IMAGING DEVICE WITH CAPACITANCE SWITCHING

(71) Applicant: SONY SEMICONDUCTOR SOLUTIONS CORPORATION, Kanagawa (JP)

(72) Inventors: Soichi Ochiai, Kanagawa (JP); Takeyoshi Komoto, Kanagawa (JP); Masahiko Nakamizo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 183 days.

(21) Appl. No.: 17/596,845

(22) PCT Filed: Jun. 22, 2020

(86) PCT No.: PCT/JP2020/024451
§ 371 (c)(1),
(2) Date: Dec. 20, 2021

(87) PCT Pub. No.: WO2020/262323
PCT Pub. Date: Dec. 30, 2020

(65) Prior Publication Data
US 2022/0321816 A1 Oct. 6, 2022

(30) Foreign Application Priority Data
Jun. 26, 2019 (JP) .................. 2019-118910

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H01L 27/14636* (2013.01);
(Continued)

(58) Field of Classification Search
CPC ........ H04N 25/75; H04N 25/59; H04N 25/60; H04N 25/79; H01L 27/14612;
(Continued)

(56) References Cited

U.S. PATENT DOCUMENTS

| 2009/0322917 A1 | 12/2009 | Kyogoku et al. |
| 2010/0182465 A1 | 7/2010 | Okita |

(Continued)

FOREIGN PATENT DOCUMENTS

| CN | 102387324 A | 3/2012 |
| CN | 103067674 A | 4/2013 |

(Continued)

OTHER PUBLICATIONS

International Search Report and Written Opinion of PCT Application No. PCT/JP2020/024451, issued on Sep. 8, 2020, 15 pages of ISRWO.

*Primary Examiner* — Padma Haliyur
(74) *Attorney, Agent, or Firm* — CHIP LAW GROUP

(57) ABSTRACT

An imaging device includes a first substrate, a second substrate, a third substrate, and a switching unit. The first substrate has a pixel including a photodiode and floating diffusion that holds the charge converted by the photodiode. The second substrate has a pixel circuit that reads out a pixel signal based on the charge held in the floating diffusion in the pixel, and is stacked on the first substrate. The third substrate has a processing circuit that detects a pixel signal read out by the pixel circuit, and is stacked on the second substrate. The switching unit is provided to enable electrical connection between the floating diffusion and a floating diffusion of another pixel in the first substrate, and is provided on the second substrate. As a result, by switching the capacitance of the floating diffusion of the pixel using (Continued)

floating diffusion of another pixel, it is possible to switch the charge-voltage conversion efficiency levels.

4 Claims, 50 Drawing Sheets

(51) Int. Cl.
*H04N 25/59* (2023.01)
*H04N 25/60* (2023.01)
*H04N 25/79* (2023.01)

(52) U.S. Cl.
CPC ....... *H01L 27/14643* (2013.01); *H04N 25/59* (2023.01); *H04N 25/60* (2023.01); *H04N 25/79* (2023.01)

(58) Field of Classification Search
CPC ......... H01L 27/14636; H01L 27/14643; H01L 2224/08145; H01L 21/3205; H01L 21/768; H01L 23/522; H01L 25/065; H01L 25/07; H01L 25/18; H01L 27/146; H01L 27/14609

See application file for complete search history.

(56) References Cited

U.S. PATENT DOCUMENTS

| | | |
|---|---|---|
| 2012/0057056 A1 | 3/2012 | Oike |
| 2013/0092820 A1* | 4/2013 | Takemoto .............. H04N 25/70 250/208.1 |
| 2013/0207219 A1* | 8/2013 | Ahn .................. H01L 27/14634 257/443 |
| 2015/0296155 A1 | 10/2015 | Tanaka |
| 2016/0293648 A1 | 10/2016 | Soda |
| 2016/0316166 A1 | 10/2016 | Kubo et al. |
| 2017/0323912 A1* | 11/2017 | Lahav ............... H01L 27/14609 |
| 2017/0347047 A1* | 11/2017 | Mao .................. H01L 27/14641 |
| 2018/0027192 A1* | 1/2018 | Morisaki ................ H04N 25/75 348/308 |
| 2020/0280255 A1* | 9/2020 | Tsukuda ................. H04N 25/77 |
| 2021/0144315 A1* | 5/2021 | Yun ........................ H04N 25/59 |

FOREIGN PATENT DOCUMENTS

| | | |
|---|---|---|
| CN | 106129075 A | 11/2016 |
| JP | 2005-223559 A | 8/2005 |
| JP | 2010-010896 A | 1/2010 |
| JP | 2010-193437 A | 9/2010 |
| JP | 2010-245506 A | 10/2010 |
| JP | 2012-054876 A | 3/2012 |
| JP | 2013-090127 A | 5/2013 |
| JP | 2015-032687 A | 2/2015 |
| JP | 2015-204469 A | 11/2015 |
| JP | 2016-195186 A | 11/2016 |
| KR | 10-2012-0023547 A | 3/2012 |
| TW | 201220484 A | 5/2012 |
| TW | 201909440 A | 3/2019 |
| WO | 2015/016140 A1 | 2/2015 |
| WO | 2015/111374 A1 | 7/2015 |

* cited by examiner

IMAGING DEVICE WITH CAPACITANCE SWITCHING

CROSS REFERENCE TO RELATED APPLICATIONS

This application is a U.S. National Phase of International Patent Application No. PCT/JP2020/024451 filed on Jun. 22, 2020, which claims priority benefit of Japanese Patent Application No. JP 2019-118910 filed in the Japan Patent Office on Jun. 26, 2019. Each of the above-referenced applications is hereby incorporated herein by reference in its entirety.

FIELD

The present disclosure relates to an imaging device.

BACKGROUND

In conventional technologies, miniaturization, with regard to an area per pixel, in an imaging device having a two-dimensional structure has been realized by introduction of a microfabrication process and improvement of mounting density. In recent years, an imaging device having a three-dimensional structure has been developed in order to realize further miniaturization of the imaging device and densification of pixels. An imaging device having a three-dimensional structure has a configuration in which a semiconductor substrate including a plurality of sensor pixels and a semiconductor substrate including a signal processing circuit that processes a signal obtained by each of the sensor pixels are stacked on each other.

CITATION LIST

Patent Literature

Patent Literature 1: JP 2010-245506 A

SUMMARY

Technical Problem

By the way, when stacking three layers of semiconductor chips in an imaging device having a three-dimensional structure, it is not practical to bond all the semiconductor substrates with their front surfaces. In three semiconductor substrates stacked with insufficient consideration, there is a possibility of an increased chip size or hindrance on miniaturization of an area per pixel due to a structure of electrically connecting the semiconductor substrates to each other. In view of this, it is desirable to provide an imaging device having a three-layer structure that has a chip size equivalent to the current chip size and would not hinder miniaturization of an area per pixel.

Solution to Problem

To solve the problems described above, an imaging device includes a first substrate, a second substrate, a third substrate, and a switching unit. The first substrate has a pixel including a photodiode and floating diffusion that holds the charge converted by the photodiode. The second substrate has a pixel circuit that reads out a pixel signal based on the charge held in the floating diffusion in the pixel, and is stacked on the first substrate. The third substrate has a processing circuit that detects a pixel signal read out by the pixel circuit, and is stacked on the second substrate. The switching unit is provided to enable electrical connection between the floating diffusion and a floating diffusion of another pixel in the first substrate, and is provided on the second substrate.

Advantageous Effects of Invention

By switching the FD capacitance according to the imaging environment without increasing the arrangement area of the first substrate, it is possible to switch charge-voltage conversion efficiency levels.

BRIEF DESCRIPTION OF DRAWINGS

FIG. 37 is a schematic plan view illustrating another example of a pixel isolation portion illustrated in FIG. 7A and the like.

DESCRIPTION OF EMBODIMENTS

An embodiment of the present disclosure will be described below in detail with reference to the drawings. In each of the following embodiments, the same parts are denoted by the same reference symbols, and a repetitive description thereof will be omitted.

Hereinafter, embodiments for carrying out the present disclosure will be described in detail with reference to the drawings. Note that the description will be given in the following order.

1. Embodiment 1 (imaging device having stacked structure of three substrates)
2. First modification (planar configuration example 1)
3. Second modification (planar configuration example 2)
4. Third modification (planar configuration example 3)
5. Fourth modification (example having an inter-substrate contact portion provided at central portion of pixel array unit)
6. Fifth modification (example having a planar transfer transistor)
7. Sixth modification (example in which one pixel is connected to one pixel circuit)
8. Seventh modification (configuration example of pixel isolation portion)
9. Embodiment 2
   9.1 Problem to be Solved by Embodiment 2
   9.2 Outline of Embodiment 2
   9.3 Specific example of Embodiment 2-1
   9.3.1 Configuration of Embodiment 2-1
   9.3.2 Operation and Effect of Embodiment 2-1
   9.4 Modification of Embodiment 2
10. Embodiment 3
    10.1 Problem to be solved by Embodiment 3

10.2 Outline of Embodiment 3
10.3 Specific example of Embodiment 3-1
10.3.1 Configuration of Embodiment 3-1
10.3.2 Operation and effect of Embodiment 3-1
10.4 Specific example of Embodiment 3-2
10.4.1 Configuration of Embodiment 3-2
10.4.2 Operation and effect of Embodiment 3-2
10.5 Specific example of Embodiment 3-3
10.5.1 Configuration of Embodiment 3-3
10.5.2 Operation and effect of Embodiment 3-3
11. Application example (imaging system)
12. Examples of application of pixel circuit to products 1. Embodiments

[Functional Configuration of Imaging Device 1]

Figure 1:
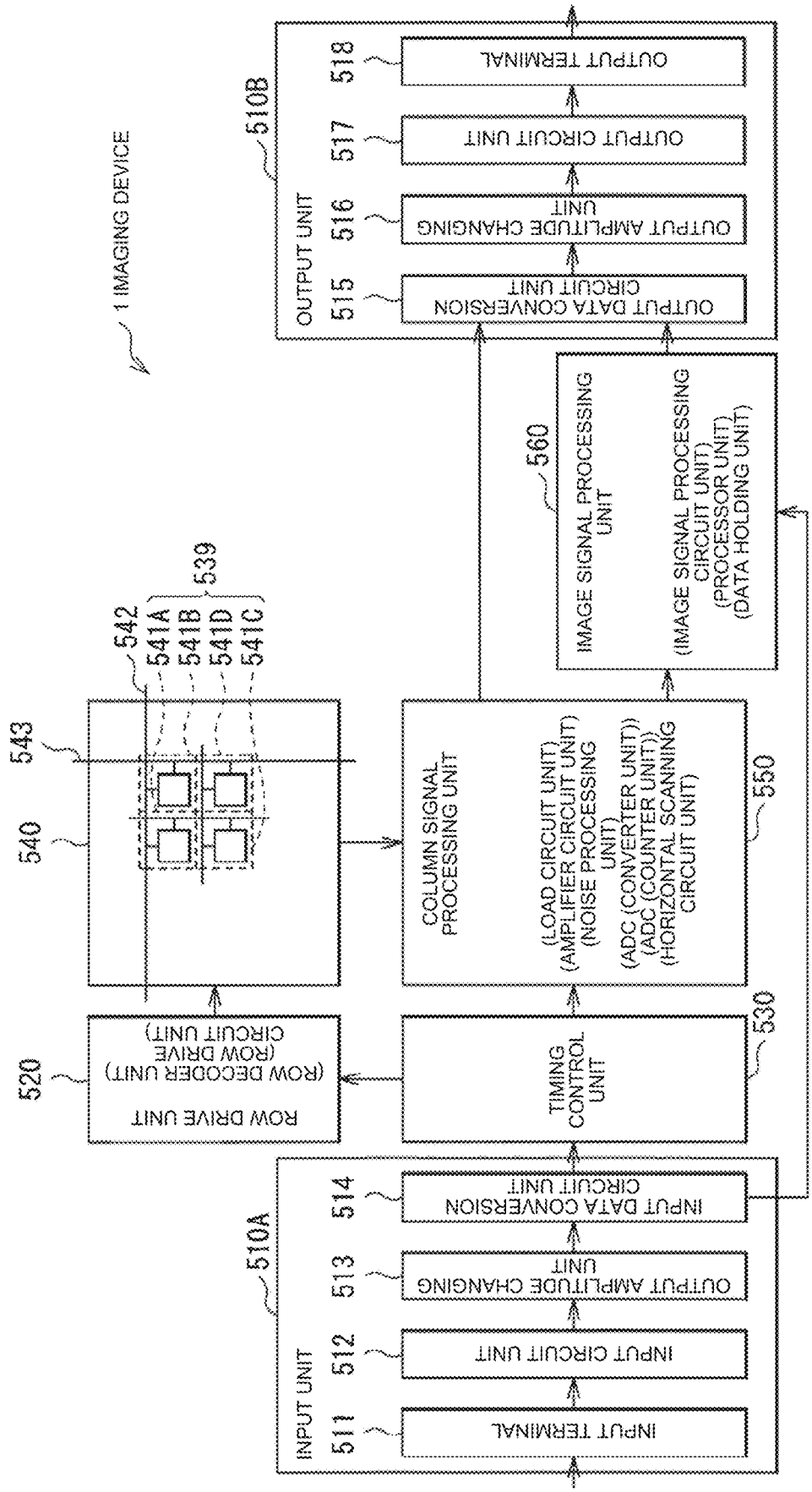
FIG. 1 is a block diagram illustrating an example of a functional configuration of an imaging device according to an embodiment of the present disclosure.

FIG. 1 is a block diagram illustrating an example of a functional configuration of an imaging device (imaging device 1) according to an embodiment of the present disclosure.

The imaging device 1 of FIG. 1 includes, for example, an input unit 510A, a row drive unit 520, a timing control unit 530, a pixel array unit 540, a column signal processing unit 550, an image signal processing unit 560, and an output unit 510B.

The pixel array unit 540 includes pixels 541 repeatedly arranged in an array. More specifically, the pixel sharing unit 539 including a plurality of pixels is a repeating unit, and is repeatedly arranged in an array formed in a row direction and a column direction. In the present specification, for convenience, the row direction is referred to as an H direction, and the column direction orthogonal to the row direction is referred to as a V direction in some cases. In the example of FIG. 1, one pixel sharing unit 539 includes four pixels (pixels 541A, 541B, 541C, and 541D). Each of the pixels 541A, 541B, 541C, and 541D includes a photodiode PD (illustrated in FIG. 6 and the like described below). The pixel sharing unit 539 is a unit of sharing one pixel circuit (a pixel circuit 210 in FIG. 3 described below). In other words, the four pixels (pixels 541A, 541B, 541C, and 541D) share one pixel circuit (the pixel circuit 210 to be described below). By causing the pixel circuit to operate in time division, a pixel signal of each of the pixels 541A, 541B, 541C, and 541D is sequentially read out. The pixels 541A, 541B, 541C, and 541D are each arranged in 2 rows×2 columns, for example. The pixel array unit 540 includes a plurality of row drive signal lines 542 and a plurality of vertical signal lines (column readout lines) 543 together with the pixels 541A, 541B, 541C, and 541D. The row drive signal line 542 drives the pixels 541 included in each of the plurality of pixel sharing units 539 arranged side by side in the row direction in the pixel array unit 540. Pixels to be driven are pixels arranged side by side in the row direction among the pixel sharing unit 539. As will be described in detail below with reference to FIG. 4, the pixel sharing unit 539 is provided with a plurality of transistors. In order to drive each of the plurality of transistors, a plurality of row drive signal lines 542 is connected to one pixel sharing unit 539. The pixel sharing unit 539 is connected to the vertical signal line (column readout line) 543. A pixel signal is read out from each of the pixels 541A, 541B, 541C, and 541D included in the pixel sharing unit 539 via the vertical signal line (column readout line) 543.

The row drive unit 520 includes, for example, a row address control unit that determines a position of a row for pixel drive, in other words, a row decoder unit, and includes a row drive circuit unit that generates a signal for driving the pixels 541A, 541B, 541C, and 541D.

The column signal processing unit 550 includes, for example, a load circuit unit that is connected to the vertical signal line 543 and forms a source follower circuit with the pixels 541A, 541B, 541C, and 541D (pixel sharing unit 539). The column signal processing unit 550 may include an amplifier circuit unit that amplifies a signal read out from the pixel sharing unit 539 via the vertical signal line 543. The column signal processing unit 550 may include a noise processing unit. The noise processing unit removes noise levels of a system from the signal read out from the pixel sharing unit 539 as a result of photoelectric conversion, for example.

The column signal processing unit 550 includes an analog-to-digital converter (ADC), for example. The analog-to-digital converter converts the signal read out from the pixel sharing unit 539 or the noise-processed analog signal into a digital signal. The ADC includes, for example, a comparator unit and a counter unit. The comparator unit compares an analog signal to be converted with a reference signal for comparison. The counter unit is supposed to count the time until the comparison result in the comparator unit is inverted. The column signal processing unit 550 may include a horizontal scanning circuit unit that performs control to scan the readout column.

The timing control unit 530 supplies a signal controlling timing to the row drive unit 520 and the column signal processing unit 550 based on the reference clock signal and the timing control signal input to the device.

The image signal processing unit 560 is a circuit that applies various types of signal processing on data obtained as a result of photoelectric conversion, in other words, data obtained as a result of an imaging operation in the imaging device 1. The image signal processing unit 560 includes, for example, an image signal processing circuit unit and a data holding unit. The image signal processing unit 560 may include a processor unit.

An example of signal processing executed in the image signal processing unit 560 is a tone curve correction process of increasing levels of gradations in a case where the AD converted imaging data is data obtained by imaging a dark subject, and reducing the levels of gradations in a case where the AD converted imaging data is data obtained by imaging a bright subject. In this case, it is desirable to preliminarily store, in the data holding unit of the image signal processing unit 560, the characteristic data of the tone curve, that is, which tone curve is to be used as a bases of the correction of gradation of the imaging data.

The input unit 510A is a unit for inputting the above-described reference clock signal, the timing control signal, the characteristic data, and the like from the outside of the device to the imaging device 1. The timing control signal is, for example, a vertical synchronization signal, a horizontal synchronization signal, or the like. The characteristic data is data to be stored in the data holding unit of the image signal processing unit 560, for example. The input unit 510A includes an input terminal 511, an input circuit unit 512, an input amplitude changing unit 513, an input data conversion circuit unit 514, and a power supply unit (not illustrated), for example.

The input terminal 511 is an external terminal for inputting data. The input circuit unit 512 is a unit for capturing a signal input to the input terminal 511 into the imaging device 1. The input amplitude changing unit 513 changes the amplitude of the signal captured by the input circuit unit 512 to an amplitude highly usable inside the imaging device 1.

The input data conversion circuit unit 514 changes the arrangement of data strings of the input data. The input data conversion circuit unit 514 is constituted with a serial-to-parallel conversion circuit, for example. The serial-to-parallel conversion circuit converts a serial signal received as input data into a parallel signal. The input unit 510A can omit the input amplitude changing unit 513 and the input data conversion circuit unit 514. The power supply unit supplies power set to various voltages required inside the imaging device 1 based on power supplied from the outside to the imaging device 1.

When the imaging device 1 is connected to an external memory device, the input unit 510A may be provided with a memory interface circuit that receives data from the external memory device. Examples of the external memory device include a flash drive, SRAM, and DRAM.

The output unit 510B outputs image data to the outside of the device. Examples of the image data include image data captured by the imaging device 1, image data that has undergone signal processing performed by the image signal processing unit 560, and the like. The output unit 510B includes an output data conversion circuit unit 515, an output amplitude changing unit 516, an output circuit unit 517, and an output terminal 518, for example.

The output data conversion circuit unit 515 is constituted with a parallel-to-serial conversion circuit, and thus, the output data conversion circuit unit 515 converts a parallel signal used inside the imaging device 1 into a serial signal. The output amplitude changing unit 516 changes the amplitude of a signal used inside the imaging device 1. The signal having amplitude changed will have high usability in an external device connected to the outside of the imaging device 1. The output circuit unit 517 is a circuit that outputs data from the inside of the imaging device 1 to the outside of the device, and the output circuit unit 517 also drives wiring outside the imaging device 1 connected to the output terminal 518. Data output is performed from the imaging device 1 to the outside of the device via the output terminal 518. The output unit 510B can omit the output data conversion circuit unit 515 and the output amplitude changing unit 516.

When the imaging device 1 is connected to an external memory device, the output unit 510B may be provided with a memory interface circuit that outputs data to the external memory device. Examples of the external memory device include a flash drive, SRAM, and DRAM.

[Schematic Configuration of Imaging Device 1]

Figure 2:
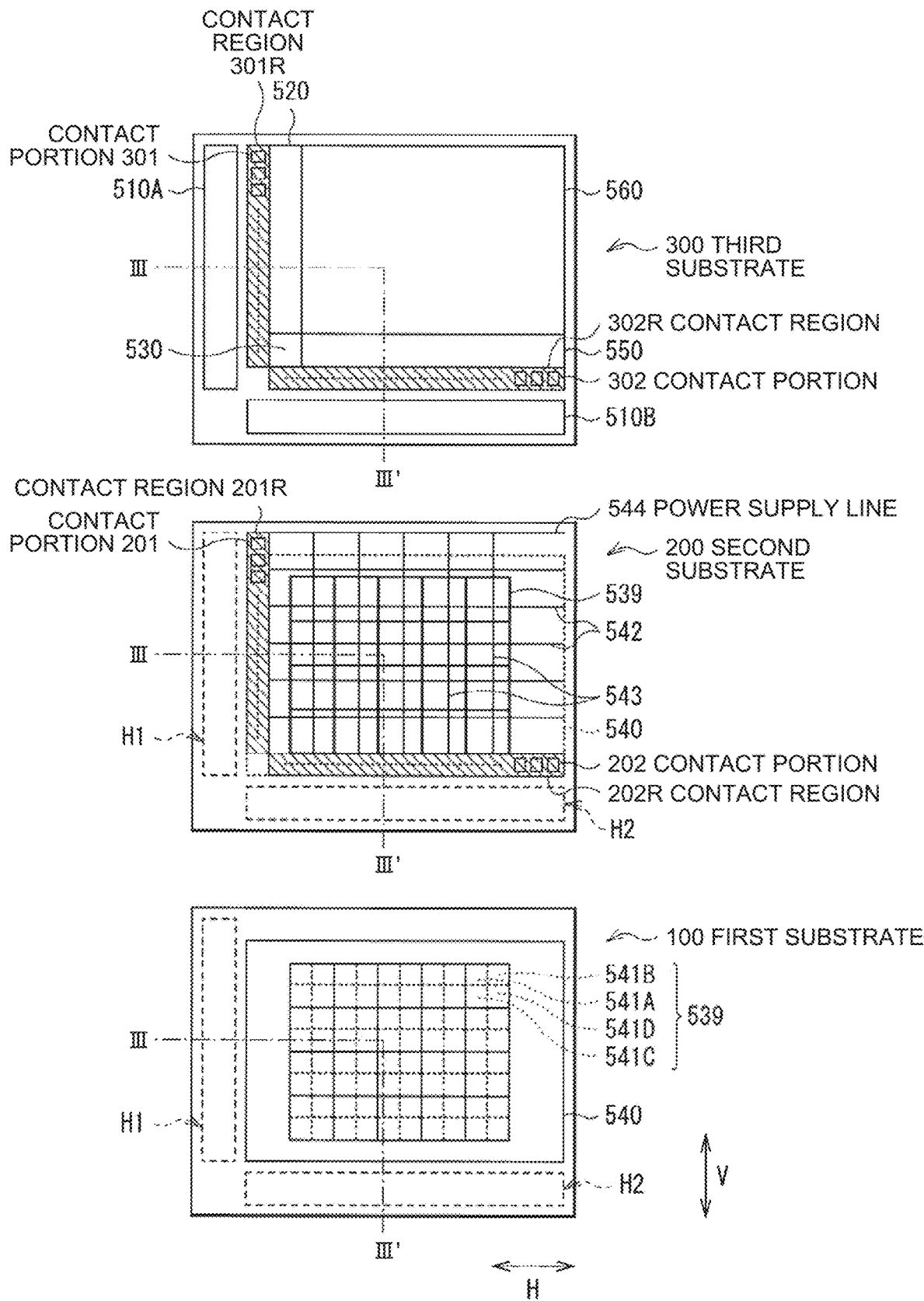
FIG. 2 is a schematic plan view illustrating a schematic configuration of the imaging device illustrated in FIG. 1.
Figure 3:
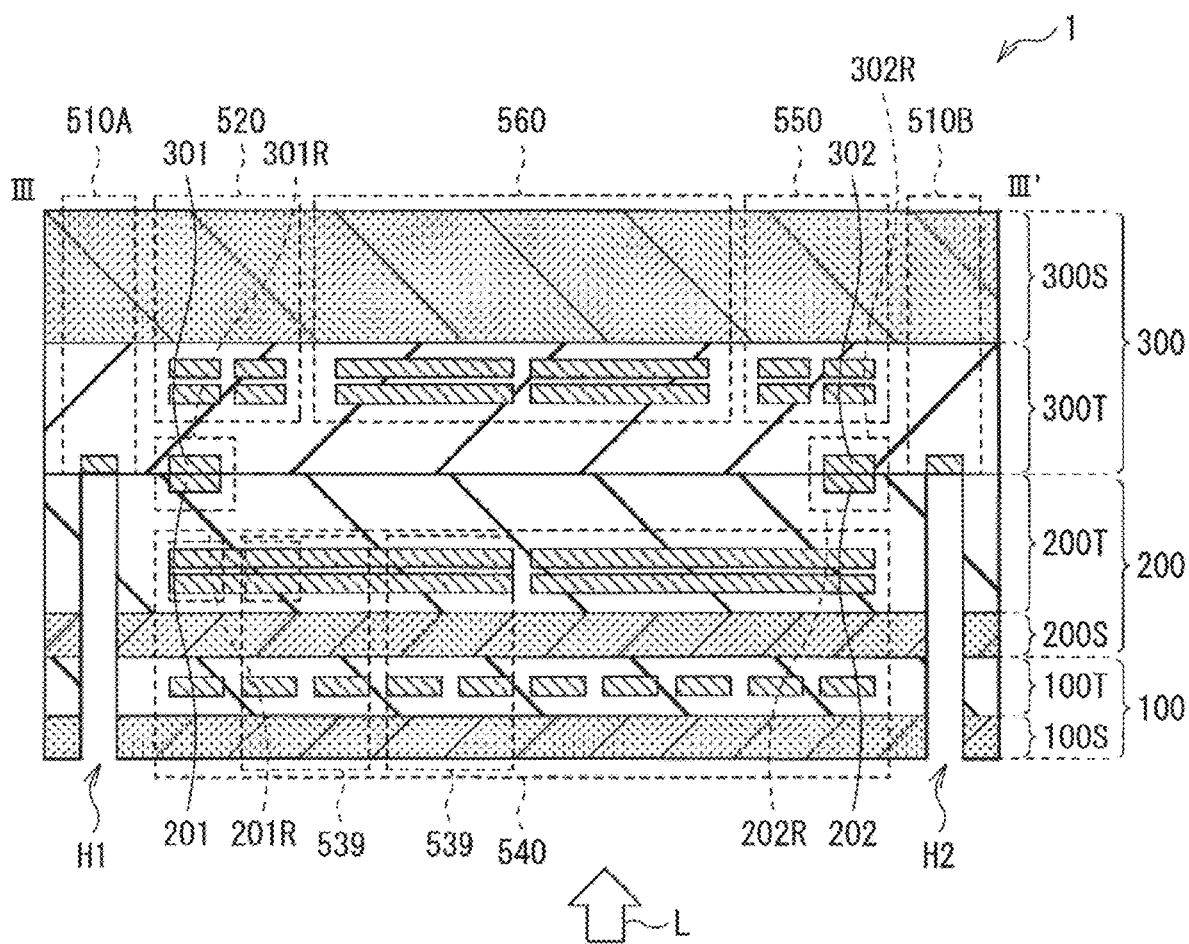
FIG. 3 is a schematic view illustrating a cross-sectional configuration taken along line III-III' illustrated in FIG. 2.

FIGS. 2 and 3 illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300. FIG. 3 schematically illustrates a cross-sectional configuration of the first substrate 100, the second substrate 200, and the third substrate 300 stacked on each other. FIG. 3 corresponds to the cross-sectional configuration taken along line illustrated in FIG. 2. The imaging device 1 is an imaging device having a three-dimensional structure formed by bonding three substrates (the first substrate 100, the second substrate 200, and the third substrate 300). The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Here, a combination of the wiring included in each substrate of the first substrate 100, the second substrate 200, and the third substrate 300 together with an interlayer insulating film around the wiring is referred to as wiring layers (100T, 200T, and 300T) provided on each of the substrates (the first substrate 100, the second substrate 200, and the third substrate 300) for convenience. The first substrate 100, the second substrate 200, and the third substrate 300 are stacked in this order, and specifically, the layers are stacked in order of the semiconductor layer 100S, the wiring layer 100T, the semiconductor layer 200S, the wiring layer 200T, the wiring layer 300T, and the semiconductor layer 300S in a stacking direction. Specific configurations of the first substrate 100, the second substrate 200, and the third substrate 300 will be described below. An arrow illustrated in FIG. 3 indicates an incident direction of light L on the imaging device 1. In the following cross-sectional views in the present specification, the light incident side in the imaging device 1 may be referred to as "lower", "lower side", or "below", and the side opposite to the light incident side may be referred to as "upper", "upper side", or "above" for convenience. In addition, in the present specification, for convenience, in a substrate including a semiconductor layer and a wiring layer, a side of the wiring layer may be referred to as a front surface, while a side of the semiconductor layer may be referred to as a back surface. The description of the specification is not limited to the above terms. The imaging device 1 is, for example, a back-illuminated imaging device in which light is incident from the back surface side of the first substrate 100 having a photodiode.

Both the pixel array unit 540 and the pixel sharing unit 539 included in the pixel array unit 540 are constituted by using both the first substrate 100 and the second substrate 200. The first substrate 100 is provided with the plurality of pixels 541A, 541B, 541C, and 541D included in the pixel sharing unit 539. Each of these pixels 541 includes a photodiode (photodiode PD described below) and a transfer transistor (transfer transistor TR described below). The second substrate 200 is provided with a pixel circuit (a pixel circuit 210 to be described below) included in the pixel sharing unit 539. The pixel circuit reads out the pixel signal transferred from the photodiode of each of the pixels 541A, 541B, 541C, and 541D via the transfer transistor, or resets the photodiode. In addition to such a pixel circuit, the second substrate 200 includes a plurality of row drive signal lines 542 extending in the row direction and a plurality of vertical signal lines 543 extending in the column direction. The second substrate 200 further includes a power supply line 544 extending in the row direction. The third substrate 300 includes an input unit 510A, a row drive unit 520, a timing control unit 530, a column signal processing unit 550, an image signal processing unit 560, and an output unit 510B, for example. A region in which the row drive unit 520 is provided partially overlaps the pixel array unit 540 in the stacking direction of the first substrate 100, the second substrate 200, and the third substrate 300 (hereinafter, simply referred to as the stacking direction), for example. More specifically, the row drive unit 520 is provided in a region overlapping the vicinity of an end of the pixel array unit 540 in the H direction in the stacking direction (FIG. 2). The column signal processing unit 550 is provided, for example, in a region partially overlapping the pixel array unit 540 in the stacking direction. More specifically, the column signal processing unit 550 is provided in a region overlapping the vicinity of the end of the pixel array unit 540 in the V direction, in the stacking direction (FIG. 2). Although not illustrated, the input unit 510A and the output unit 510B may be disposed in a portion other than the third substrate 300, for example, may be disposed on the second substrate 200. Alternatively, the input unit 510A and the output unit 510B may be provided on the back surface (light incident surface) side of the first substrate 100. Incidentally the pixel circuit provided on the second substrate 200 may also be referred to as a pixel transistor circuit, a pixel transistor group, a pixel transistor, a pixel readout circuit, or a readout circuit as alternative terms. In the present specification, the term "pixel circuit" is used.

The first substrate 100 and the second substrate 200 are electrically connected by a through-substrate electrode (through-substrate electrodes 120E and 121E of FIG. 6 to be described below), for example. The second substrate 200 and the third substrate 300 are electrically connected via contact portions 201, 202, 301, and 302, for example. The contact portions 201 and 202 are provided on the second substrate 200, while the contact portions 301 and 302 are provided on the third substrate 300. The contact portion 201 of the second substrate 200 is in contact with the contact portion 301 of the third substrate 300, while the contact portion 202 of the second substrate 200 is in contact with the contact portion 302 of the third substrate 300. The second substrate 200 has a contact region 201R including a plurality of the contact portions 201 and a contact region 202R including a plurality of the contact portions 202. The third substrate 300 has a contact region 301R including a plurality of the contact portions 301 and a contact region 302R including a plurality of the contact portions 302. The contact regions 201R and 301R are provided between the pixel array unit 540 and the row drive unit 520 in the stacking direction (FIG. 3). In other words, the contact regions 201R and 301R are provided, for example, in a region where the row drive unit 520 (on the third substrate 300) and the pixel array unit 540 (on the second substrate 200) overlap each other in the stacking direction or in a region in the vicinity thereof. The contact regions 201R and 301R are disposed at ends in the H direction in such regions, for example (FIG. 2). In the third substrate 300, for example, the contact region 301R is provided at a position overlapping a part of the row drive unit 520, specifically, the end of the row drive unit 520 in the H direction (FIGS. 2 and 3). The contact portions 201 and 301 connect, for example, the row drive unit 520 provided on the third substrate 300 and the row drive signal line 542 provided on the second substrate 200 to each other. For example, the contact portions 201 and 301 may connect the input unit 510A provided on the third substrate 300, the power supply line 544, and a reference potential line (a reference potential line VSS described below) to each other. The contact regions 202R and 302R are provided between the pixel array unit 540 and the column signal processing unit 550 in the stacking direction (FIG. 3). In other words, the contact regions 202R and 302R are provided, for example, in a region where the column signal processing unit 550 (third substrate 300) and the pixel array unit 540 (second substrate 200) overlap each other in the stacking direction or in a vicinity region thereof. The contact regions 202R and 302R are disposed at ends in the V direction in such regions, for example (FIG. 2). In the third substrate 300, for example, the contact region 301R is provided at a position overlapping a part of the column signal processing unit 550, specifically, the end portion of the column signal processing unit 550 in the V direction (FIGS. 2 and 3). The contact portions 202 and 302 are provided for connecting a pixel signal (a signal corresponding to the amount of charge generated as a result of photoelectric conversion in a photodiode) output from each of the plurality of pixel sharing units 539 included in the pixel array unit 540 to the column signal processing unit 550 provided on the third substrate 300. The pixel signal is supposed to be transmitted from the second substrate 200 to the third substrate 300.

FIG. 3 is an example of a cross-sectional view of the imaging device 1 as described above. The first substrate 100, the second substrate 200, and the third substrate 300 are electrically connected to each other via the wiring layers 100T, 200T, and 300T. For example, the imaging device 1 includes an electrical connection portion adapted to electrically connect the second substrate 200 and the third substrate 300 to each other. Specifically, the contact portions 201, 202, 301, and 302 are formed with electrodes formed of a conductive material. The conductive material is formed of, for example, a metal material such as copper (Cu), aluminum (Al), or gold (Au). By directly bonding wiring portions formed as electrodes, for example, the contact regions 201R, 202R, 301R, and 302R electrically connect the second substrate and the third substrate to each other, enabling signal input and/or output between the second substrate 200 and the third substrate 300.

An electrical connection portion that electrically connects the second substrate 200 and the third substrate 300 to each other can be provided at a desired location. For example, as illustrated as the contact regions 201R, 202R, 301R, and 302R in FIG. 3, the contact regions may be provided in a region overlapping the pixel array unit 540 in the stacking direction. Alternatively, the electrical connection portion may be provided in a region not overlapping the pixel array unit 540 in the stacking direction. Specifically, it may be provided in a region overlapping a peripheral portion arranged outside the pixel array unit 540 in the stacking direction.

The first substrate 100 and the second substrate 200 are provided with connection holes H1 and H2, for example. The connection holes H1 and H2 penetrate both the first substrate 100 and the second substrate 200 (FIG. 3). The connection holes H1 and H2 are provided outside the pixel array unit 540 (or a portion overlapping the pixel array unit 540) (FIG. 2). For example, the connection hole H1 is arranged outside the pixel array unit 540 in the H direction, while the connection hole H2 is arranged outside the pixel array unit 540 in the V direction. For example, the connection hole H1 reaches the input unit 510A provided in the third substrate 300, while the connection hole H2 reaches the output unit 510B provided in the third substrate 300. The connection holes H1 and H2 may be hollow or at least partially contain a conductive material. For example, there is a configuration in which a bonding wire is connected to an electrode formed as the input unit 510A and/or the output unit 510B. Alternatively, there is a configuration in which the electrode formed as the input unit 510A and/or the output unit 510B is connected to the conductive material provided in the connection holes H1 and H2. The conductive material provided in the connection holes H1 and H2 may be embedded in a part or all of the connection holes H1 and H2, or alternatively, the conductive material may be formed on side walls of the connection holes H1 and H2.

FIG. 3 is a case of a structure in which the input unit 510A and the output unit 510B are provided on the third substrate 300, the present disclosure is not limited thereto. For example, by sending a signal of the third substrate 300 to the second substrate 200 via the wiring layers 200T and 300T, the input unit 510A and/or the output unit 510B can be provided on the second substrate 200. Similarly, by sending a signal of the second substrate 200 to the first substrate 1000 via the wiring layers 100T and 200T, the input unit 510A and/or the output unit 510B can be provided on the first substrate 100.

Figure 4:
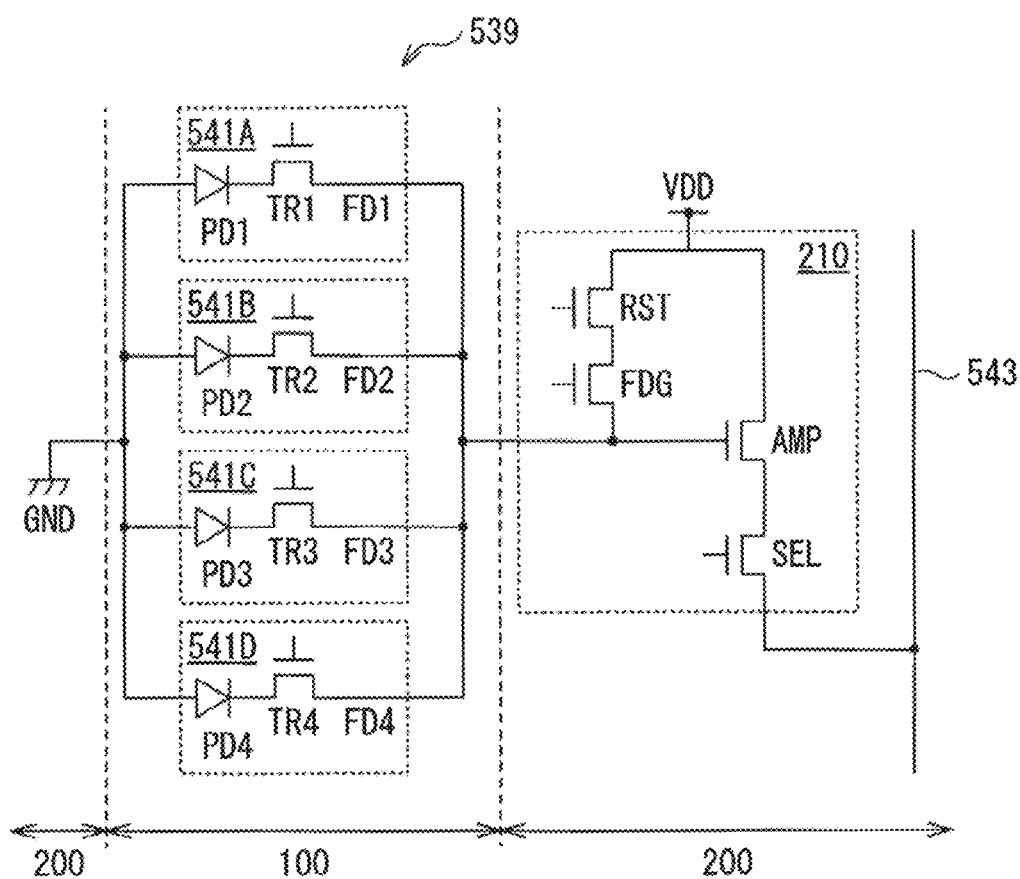
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes the plurality of pixels 541 (FIG. 4 illustrates four pixels 541, namely, the pixels 541A, 541B, 541C, and 541D), one pixel circuit 210 connected to the plurality of pixels 541, and a vertical signal line 5433 connected to the pixel circuit 210. The pixel circuit 210 includes four transistors, specifically, an amplification transistor AMP, a selection transistor SEL, a reset transistor RST, and an FD conversion gain switching transistor FD, for example. As described above, by operating one pixel circuit 210 in time division, the pixel sharing unit 539 is configured to sequentially output the pixel signals of the four pixels 541 (pixels 541A, 541B, 541C, and 541D) included in the pixel sharing unit 539 to the vertical signal line 543. The mode in which one pixel circuit 210 is connected to the plurality of pixels 541 and pixel signals of the plurality of pixels 541 are output by the one pixel circuit 210 in time division is referred to as a mode in which "the plurality of pixels 541 shares one pixel circuit 210".

The pixels 541A, 541B, 541C, and 541D have components common to each other. Hereinafter, in order to distinguish the components of the pixels 541A, 541B, 541C, and 541D from each other, an identification number 1 is assigned to the end of the sign of the component of the pixel 541A, an identification number 2 is assigned to the end of the sign of the component of the pixel 541B, an identification number 3 is assigned to the end of the sign of the component of the pixel 541C, and an identification number 4 is assigned to the end of the sign of the component of the pixel 541D. When there is no need to distinguish the components of the pixels 541A, 541B, 541C, and 541D from each other, the identification numbers at the ends of the signs of the components of the pixels 541A, 541B, 541C, and 541D are omitted.

The pixels 541A, 541B, 541C, and 541D each include, for example, a photodiode PD, a transfer transistor TR electrically connected to the photodiode PD, and a node of floating diffusion FD electrically connected to the transfer transistor TR. The photodiode PD (PD1, PD2, PD3, PD4) has a cathode electrically connected to the source of the transfer transistor TR and has an anode electrically connected to a reference potential line (for example, ground). The photodiode PD photoelectrically converts incident light and generates a charge corresponding to the amount of received light. The transfer transistor TR (transfer transistors TR1, TR2, TR3, or TR4) is, for example, an n-type complementary metal oxide semiconductor (CMOS) transistor. The transfer transistor TR has the drain electrically connected to the floating diffusion FD and has the gate electrically connected to a drive signal line. This drive signal line is a part of the plurality of row drive signal lines 542 (refer to FIG. 1) connected to one pixel sharing unit 539. The transfer transistor TR transfers the charge generated in the photodiode PD to the floating diffusion FD. The floating diffusion FD (including nodes of floating diffusion FD1, FD2, FD3, or FD4) is an n-type diffusion layer region formed in the p-type semiconductor layer. The floating diffusion FD is a charge holding means of temporarily holding the charge transferred from the photodiode PD, and is a charge-voltage conversion means of generating a voltage corresponding to the charge amount.

The four nodes of floating diffusion FD (including nodes of floating diffusion FD1, FD2, FD3, and FD4) included in one pixel sharing unit 539 are electrically connected to each other, and are electrically connected to the gate of the amplification transistor AMP and the source of the FD conversion gain switching transistor FDG. The drain of the FD conversion gain switching transistor FDG is connected to the source of the reset transistor RST, and the gate of the FD conversion gain switching transistor FDG is connected to a drive signal line. This drive signal line is a part of the plurality of row drive signal lines 542 connected to one pixel sharing unit 539. The drain of the reset transistor RST is connected to the power supply line VDD, and the gate of the reset transistor RST is connected to the drive signal line. This drive signal line is a part of the plurality of row drive signal lines 542 connected to one pixel sharing unit 539. The gate of the amplification transistor AMP is connected to the floating diffusion FD, the drain of the amplification transistor AMP is connected to the power supply line VDD, and the source of the amplification transistor AMP is connected to the drain of the selection transistor SEL. The source of the selection transistor SEL is connected to the vertical signal line 543, while the gate of the selection transistor SEL is connected to the drive signal line. This drive signal line is a part of the plurality of row drive signal lines 542 connected to one pixel sharing unit 539.

Figure 6:
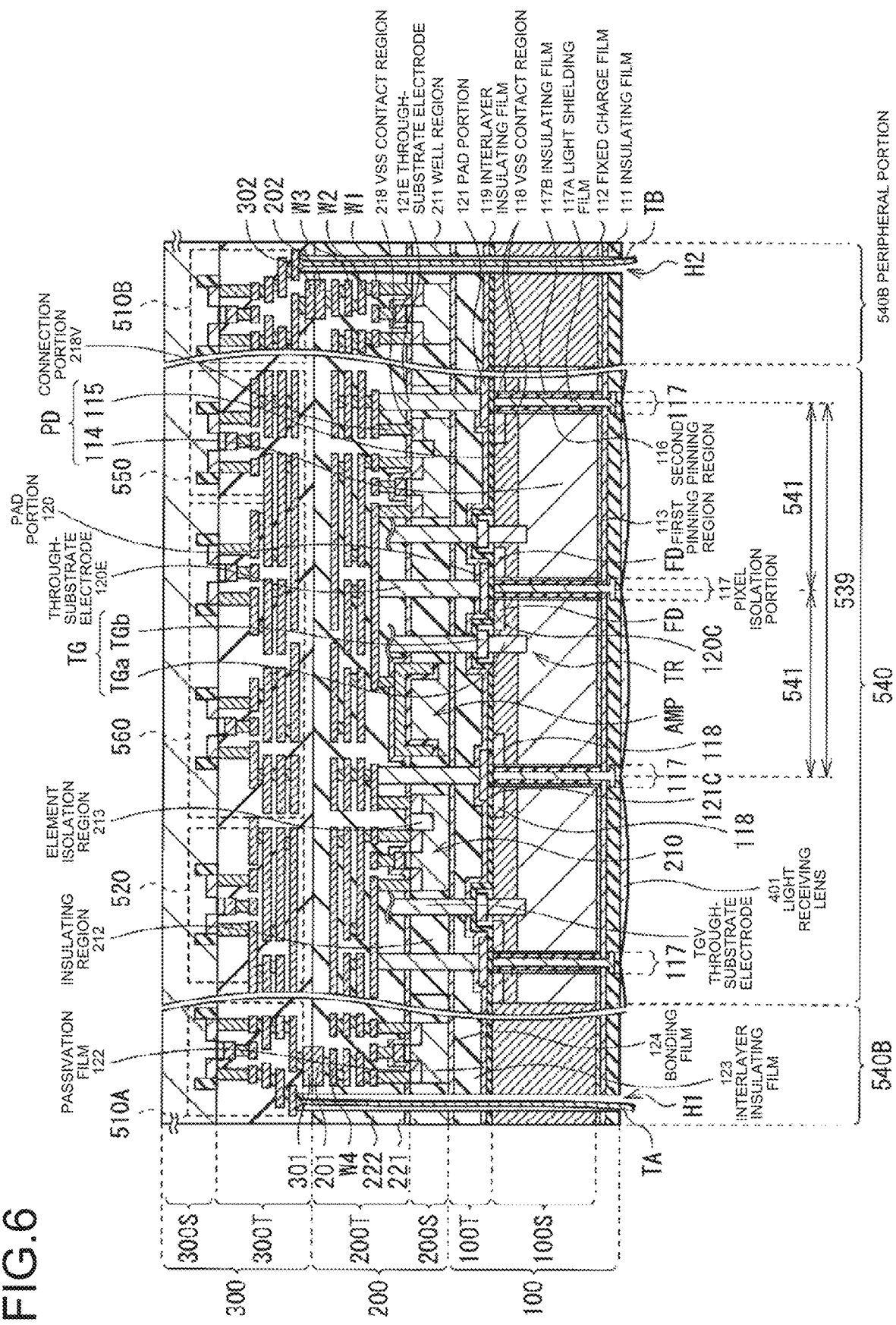
FIG. 6 is a schematic cross-sectional view illustrating an example of a specific configuration of the imaging device illustrated in FIG. 3.

When the transfer transistor TR is turned on, the transfer transistor TR transfers the charge of the photodiode PD to the floating diffusion FD. A gate (transfer gate TG) of the transfer transistor TR includes an electrode referred to as a vertical electrode, and is provided to extend from a front surface of a semiconductor layer (a semiconductor layer 100S in FIG. 6 to be described below) to a depth reaching the PD as illustrated in FIG. 6 to be described below. The reset transistor RST resets the potential of the floating diffusion FD to a predetermined potential. When the reset transistor RST is turned on, the potential of the floating diffusion FD is reset to the potential of the power supply line VDD. The selection transistor SEL controls an output timing of the pixel signal from the pixel circuit 210. The amplification transistor AMP generates a signal at a voltage corresponding to the level of the charge held in the floating diffusion FD as a pixel signal. The amplification transistor AMP is connected to the vertical signal line 543 via the selection transistor SEL. The amplification transistor AMP constitutes a source follower together with a load circuit unit (refer to FIG. 1) connected to the vertical signal line 543 in the column signal processing unit 550. When the selection transistor SEL is turned on, the amplification transistor AMP outputs the voltage of the floating diffusion FD to the column signal processing unit 550 via the vertical signal line 543. The reset transistor RST, the amplification transistor AMP, and the selection transistor SEL are N-type CMOS transistors, for example.

The FD conversion gain switching transistor FDG is used to change the gain of charge-voltage conversion in the floating diffusion FD. In general, a pixel signal is weak at the time of shooting in a dark place. Based on Q=CV, when capacitance (FD capacitance C) of the floating diffusion FD is large at the time of performing charge-voltage conversion, this will lead to a small V at the time of conversion into a voltage by the amplification transistor AMP. In contrast, pixel signal has a great strength in a bright place, it would be difficult to hold the charge of the photodiode PD at the floating diffusion FD unless the FD capacitance C is large enough. Furthermore, the FD capacitance C needs to be large enough so that V when converted into a voltage by the amplification transistor AMP would not become too high (in other words, so as to be low). In view of these, when the FD conversion gain switching transistor FDG is turned on, the gate capacitance of the FD conversion gain switching transistor FDG increases, leading to an increase of the entire FD capacitance C. On the other hand, when the FD conversion gain switching transistor FDG is turned off, the entire FD capacitance C decreases. In this manner, switching on/off of the FD conversion gain switching transistor FDG can achieve variable FD capacitance C, making it possible to switch the conversion efficiency levels. The FD conversion gain switching transistor FDG is an N-type CMOS transistor, for example.

Incidentally, there may be a configuration without the FD conversion gain switching transistor FDG. At this time, for example, the pixel circuit 210 includes three transistors, for example, an amplification transistor AMP, a selection transistor SEL, and a reset transistor RST. The pixel circuit 210 includes, for example, at least one of pixel transistors such as an amplification transistor AMP, a selection transistor SEL, a reset transistor RST, and an FD conversion gain switching transistor FDG.

The selection transistor SEL may be provided between the power supply line VDD and the amplification transistor AMP. In this case, the drain of the reset transistor RST is electrically connected to the power supply line VDD and the drain of the selection transistor SEL. The source of the selection transistor SEL is electrically connected to the drain of the amplification transistor AMP, while the gate of the selection transistor SEL is electrically connected to the row drive signal line 542 (refer to FIG. 1). The source of the amplification transistor AMP (an output end of the pixel circuit 210) is electrically connected to the vertical signal line 543, while the gate of the amplification transistor AMP is electrically connected to the source of the reset transistor RST. Although not illustrated, the number of pixels 541 sharing one pixel circuit 210 may be other than four. For example, two or eight pixels 541 may share one pixel circuit 210.

Figure 5:
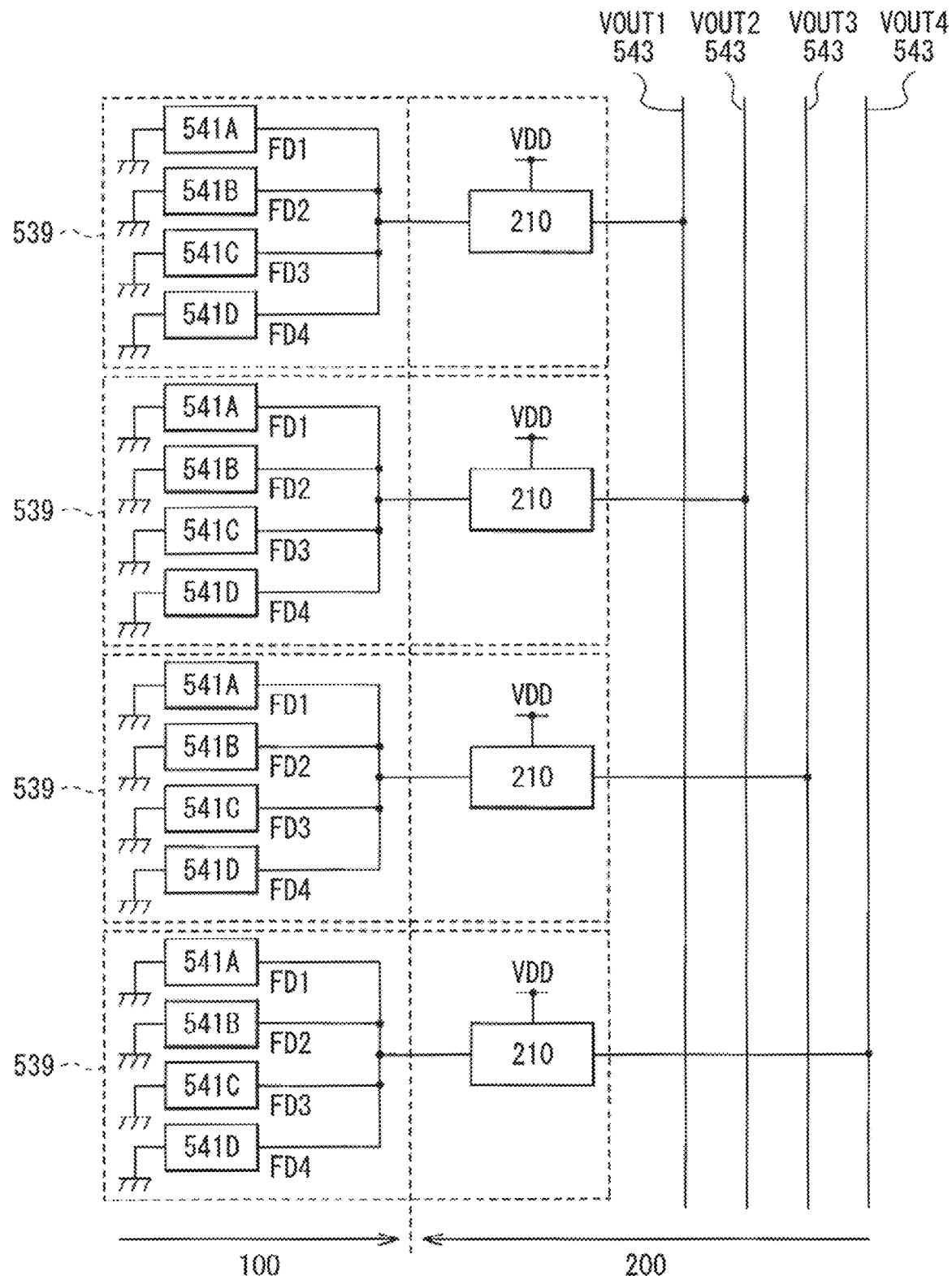
FIG. 5 is a diagram illustrating an example of a connection mode between a plurality of pixel sharing units and a plurality of vertical signal lines.

FIG. 5 illustrates an example of a connection mode between the plurality of pixel sharing units 539 and the vertical signal line 543. For example, the four pixel sharing units 539 arranged in the column direction are divided into four groups, and the vertical signal line 543 is connected to each of the four groups. For simplification, FIG. 5 illustrates an example in which each of the four groups has one pixel sharing unit 539, but the four groups may each include a plurality of pixel sharing units 539. In this manner, in the imaging device 1, the plurality of pixel sharing units 539 arranged in the column direction may be divided into groups including one or a plurality of pixel sharing units 539. For example, the vertical signal line 543 and the column signal processing unit 550 are connected to each of the groups, and pixel signals can be simultaneously read out from each of the groups. Alternatively, in the imaging device 1, one vertical signal line 543 may be connected to the plurality of pixel sharing units 539 arranged in the column direction. At this time, pixel signals are sequentially read out from the plurality of pixel sharing units 539 connected to the one vertical signal line 543 in time division.

[Specific Configuration of Imaging Device 1]

FIG. 6 illustrates an example of a cross-sectional configuration in a direction perpendicular to main surfaces of the first substrate 100, the second substrate 200, and the third substrate 300 of the imaging device 1. FIG. 6 schematically illustrates the positional relationship of the components to facilitate understanding, and may be different from the actual cross section. In the imaging device 1, the first substrate 100, the second substrate 200, and the third substrate 300 are stacked in this order. The imaging device 1 further includes a light receiving lens 401 on the back surface side (light incident surface side) of the first substrate 100. A color filter layer (not illustrated) may be provided between the light receiving lens 401 and the first substrate 100. The light receiving lens 401 is provided in each of the pixels 541A, 541B, 541C, and 541D, for example. The imaging device 1 is, for example, a back-illuminated imaging device. The imaging device 1 includes a pixel array unit 540 arranged in a central portion and a peripheral portion 540B arranged at an outer side of the pixel array unit 540.

The first substrate 100 includes an insulating film 111, a fixed charge film 112, a semiconductor layer 100S, and a wiring layer 100T in this order from the light receiving lens 401 side. The semiconductor layer 100S is formed of a silicon substrate, for example. The semiconductor layer 100S includes, for example, a p-well layer 115 in a part of the front surface (surface on the wiring layer 100T side) and in the vicinity thereof, and an n-type semiconductor region 114 in the other region (region deeper than the p-well layer 115). For example, the n-type semiconductor region 114 and the p-well layer 115 constitute a pn junction type photodiode PD. The p-well layer 115 is a p-type semiconductor region.

Figure 7A:
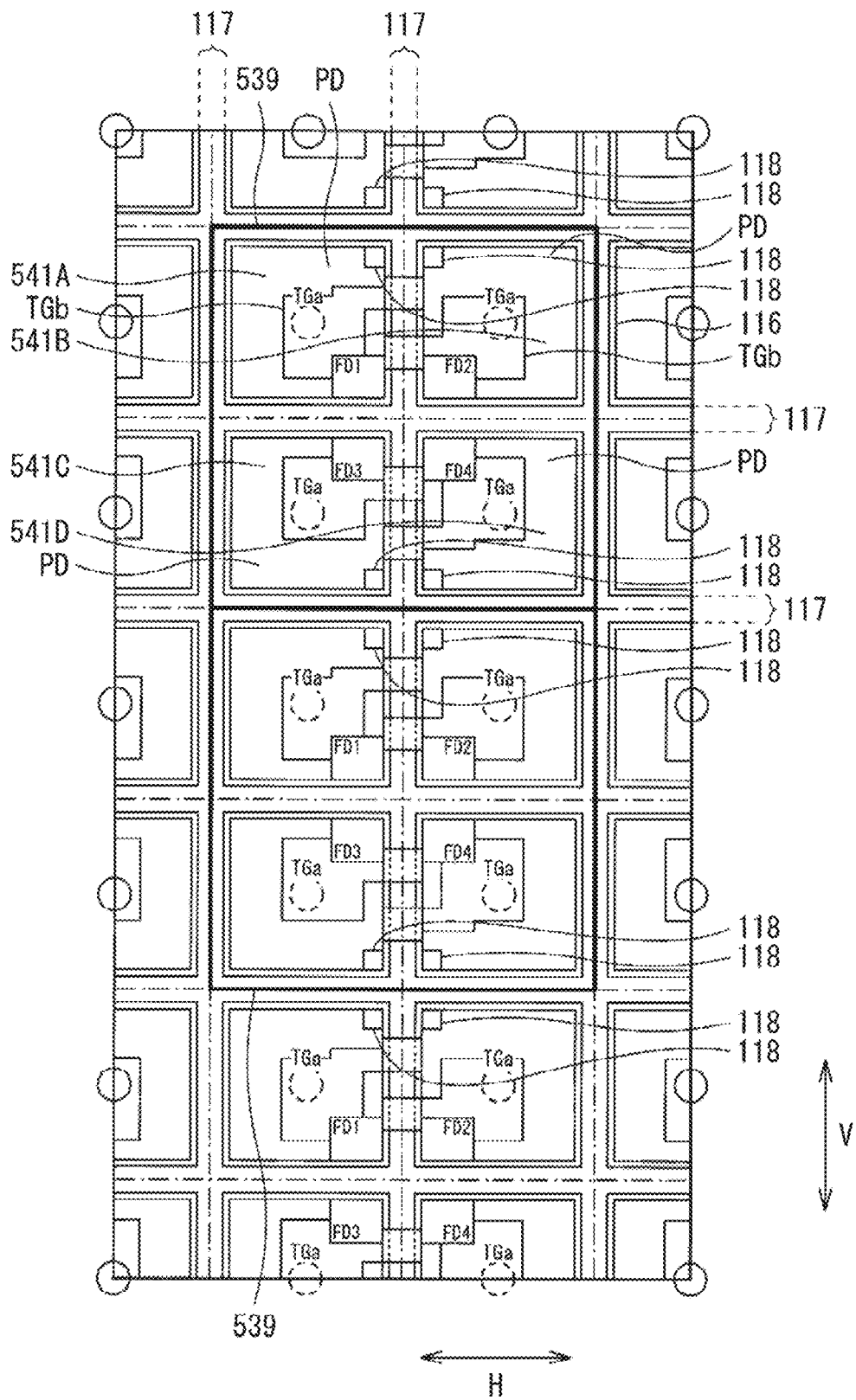
FIG. 7A is a schematic view illustrating an example of a planar configuration of a main part of a first substrate illustrated in FIG. 6.

FIG. 7A illustrates an example of a planar configuration of first substrate 100. FIG. 7A mainly illustrates a planar configuration of a pixel isolation portion 117, a photodiode PD, floating diffusion FD, a VSS contact region 118, and a transfer transistor TR of the first substrate 100. The configuration of first substrate 100 will be described with reference to FIG. 7A together with FIG. 6.

The floating diffusion FD and the VSS contact region 118 are provided in the vicinity of the front surface of the semiconductor layer 100S. The floating diffusion FD includes an n-type semiconductor region provided in the p-well layer 115. The nodes of floating diffusion FD (floating diffusion FD1, FD2, FD3, and FD4) of each of the pixels 541A, 541B, 541C, and 541D are provided close to each other in the central portion of the pixel sharing unit 539, for example (FIG. 7A). Although details will be described below, the four nodes of floating diffusion (floating diffusion FD1, FD2, FD3, and FD4) included in the pixel sharing unit 539 are electrically connected to each other via an electrical connection means (a pad portion 120 described below) in the first substrate 100 (more specifically, in the wiring layer 100T). Furthermore, the floating diffusion FD is connected from the first substrate 100 to the second substrate 200 (more specifically, from the wiring layer 100T to the wiring layer 200T) via an electrical means (a through-substrate electrode 120E described below). In the second substrate 200 (more specifically, inside the wiring layer 200T), the floating diffusion FD is electrically connected, via this electrical means, to the gate of the amplification transistor AMP and the source of the FD conversion gain switching transistor FDG.

The VSS contact region 118 is a region electrically connected to the reference potential line VSS, and is separated away from the floating diffusion FD. For example, in the pixels 541A, 541B, 541C, and 541D, the floating diffusion FD is arranged at one end and the VSS contact region 118 is arranged at the other end of each of pixels in the V direction (FIG. 7A). The VSS contact region 118 includes a p-type semiconductor region, for example. The VSS contact region 118 is connected to a ground potential or a fixed potential, for example. This configuration allows the reference potential to be supplied to the semiconductor layer 100S.

On the first substrate 100, the transfer transistor TR is provided together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on the front surface side (second substrate 200 side being the side opposite to the light incident surface side) of the semiconductor layer 100S. The transfer transistor TR has a transfer gate TG. The transfer gate TG includes, for example, a horizontal portion TGb facing the front surface of the semiconductor layer 100S and a vertical portion TGa provided in the semiconductor layer 100S. The vertical portion TGa extends in a thickness direction of the semiconductor layer 100S. The vertical portion TGa has one end being in contact with the horizontal portion TGb and the other end being provided in the n-type semiconductor region 114. With a configuration of the transfer transistor TR using such a vertical transistor, it is possible to suppress occurrence of transfer failure of the pixel signal and improve readout efficiency of the pixel signal.

The horizontal portion TGb of the transfer gate TG extends from a position facing the vertical portion TGa toward the central portion of the pixel sharing unit 539 in the H direction, for example (FIG. 7A). With this configuration, the position, in the H direction, of the through-substrate electrode (through-substrate electrode TGV to be described below) reaching the transfer gate TG can be brought close to the position, in the H direction, of the through-substrate electrode (through-substrate electrodes 120E and 121E to be described below) connected to the floating diffusion FD and the VSS contact region 118. For example, the plurality of pixel sharing units 539 provided on the first substrate 100 has the same configuration (FIG. 7A).

Figure 7B:
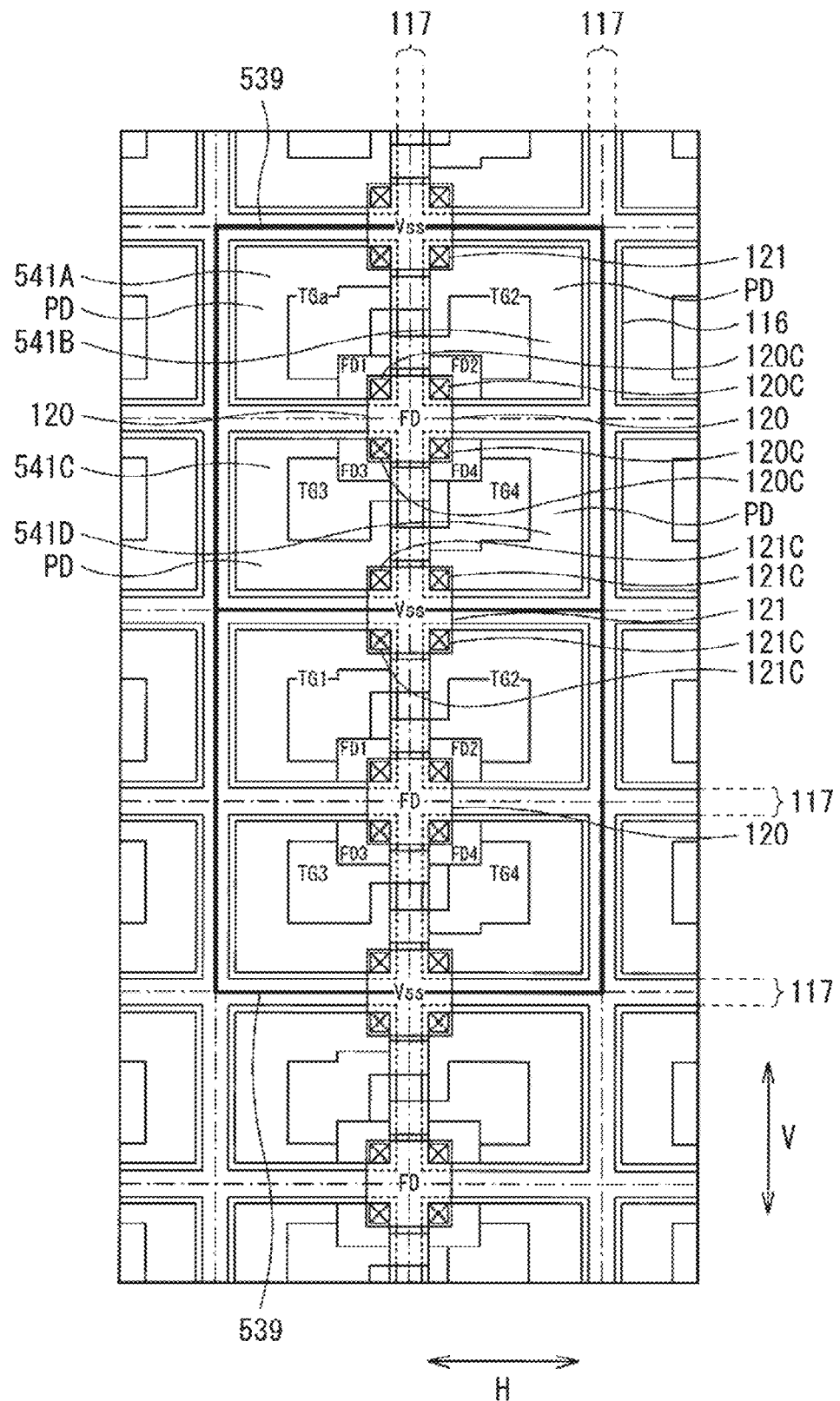
FIG. 7B is a schematic view illustrating a planar configuration of a pad portion together with the main part of the first substrate illustrated in FIG. 7A.

The semiconductor layer 100S has the pixel isolation portion 117 that isolates the pixels 541A, 541B, 541C, and 541D from each other. The pixel isolation portion 117 is formed to extend in the normal direction of the semiconductor layer 100S (direction perpendicular to the front surface of the semiconductor layer 100S). The pixel isolation portion 117 is provided so as to partition the pixels 541A, 541B, 541C, and 541D from each other, and has a grid-like planar shape, for example (FIGS. 7A and 7B). For example, the pixel isolation portion 117 electrically and optically isolates the pixels 541A, 541B, 541C, and 541D from each other. The pixel isolation portion 117 includes a light shielding film 117A and an insulating film 117B, for example. The light shielding film 117A is formed by using, for example, tungsten (W) or the like. The insulating film 117B is provided between the light shielding film 117A and the p-well layer 115 or the n-type semiconductor region 114. The insulating film 117B is formed of silicon oxide (SiO), for example. The pixel isolation portion 117 has a full trench isolation (FTI) structure, for example, and penetrates the semiconductor layer 100S. Although not illustrated, the pixel isolation portion 117 is not limited to the FTI structure penetrating the semiconductor layer 100S. For example, it is allowable to use a deep trench isolation (DTI) structure not penetrating the semiconductor layer 100S. The pixel isolation portion 117 extends in the normal direction of the semiconductor layer 100S and is formed in a partial region of the semiconductor layer 100S.

The semiconductor layer 100S includes a first pinning region 113 and a second pinning region 116, for example. The first pinning region 113 is provided in the vicinity of the back surface of the semiconductor layer 100S so as to be arranged between the n-type semiconductor region 114 and the fixed charge film 112. The second pinning region 116 is provided on a side surface of the pixel isolation portion 117, specifically, between the pixel isolation portion 117 and the p-well layer 115 or the n-type semiconductor region 114. The first pinning region 113 and the second pinning region 116 are formed with a p-type semiconductor region, for example.

There is provided a fixed charge film 112 having a negative fixed charge between the semiconductor layer 100S and the insulating film 111. By the electric field induced by the fixed charge film 112, the first pinning region 113 of a hole accumulation layer is formed at an interface on the light-receiving surface (back surface) side of the semiconductor layer 100S. This configuration suppresses the generation of dark current due to the interface state on the light receiving surface side of the semiconductor layer 100S. The fixed charge film 112 is formed of an insulating film having a negative fixed charge, for example. Examples of the material of the insulating film having a negative fixed charge include hafnium oxide, zircon oxide, aluminum oxide, titanium oxide, and tantalum oxide.

The light shielding film 117A is provided between the fixed charge film 112 and the insulating film 111. The light shielding film 117A may be provided continuously with the light shielding film 117A constituting the pixel isolation portion 117. The light shielding film 117A between the fixed charge film 112 and the insulating film 111 is selectively provided at a position facing the pixel isolation portion 117 in the semiconductor layer 100S, for example. The insulating film 111 is provided so as to cover the light shielding film 117A. The insulating film 111 is formed of silicon oxide, for example.

The wiring layer 100T, provided between the semiconductor layer 100S and the second substrate 200, includes an interlayer insulating film 119, a pad portion 120 and 121, a passivation film 122, an interlayer insulating film 123, and a bonding film 124 in this order from the semiconductor layer 100S side. The horizontal portion TGb of the transfer gate TG is provided in the wiring layer 100T, for example. The interlayer insulating film 119 is provided over the entire front surface of the semiconductor layer 100S and is in contact with the semiconductor layer 100S. The interlayer insulating film 119 is formed of a silicon oxide film, for example. Note that the configuration of the wiring layer 100T is not limited to the above, and any configuration including wiring and an insulating film is allowable.

FIG. 7B illustrates the configuration of the pad portion 120 and 121 together with the planar configuration illustrated in FIG. 7A. The pad portions 120 and 121 are provided in a selective region on the interlayer insulating film 119. The pad portion 120 is provided for connecting the nodes of the floating diffusion FD (floating diffusion FD1, FD2, FD3, and FD4) of the pixels 541A, 541B, 541C, and 541D to each other. For example, the pad portion 120 is arranged at the central portion of the pixel sharing unit 539 in plan view for each of the pixel sharing units 539 (FIG. 7B). The pad portion 120 is provided across the pixel isolation portion 117, and is arranged so as to overlap at least a part of each of nodes of the floating diffusion FD1, FD2, FD3, and FD4 (FIGS. 6 and 7B). Specifically, the pad portion 120 is formed in a region overlapping at least a part of each of the plurality of nodes of floating diffusion FD (floating diffusion FD1, FD2, FD3, and FD4) sharing the pixel circuit 210 and at least a part of the pixel isolation portion 117 formed between the plurality of photodiodes PD (photodiodes PD1, PD2, PD3, and PD4) sharing the pixel circuit 210, in a direction perpendicular to the front surface of the semiconductor layer 100S. The interlayer insulating film 119 is provided with a connection via 120C for electrically connecting the pad portion 120 and nodes of the floating diffusion FD1, FD2, FD3, and FD4. The connection via 120C is provided in each of the pixels 541A, 541B, 541C, and 541D. For example, by embedding a part of the pad portion 120 in the connection via 120C, the pad portion 120 is electrically connected to each of nodes of the floating diffusion FD1, FD2, FD3, and FD4.

The pad portion 121 is provided for connecting the plurality of VSS contact regions 118 to each other. For example, the VSS contact region 118 provided in the pixels 541C and 541D of one pixel sharing unit 539 adjacent in the V direction is electrically connected with the VSS contact region 118 provided in the pixels 541A and 541B of the other pixel sharing unit 539 by the pad portion 121. The pad portion 121 is provided across the pixel isolation portion 117, for example, and is arranged to overlap at least a part of each of the four VSS contact regions 118. Specifically, the pad portion 121 is formed in a region overlapping at least a part of each of the plurality of VSS contact regions 118 and at least a part of the pixel isolation portion 117 formed between the plurality of VSS contact regions 118 in a direction perpendicular to the front surface of the semiconductor layer 100S. The interlayer insulating film 119 is provided with a connection via 121C for electrically connecting the pad portion 121 and the VSS contact region 118 to each other. The connection via 121C is provided in each of the pixels 541A, 541B, 541C, and 541D. For example, by embedding a part of the pad portion 121 in the connection via 121C, the pad portion 121 and the VSS contact region 118 are electrically connected to each other. For example, the pad portion 120 and the pad portion 121 of each of the plurality of pixel sharing units 539 arranged in the V direction are arranged at substantially the same position in the H direction (FIG. 7B).

By providing the pad portion 120, it is possible to reduce the number of wiring lines for connecting from each floating diffusion FD to the pixel circuit 210 (for example, a gate electrode of the amplification transistor AMP) in the entire chip. Similarly, by providing the pad portion 121, it is possible to decrease the wiring lines supplying a potential to each VSS contact region 118 in the entire chip. This makes it possible to reduce the area of the entire chip, suppress the electrical interference between the wiring lines in the miniaturized pixel, and/or reduce the cost by decreased number of components.

The pad portions 120 and 121 can be provided at desired positions on the first substrate 100 and the second substrate 200. Specifically, the pad portions 120 and 121 can be provided in either the wiring layer 100T or an insulating region 212 of the semiconductor layer 200S. When provided in the wiring layer 100T, the pad portions 120 and 121 may be brought into direct contact with the semiconductor layer 100S. Specifically, the pad portions 120 and 121 may be directly connected to at least a part of each of the floating diffusion FD and/or the VSS contact region 118. Alternatively, it is allowable to use a configuration in which the connection vias 120C and 121C are provided from the floating diffusion FD and/or the VSS contact region 118 connected to the pad portions 120 and 121, respectively, and the pad portions 120 and 121 may be provided at desired positions of the insulating region 2112 of the wiring layer 100T and the semiconductor layer 200S.

In particular, in a case where the pad portions 120 and 121 are provided in the wiring layer 100T, it is possible to reduce the number of wiring lines connected to the floating diffusion FD and/or the VSS contact region 118 in the insulating region 212 of the semiconductor layer 200S. With this configuration, in the second substrate 200 forming the pixel circuit 210, it is possible to reduce the area of the insulating region 212 for forming the through-substrate wiring for connecting the floating diffusion FD to the pixel circuit 210. This makes it possible to ensure a large area of the second substrate 200 forming the pixel circuit 210. By ensuring the area of the pixel circuit 210, it is possible to form a large pixel transistor and contribute to image quality improvement by noise reduction and the like.

In particular, in a case where the FTI structure is used for the pixel isolation portion 117, it is preferable to provide the floating diffusion FD and/or the VSS contact region 118 in each of the pixels 541. Therefore, by using the configurations of the pad portions 120 and 121, it is possible to greatly decrease the wiring lines connecting the first substrate 100 and the second substrate 200 to each other.

Furthermore, as illustrated in FIG. 7B, for example, the pad portion 120 connected to the plurality of floating diffusions FD and the pad portion 121 connected to the plurality of VSS contact regions 118 are alternately arranged linearly in the V direction. Furthermore, the pad portions 120 and 121 are formed at positions surrounded by the plurality of photodiodes PD, the plurality of transfer gates TG, and the plurality of nodes of floating diffusion FD. This configuration enables flexible arrangement of elements other than the floating diffusion FD and the VSS contact region 118 on the first substrate 100 forming a plurality of elements, leading to higher efficiency of the layout of the entire chip. Furthermore, it is possible to achieve symmetry in the layout of the elements formed in each pixel sharing unit 539 and to suppress variations in characteristics of each pixel 541.

The pad portions 120 and 121 are each formed of polysilicon (Poly Si), for example, and more specifically, doped polysilicon doped with impurities. The pad portions 120 and 121 are preferably formed of a conductive material having high heat resistance, such as polysilicon, tungsten (W), titanium (Ti), or titanium nitride (TiN). With this configuration, the pixel circuit 210 can be formed after the semiconductor layer 200S of the second substrate 200 is bonded to the first substrate 100. Hereinafter, the reason for this will be described. Note that, in the following description, the method of forming the pixel circuit 210 after bonding the first substrate 100 and the semiconductor layer 200S of the second substrate 200 is referred to as a first manufacturing method.

Here, there is another conceivable method of forming the pixel circuit 210 on the second substrate 200 and thereafter bonding the second substrate 200 to the first substrate 100 (hereinafter referred to as a second manufacturing method). In the second manufacturing method, an electrode for electrical connection is formed in advance on the front surface of the first substrate 100 (front surface of the wiring layer 100T) and the front surface of the second substrate 200 (front surface of the wiring layer 200T) individually. At the same time as bonding the first substrate 100 and the second substrate 200 to each other, the electrical connection electrodes formed on the front surface of the first substrate 100 and the front surface of the second substrate 200 come into contact with each other. This forms an electrical connection between the wiring included in the first substrate 100 and the wiring included in the second substrate 200. Therefore, by adopting the configuration of the imaging device 1 using the second manufacturing method, for example, manufacturing can be performed using an appropriate process for the configuration of each of the first substrate 100 and the second substrate 200, leading to achievement of manufacture of a high-quality and high-performance imaging device.

When the first substrate 100 and the second substrate 200 are bonded to each other with such a second manufacturing method, an alignment error might occur due to a manufacturing device for bonding. In addition, when the first substrate 100 and the second substrate 200 are bonded to each other, with the first substrate 100 and the second substrate 200 each having the size about several tens of centimeters in diameter, for example, there is a possibility that expansion and contraction of the substrates occur in microscopic regions of the first substrate 100 and the second substrate 200. This expansion and contraction of the substrates is caused by a slight shift in the timing of contact between the substrates. Due to such expansion and contraction of the first substrate 100 and the second substrate 200, an error might occur in the positions of the electrical connection electrodes formed on the front surface of the first substrate 100 and the front surface of the second substrate 200. In the second manufacturing method, it is preferable to take measures so that the electrodes of the first substrate 100 and the second substrate 200 come into contact with each other even with occurrence of such an error. Specifically, at least one, preferably both, of the electrodes of the first substrate 100 and the second substrate 200 can be formed to have a large size in consideration of the above error. Therefore, with the use of the second manufacturing method, for example, the size of the electrode formed on the front surface of the first substrate 100 or the second substrate 200 (the size in the substrate planar direction) is larger than the size of an internal electrode extending from the inside of the first substrate 100 or the second substrate 200 to the front surface in the thickness direction.

On the other hand, by forming the pad portions 120 and 121 using a heat-resistant conductive material, the first manufacturing method can be applied. In the first manufacturing method, the first substrate 100 including the photodiode PD, the transfer transistor TR, and the like is formed, and thereafter the first substrate 100 and the second substrate 200 (semiconductor layer 2000S) are bonded to each other. At this time, the second substrate 200 is in a state in which patterns such as active elements and wiring layers constituting the pixel circuit 210 are not formed yet. Since the second substrate 200 is in a state before pattern formation, even if an error occurs in the bonding position when the first substrate 100 and the second substrate 200 are bonded together, this bonding error would not cause an error in alignment between the pattern of the first substrate 100 and the pattern of the second substrate 200. This is because the pattern of the second substrate 200 is to be formed after bonding of the first substrate 100 and the second substrate 200 to each other. At pattern formation on the second substrate, the pattern is to be formed, for example, on an exposure device for pattern formation, by using pattern formed on the first substrate as an alignment target. For the above reason, the error in the bonding position between the first substrate 100 and the second substrate 200 does not cause a problem in manufacturing the imaging device 1 using the first manufacturing method. For similar reasons, an error caused by expansion and contraction of the substrate caused by the second manufacturing method would not cause a problem in manufacturing the imaging device 1 by the first manufacturing method.

In the first manufacturing method, after the first substrate 100 and the second substrate 200 (semiconductor layer 200S) are bonded together in this manner, active elements are formed on the second substrate 200. Thereafter, the through-substrate electrodes 120E and 121E and the through-substrate electrode TGV (FIG. 6) are formed. In the formation of the through-substrate electrodes 120E, 121E, and TGV, for example, patterns of the through-substrate electrodes are formed from above the second substrate 200 by reduction projection exposure using an exposure device. Since the reduction exposure projection is used, even if an error occurs in the alignment between the second substrate 200 and the exposure device, the magnitude of the error would be as small as a fraction of the error of the second manufacturing method (inverse of the reduction exposure projection magnification) in the second substrate 200. Therefore, by adopting the configuration of the imaging device 1 using the first manufacturing method, it is possible to facilitate alignment of elements formed on the first substrate 100 and the second substrate 200 with each other, leading to achievement of manufacturing a high-quality and high-performance imaging device.

The imaging device 1 manufactured using such a first manufacturing method has features different from the case of the imaging device manufactured by the second manufacturing method. Specifically, in the imaging device 1 manufactured by the first manufacturing method, the through-substrate electrodes 120E, 121E, and TGV have substantially constant thicknesses (sizes in the substrate planar direction) from the second substrate 200 to the first substrate 100, for example. Alternatively, when the through-substrate electrodes 120E, 121E, and TGV have tapered shapes, they have tapered shapes with a constant inclination. The imaging device 1 including such through-substrate electrodes 120E, 121E, and TGV has high applicability in miniaturization of the pixel 541.

Here, when the imaging device 1 is manufactured by the first manufacturing method, since the active element is formed on the second substrate 200 after the first substrate 100 and the second substrate 200 (semiconductor layer 200S) are bonded together, the first substrate 100 would be also affected by the heating treatment necessary for forming the active element. Therefore, as described above, it is preferable to use a conductive material having high heat resistance for the pad portions 120 and 121 provided on the first substrate 100. For example, the pad portions 120 and 121 is preferably formed of a material having a higher melting point (that is, higher heat resistance) than at least a part of the wiring member included in the wiring layer 200T of the second substrate 200. For example, the pad portions 120 and 121 are formed of a conductive material having high heat resistance, such as doped polysilicon, tungsten, titanium, and titanium nitride. With this configuration, the imaging device 1 can be manufactured using the first manufacturing method described above.

The passivation film 122 is provided over the entire front surface of the semiconductor layer 100S so as to cover the pad portions 120 and 121, for example (FIG. 6). The passivation film 122 is formed of a silicon nitride (SiN) film, for example. The interlayer insulating film 123 covers the pad portions 120 and 121 with the passivation film 122 interposed therebetween. The interlayer insulating film 123 is provided over the entire front surface of the semiconductor layer 100S, for example. The interlayer insulating film 123 is formed of a silicon oxide (SiO) film, for example. The bonding film 124 is provided on a bonding surface between the first substrate 100 (specifically, the wiring layer 100T) and the second substrate 200. That is, the bonding film 124 is in contact with the second substrate 200. The bonding film 124 is provided over the entire main surface of the first substrate 100. The bonding film 124 is formed of a silicon nitride film, for example.

The light receiving lens 401 faces the semiconductor layer 100S with the fixed charge film 112 and the insulating film 111 interposed therebetween, for example (FIG. 6). The light receiving lens 401 is provided at a position facing the photodiode PD of each of the pixels 541A, 541B, 541C, and 541D, for example.

The second substrate 200 includes the semiconductor layer 200S and the wiring layer 200T in this order from the first substrate 100 side. The semiconductor layer 200S is formed of a silicon substrate. In the semiconductor layer 200S, a well region 211 is provided across the thickness direction. The well region 211 is a p-type semiconductor region, for example. The second substrate 20 is provided with the pixel circuit 210 arranged for each of the pixel sharing units 539. The pixel circuit 210 is provided on the front surface side (wiring layer 200T side) of the semiconductor layer 200S, for example. In the imaging device 1, the second substrate 200 is bonded to the first substrate 100 such that the back surface side (semiconductor layer 200S side) of the second substrate 200 faces the front surface side (wiring layer 100T side) of the first substrate 100. That is, the second substrate 200 is bonded to the first substrate 100 in a face-to-back arrangement.

Figure 8:
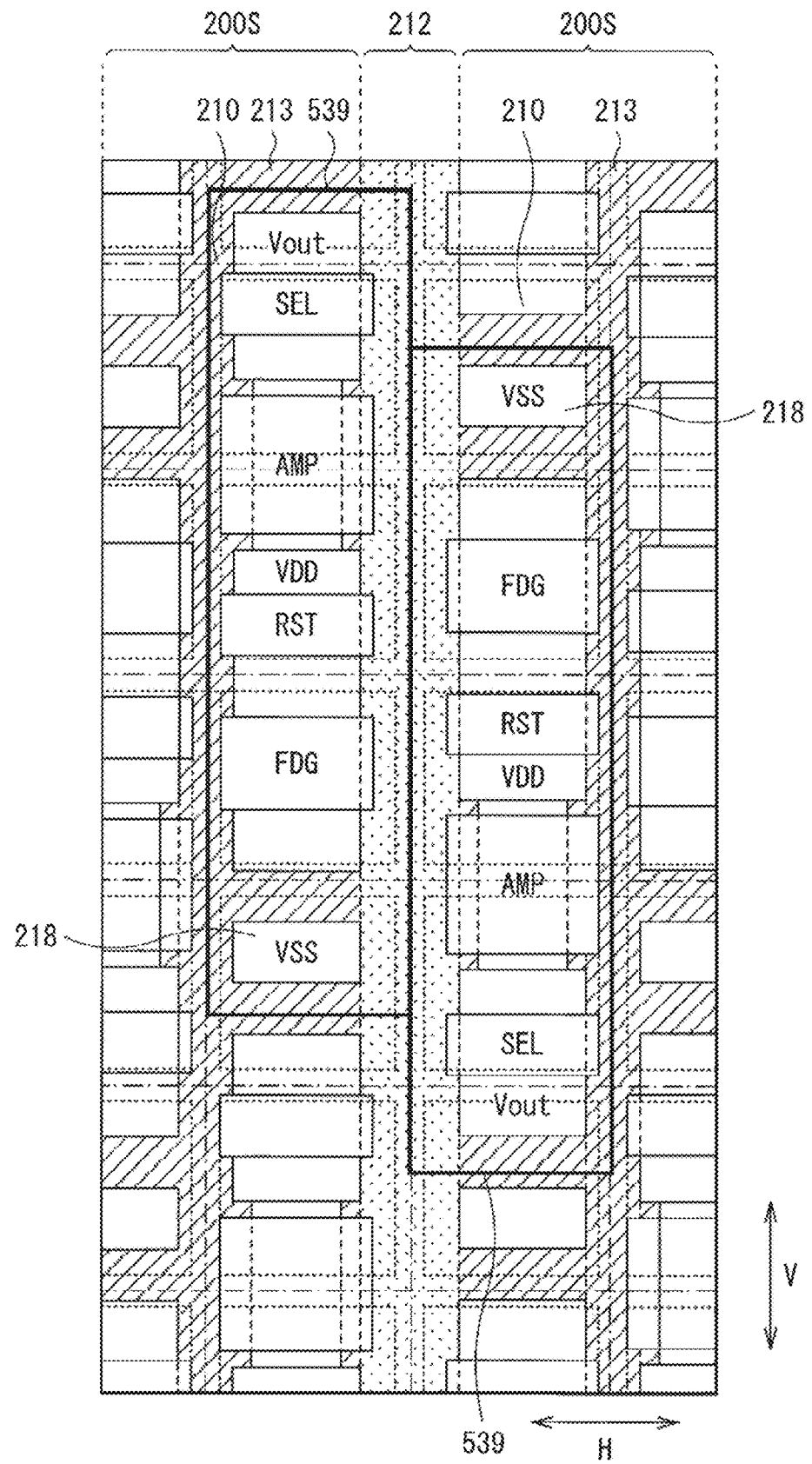
FIG. 8 is a schematic view illustrating an example of a planar configuration of a second substrate (semiconductor layer) illustrated in FIG. 6.
Figure 9:
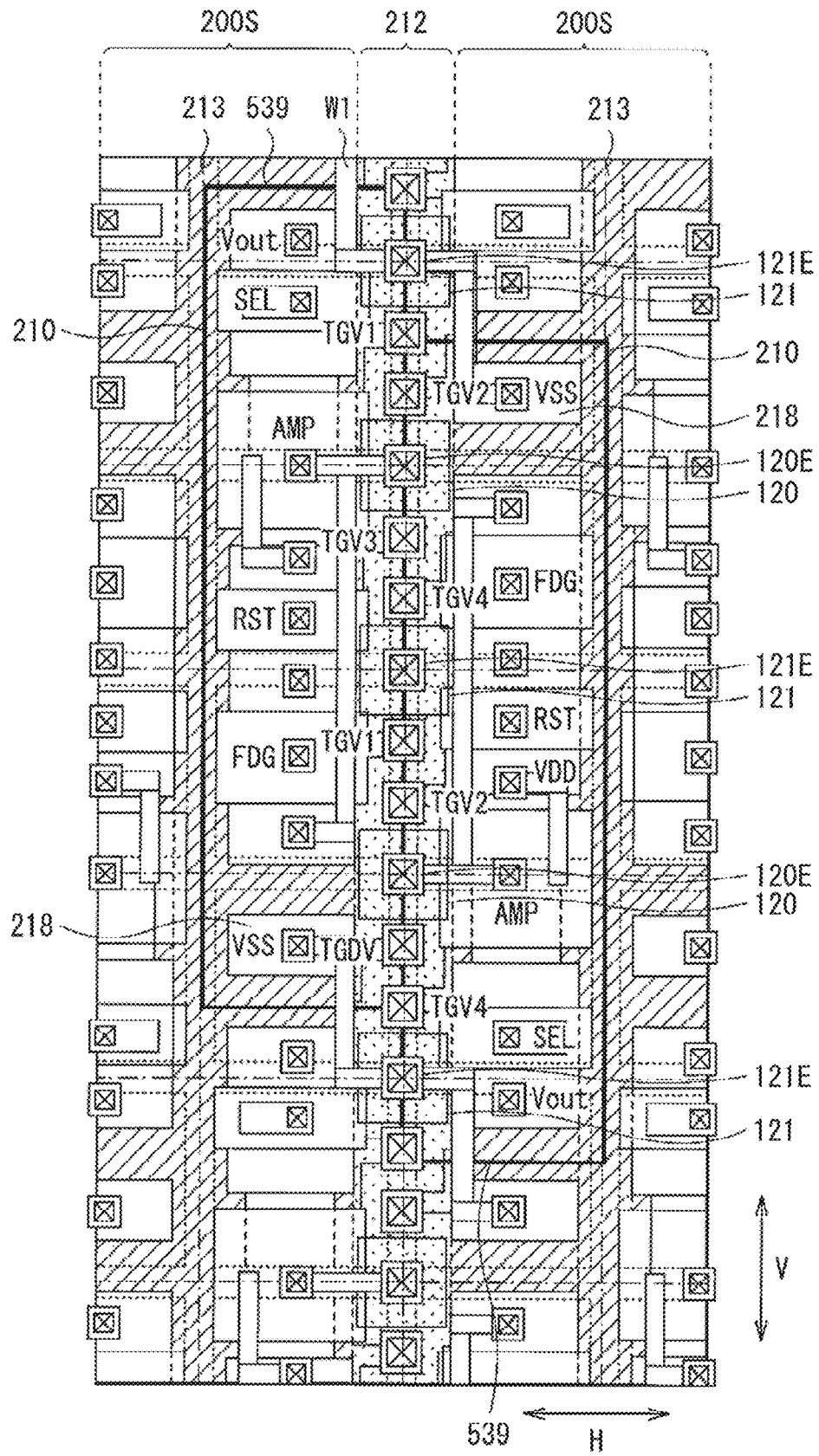
FIG. 9 is a schematic view illustrating an example of a planar configuration of a main part of a pixel circuit and the first substrate together with a first wiring layer illustrated in FIG. 6.
Figure 10:
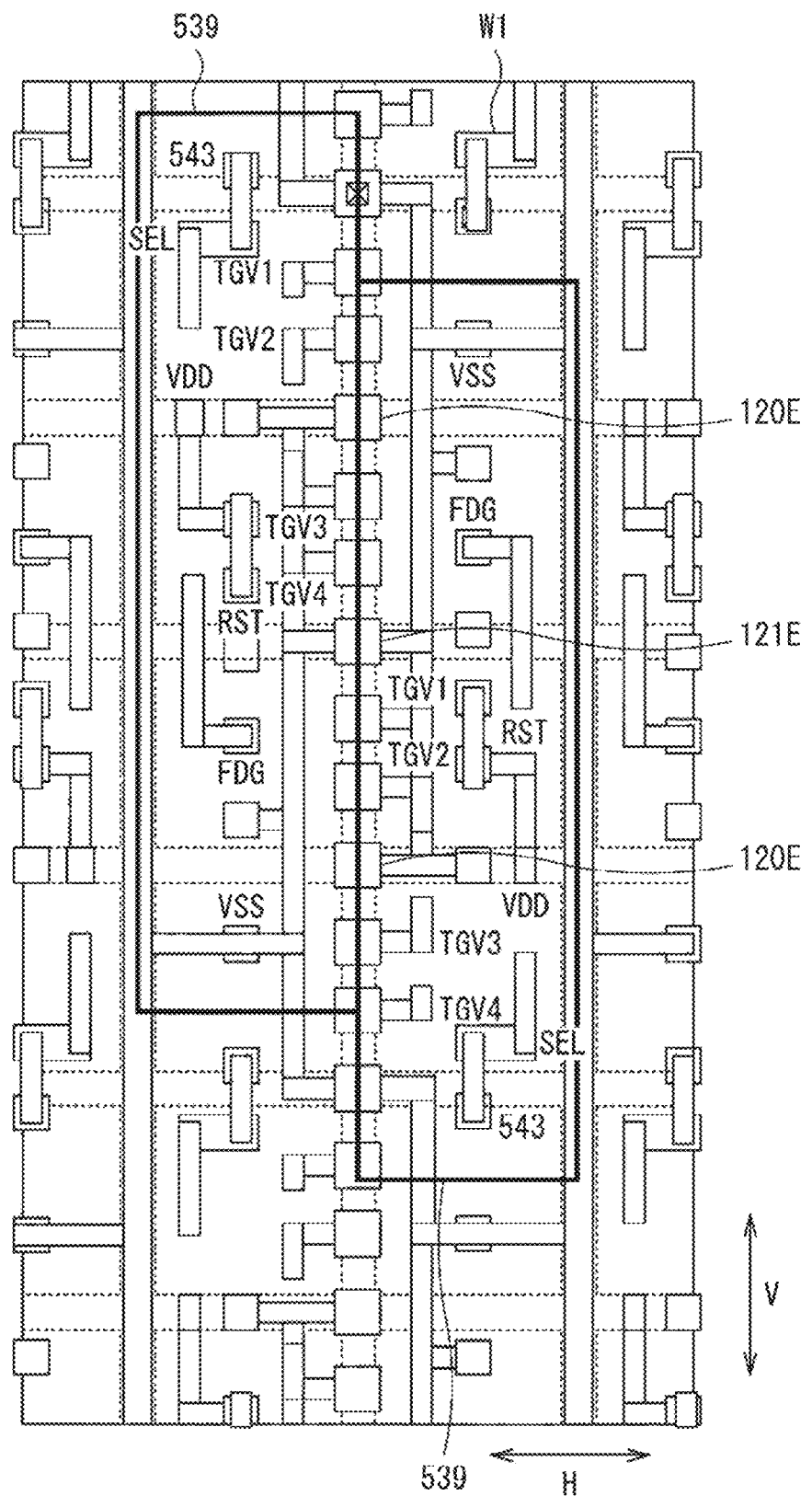
FIG. 10 is a schematic view illustrating an example of a planar configuration of the first wiring layer and a second wiring layer illustrated in FIG. 6.
Figure 11:
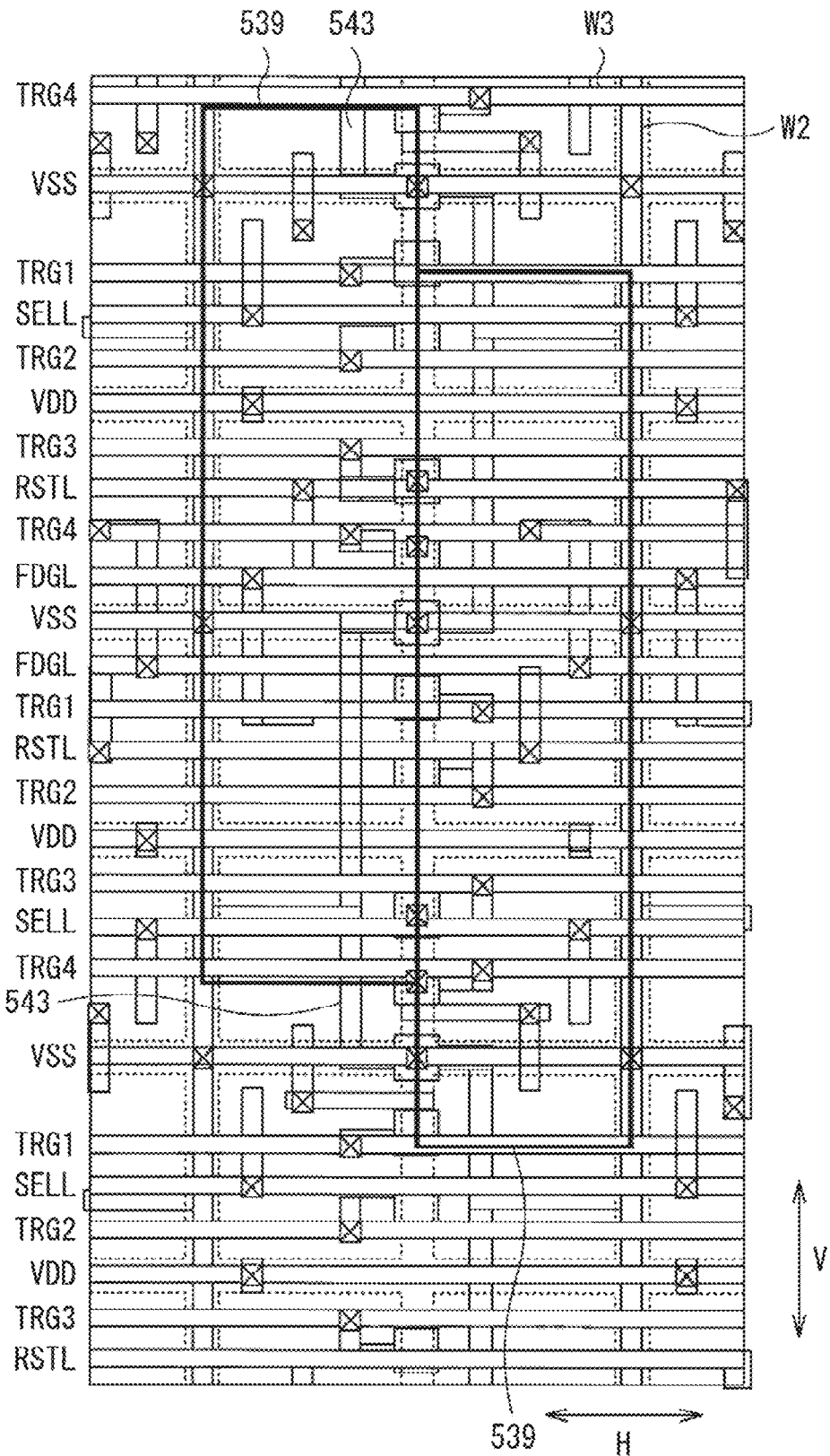
FIG. 11 is a schematic view illustrating an example of a planar configuration of the second wiring layer and a third wiring layer illustrated in FIG. 6.
Figure 12:
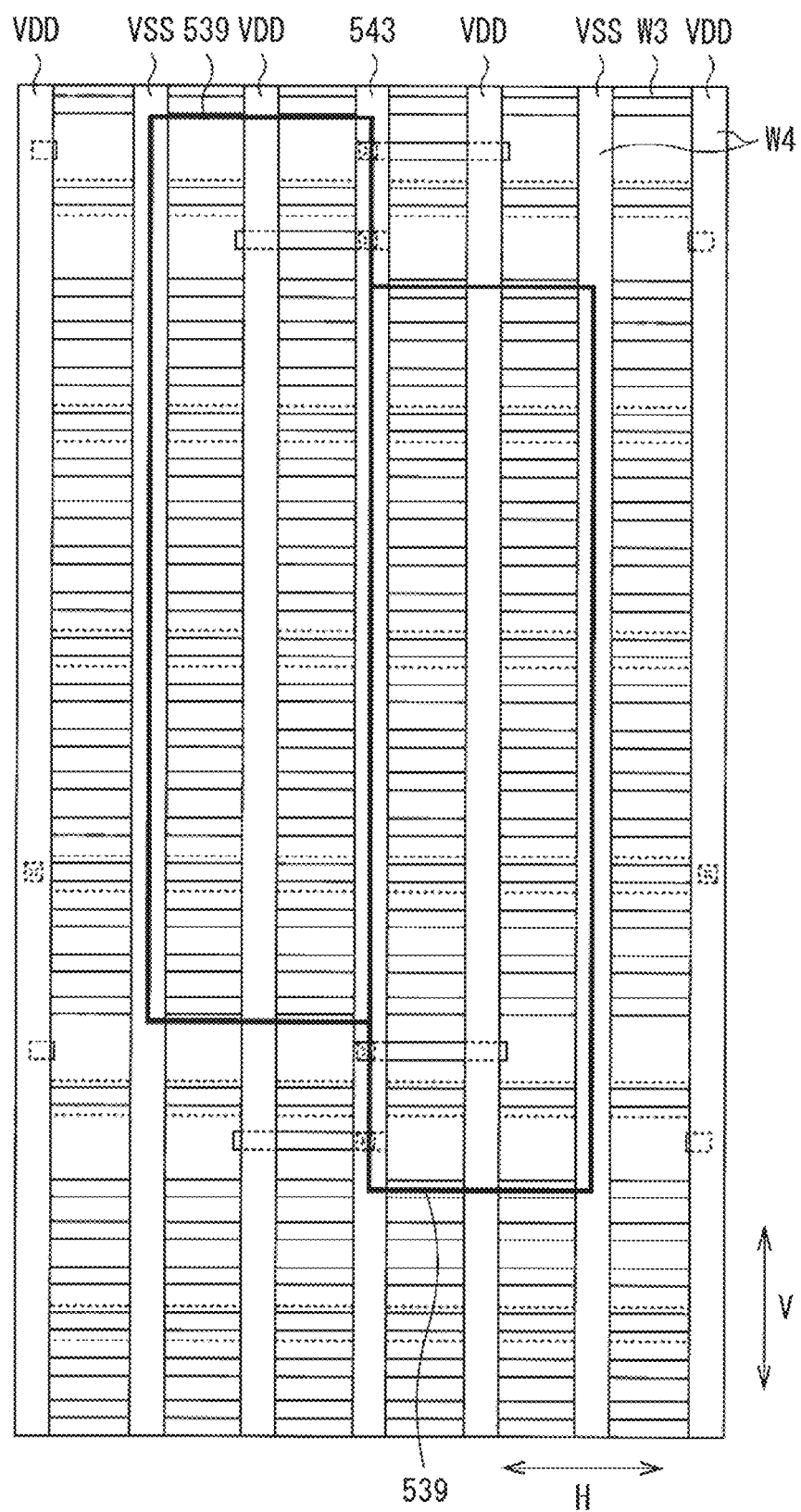
FIG. 12 is a schematic view illustrating an example of a planar configuration of the third wiring layer and a fourth wiring layer illustrated in FIG. 6.

FIGS. 8 to 12 schematically illustrate an example of a planar configuration of the second substrate 200. FIG. 8 illustrates a configuration of the pixel circuit 210 provided in the vicinity of the front surface of the semiconductor layer 200S. FIG. 9 schematically illustrates a configuration of each of portions of the wiring layer 200T (specifically, a first wiring layer W1 to be described below), the semiconductor layer 200S connected to the wiring layer 200T, and the first substrate 100. FIGS. 10 to 12 illustrate an example of a planar configuration of the wiring layer 200T. Hereinafter, the configuration of the second substrate 200 will be described with reference to FIGS. 8 to 12 together with FIG. 6. In FIGS. 8 and 9, the outer shape of the photodiode PD (boundary between the pixel isolation portion 117 and the photodiode PD) is indicated by a broken line, and a boundary between the semiconductor layer 200S and the element isolation region 213 or the insulating region 214 in a portion overlapping the gate electrode of each of transistors constituting the pixel circuit 210 is indicated by a dotted line. A portion overlapping the gate electrode of the amplification transistor AMP includes a boundary between the semiconductor layer 200S and the element isolation region 213 and a boundary between the element isolation region 213 and the insulating region 212 on one side in a channel width direction.

The second substrate 200 includes: the insulating region 212 that divides the semiconductor layer 200S; and the element isolation region 213 provided in a part of the semiconductor layer 200S in the thickness direction (FIG. 6). For example, the through-substrate electrodes 120E and 121E and the through-substrate electrodes TGV (through-substrate electrode TGV1, TGV2, TGV3, and TGV4) of the two pixel sharing units 539 connected to two pixel circuits 210 adjacent in the H direction are arranged in the insulating region 212 provided between the two pixel circuits 210 (FIG. 9).

The insulating region 212 has substantially the same thickness as the thickness of the semiconductor layer 200S (FIG. 6). The semiconductor layer 200S is divided by the insulating region 212. The through-substrate electrodes 120E and 121E and the through-substrate electrode TGV are disposed in the insulating region 212. The insulating region 212 is formed of silicon oxide, for example.

The through-substrate electrodes 120E and 121E are provided to penetrate the insulating region 212 in the thickness direction. The upper ends of the through-substrate electrodes 120E and 121E are connected to wiring (first wiring W1, second wiring W2, third wiring W3, and fourth wiring W4 to be described below) of the wiring layer 200T. The through-substrate electrodes 120E and 121E are provided to penetrate the insulating region 212, the bonding film 124, the interlayer insulating film 123, and the passivation film 122, and the lower ends of the electrodes are connected to the pad portions 120 and 121, respectively (FIG. 6). The through-substrate electrode 120E is provided for electrically connecting the pad portion 120 and the pixel circuit 210 to each other. That is, the floating diffusion FD of the first substrate 100 is electrically connected to the pixel circuit 210 of the second substrate 200 by the through-substrate electrode 120E. The through-substrate electrode 121E is provided for electrically connecting the pad portion 121 and the reference potential line VSS of the wiring layer 200T to each other. That is, the VSS contact region 118 of the first substrate 100 is electrically connected to the reference potential line VSS of the second substrate 200 by the through-substrate electrode 121E.

The through-substrate electrode TGV is provided to penetrate the insulating region 212 in the thickness direction. The upper end of the through-substrate electrode TGV is connected to the wiring of the wiring layer 200T. The through-substrate electrode TGV is provided to penetrate the insulating region 212, the bonding film 124, the interlayer insulating film 123, the passivation film 122, and the interlayer insulating film 119, and the lower end thereof is connected to the transfer gate TG (FIG. 6). Such a through-substrate electrode TGV is provided for electrically connecting the transfer gate TG (transfer gates TG1, TG2, TG3, and TG4) of each of the corresponding pixels 541A, 541B, 541C, and 541D to the wiring of the wiring layer 200T (part of the row drive signal line 542, specifically, wiring lines TRG1, TRG2, TRG3, and TRG4 in FIG. 11 to be described below). That is, by the through-substrate electrode TGV, the transfer gate TG of the first substrate 100 is electrically connected to the wiring TRG of the second substrate 200 and a drive signal is sent to each of the transfer transistors TR (transfer transistors TR1, TR2, TR3, and TR4).

The insulating region 212 is a region for insulating, from the semiconductor layer 200S, the through-substrate electrodes 120E and 121E and the through-substrate electrode TGV for electrically connecting the first substrate 100 and the second substrate 200 to each other. For example, the through-substrate electrodes 120E and 121E and the through-substrate electrode TGV (through-substrate electrode TGV1, TGV2, TGV3, and TGV4) connected to two pixel circuits 210 (pixel sharing unit 539) adjacent in the H direction are arranged in the insulating region 212 provided between the two pixel circuits 210. The insulating region 212 is provided to extend in the V direction, for example (FIGS. 8 and 9). Here, by appropriately arranging the horizontal portion TGb of the transfer gate TG, the through-substrate electrode TGV is disposed such that the position of the through-substrate electrode TGV in the H direction approaches the positions of the through-substrate electrodes 120E and 121E in the H direction as compared with the position of the vertical portion TGa (FIGS. 7A and 9). For example, the through-substrate electrode TGV is disposed at substantially the same position as the through-substrate electrodes 120E and 120E in the H direction. With this configuration, the through-substrate electrodes 120E and 121E and the through-substrate electrode TGV can be collectively disposed in the insulating region 212 extending in the V direction. As another arrangement example, it is also conceivable to provide the horizontal portion TGb only in a region overlapping the vertical portion TGa. In this case, the through-substrate electrode TGV would be formed substantially immediately above the vertical portion TGa, and for example, the through-substrate electrode TGV is disposed substantially at the central portion in the H direction and the V direction of each of the pixels 541. At this time, the position of the through-substrate electrode TGV in the H direction would greatly deviate from the positions of the through-substrate electrodes 120E and 121E in the H direction. For example, the insulating region 212 is provided around the through-substrate electrode TGV and the through-substrate electrodes 120E and 121E in order to electrically insulate these through-substrate electrodes from the adjacent semiconductor layer 200S. When the position of the through-substrate electrode TGV in the H direction and the positions of the through-substrate electrodes 120E and 121E in the H direction are greatly separated from each other, it would be necessary to provide the insulating region 212 independently around each of the through-substrate electrodes 120E, 121E, and TGV. This configuration would divide the semiconductor layer 200S into a large number of pieces. In comparison, the layout in which the through-substrate electrodes 120E and 121E and the through-substrate electrode TGV are collectively disposed in the insulating region 212 extending in the V direction can obtain a sufficiently large size of the semiconductor layer 200S in the H direction. This makes it possible to ensure a large area of the semiconductor element formation region in the semiconductor layer 200S. This configuration makes it possible, for example, to increase the size of the amplification transistor AMP and suppress noise.

As described with reference to FIG. 4, the pixel sharing unit 539 has a structure in which the floating diffusion FD provided in each of the plurality of pixels 541 is electrically connected, and the plurality of pixels 541 shares one pixel circuit 210. The floating diffusion FD is electrically connected to each other by the pad portion 120 provided on the first substrate 100 (FIGS. 6 and 7B). The electrical connection portion (pad portion 120) provided on the first substrate 100 and the pixel circuit 210 provided on the second substrate 200 are electrically connected via one through-substrate electrode 120E. In another conceivable structure example, an electrical connection portion between the floating diffusions FD can be provided on the second substrate 200. In this case, the pixel sharing unit 539 is provided with four through-substrate electrodes connected to the floating diffusions FD1, FD2, FD3, and FD4, respectively. This would result in, in the second substrate 200, the increased number of through-substrate electrodes penetrating the semiconductor layer 200S and enlargement of the insulating region 212 that insulates the surroundings of these through-substrate electrodes. In comparison, in the structure in which the pad portion 120 is provided on the first substrate 100 (FIGS. 6 and 7B), it is possible to achieve reduction in the number of through-substrate electrodes and downsizing of the insulating region 212. This makes it possible to ensure a large area of the semiconductor element formation region in the semiconductor layer 200S. This configuration makes it possible, for example, to increase the size of the amplification transistor AMP and suppress noise.

The element isolation region 213 is provided on the front surface side of the semiconductor layer 200S. The element isolation region 213 has a shallow trench isolation (STI) structure. In the element isolation region 213, the semiconductor layer 200S is engraved in the thickness direction (direction perpendicular to the main surface of the second substrate 200), and an insulating film is embedded in the engraved portion. This insulating film is formed of silicon oxide, for example. The element isolation region 213 isolates the plurality of elements, namely, transistors constituting the pixel circuit 210 from each other in accordance with the layout of the pixel circuit 210. The semiconductor layer 200S (specifically, well region 211) extends below the element isolation region 213 (deep portion of the semiconductor layer 200S).

Here, with reference to FIGS. 7A, 7B, and 8, a difference between the outer shape (outer shape in the substrate planar direction) of the pixel sharing unit 539 on the first substrate 100 and the outer shape of the pixel sharing unit 539 on the second substrate 200 will be described.

In the imaging device 1, the pixel sharing unit 539 is provided in both the first substrate 100 and the second substrate 200. For example, the outer shape of the pixel sharing unit 539 provided on the first substrate 100 is different from the outer shape of the pixel sharing unit 539 provided on the second substrate 200.

In FIGS. 7A and 7B, the outline of the pixels 541A, 541B, 541C, and 541D is represented by a one-dot chain line, and the outer shape of the pixel sharing unit 539 is represented by a thick line. For example, the pixel sharing unit 539 of the first substrate 100 is formed with two pixels 541 (pixels 541A and 541B) arranged adjacent to each other in the H direction and two pixels 541 (pixels 541C and 541D) arranged adjacent to each other in the V direction. That is, the pixel sharing unit 539 of the first substrate 100 includes four pixels 541 in adjacent 2 rows×2 columns, giving the pixel sharing unit 539 of the first substrate 100 a substantially square outer shape. In the pixel array unit 540, such pixel sharing units 539 are arranged adjacent to each other at a two-pixel pitch (pitch corresponding to two pixels 541) in the H direction and a two-pixel pitch (pitch corresponding to two pixels 541) in the V direction.

In FIGS. 8 and 9, the outline of the pixels 541A, 541B, 541C, and 541D is represented by a one-dot chain line, and the outer shape of the pixel sharing unit 539 is represented by a thick line. For example, the outer shape of the pixel sharing unit 539 of the second substrate 200 is smaller than the pixel sharing unit 539 of the first substrate 100 in the H direction and larger than the pixel sharing unit 539 of the first substrate 100 in the V direction. For example, the pixel sharing unit 539 of the second substrate 200 is formed in a size (region) corresponding to one pixel in the H direction, and is formed in a size corresponding to four pixels in the V direction. That is, the pixel sharing unit 539 of the second substrate 200 is formed in a size corresponding to the pixels arranged in adjacent 1 row×4 columns, giving the pixel sharing unit 539 of the second substrate 200 a substantially rectangular outer shape.

For example, in each of the pixel circuits 210, the selection transistor SEL, the amplification transistor AMP, the reset transistor RST, and the FD conversion gain switching transistor FDG are arranged in this order in the V direction (FIG. 8). By providing the outer shape of each pixel circuit 210 in a substantially rectangular shape as described above, it is possible to arrange four transistors (selection transistor SEL, amplification transistor AMP, reset transistor RST, and FD conversion gain switching transistor FDG) side by side in one direction (V direction in FIG. 8). With this configuration, the drain of the amplification transistor AMP and the drain of the reset transistor RST can be shared by one diffusion region (diffusion region connected to the power supply line VDD). For example, the formation region of each of the pixel circuits 210 can be provided in a substantially square shape (refer to FIG. 21 described below). In this case, two transistors are arranged along one direction, making it difficult to share the drain of the amplification transistor AMP and the drain of the reset transistor RST in one diffusion region. Therefore, the formation region of the pixel circuit 210 provided in a substantially rectangular shape will facilitate arrangement of the four transistors so as to be close to each other, making it possible to downsize the formation region of the pixel circuit 210. This leads to miniaturization of the pixels. Furthermore, when there is no need to reduce the formation region of the pixel circuit 210, the formation region of the amplification transistor AMP can be increased to suppress noise.

For example, in the vicinity of the front surface of the semiconductor layer 200S, the VSS contact region 218 connected to the reference potential line VSS is provided in addition to the selection transistor SEL, the amplification transistor AMP, the reset transistor RST, and the FD conversion gain switching transistor FDG. The VSS contact region 218 is formed with a p-type semiconductor region, for example. The VSS contact region 218 is electrically connected to the VSS contact region 118 of the first substrate 100 (semiconductor layer 100S) via the wiring of the wiring layer 200T and the through-substrate electrode 121E. The VSS contact region 218 is provided at a position adjacent to the source of the FD conversion gain switching transistor FDG with the element isolation region 213 interposed therebetween, for example (FIG. 8).

Next, a positional relationship between the pixel sharing unit 539 provided on the first substrate 100 and the pixel sharing unit 539 provided on the second substrate 200 will be described with reference to FIGS. 7B and 8. For example, one pixel sharing unit 539 (for example, one on the upper side of FIG. 7B) out of the two pixel sharing units 539 arranged in the V direction on the first substrate 100 is connected to one pixel sharing unit 539 (for example, one on the left side of FIG. 8) out of the two pixel sharing units 539 arranged in the H direction on the second substrate 200. For example, the other pixel sharing unit 539 (for example, one on the lower side of FIG. 7B) out of the two pixel sharing units 539 arranged in the V direction on the first substrate 100 is connected to the other pixel sharing unit 539 (for example, one on the right side of FIG. 8) out of the two pixel sharing units 539 arranged in the H direction on the second substrate 200.

For example, in the two pixel sharing units 539 arranged in the H direction of the second substrate 200, the internal layout (arrangement of transistors and the like) of one pixel sharing unit 539 is substantially equal to the layout obtained by inverting the internal layout of the other pixel sharing unit 539 in the V direction and the H direction. Hereinafter, effects obtained by this layout will be described.

In the two pixel sharing units 539 arranged in the V direction of the first substrate 100, each of the pad portions 120 is arranged at the central portion of the outer shape of the pixel sharing unit 539, that is, at the central portion in the V direction and the H direction of the pixel sharing unit 539 (FIG. 7B). On the other hand, the pixel sharing unit 539 of the second substrate 200 has a substantially rectangular outer shape long in the V direction as described above, and thus, the amplification transistor AMP connected to the pad portion 120 is disposed at a position shifted upward in the drawing from the center of the pixel sharing unit 539 in the V direction, for example. For example, when the two pixel sharing units 539 arranged in the H direction of the second substrate 200 have the same internal layout, the distance between the amplification transistor AMP of one pixel sharing unit 539 and the pad portion 120 (for example, the pad portion 120 of the pixel sharing unit 539 on the upper side of FIGS. 7A and 7B) becomes relatively short. However, the distance between the amplification transistor AMP of the other pixel sharing unit 539 and the pad portion 120 (for example, the pad portion 120 of the pixel sharing unit 539 on the lower side of FIGS. 7A and 7B) becomes long. This increases the area of the wiring required for connecting the amplification transistor AMP and the pad portion 120, leading to a concern of complication of the wiring layout of the pixel sharing unit 539. This may affect miniaturization of the imaging device 1.

In contrast, by inverting the internal layout of the two pixel sharing units 539 arranged in the H direction of the second substrate 200 at least in the V direction, it is possible to shorten the distance between the amplification transistor AMP and the pad portion 120 of both of the two pixel sharing units 539. This makes it easy to miniaturize the imaging device 1 as compared with the configuration in which the two pixel sharing units 539 arranged in the H direction of the second substrate 200 have the same internal layout. Although the planar layout of each of the plurality of pixel sharing units 539 of the second substrate 200 is bilaterally symmetrical in the range illustrated in FIG. 8, the layout is bilaterally asymmetrical when including the layout of the first wiring layer W1 illustrated in FIG. 9 to be described below.

Furthermore, it is preferable that the internal layouts of the two pixel sharing units 539 arranged in the H direction of the second substrate 200 are also inverted in the H direction. Hereinafter, the reason for this will be described. As illustrated in FIG. 9, each of the two pixel sharing units 539 arranged in the H direction on the second substrate 200 is connected to each of the pad portions 120 and 121 of the first substrate 100. For example, the pad portions 120 and 121 are disposed at the central portion in the H direction (between the two pixel sharing units 539 arranged in the H direction) of the two pixel sharing units 539 arranged in the H direction on the second substrate 200. Therefore, by inverting the internal layouts of the two pixel sharing units 539 arranged in the H direction of the second substrate 200 also in the H direction, it is possible to reduce the distance between each of the plurality of pixel sharing units 539 of the second substrate 200 and each of the pad portions 120 and 121. This makes it further easier to miniaturize the imaging device 1.

Furthermore, the position of the outline of the pixel sharing unit 539 of the second substrate 200 does not have to be aligned with the position of any of the outlines of the pixel sharing units 539 of the first substrate 100. For example, in one pixel sharing unit 539 (for example, the one on the left side of FIG. 9) out of the two pixel sharing units 539 arranged in the H direction on the second substrate 200, one outline (for example, one on the upper side of FIG. 9) in the V direction is arranged outside the outline of one outline in the V direction of the pixel sharing unit 539 (for example, one on the upper side of FIG. 7B) of the corresponding first substrate 100. Furthermore, in the other pixel sharing unit 539 (for example, the one on the right side of FIG. 9) out of the two pixel sharing units 539 arranged in the H direction on the second substrate 200, the other outline (for example, one on the lower side of FIG. 9) in the V direction is arranged outside the outline of the other outline in the V direction of the pixel sharing unit 539 (for example, one on the lower side of FIG. 7B) of the corresponding first substrate 100. In this manner, by arranging the pixel sharing unit 539 of the second substrate 200 and the pixel sharing unit 539 of the first substrate 100 to correspond to each other, it is possible to shorten the distance between the amplification transistor AMP and the pad portion 120. This makes it easier to miniaturize the imaging device 1.

Furthermore, the positions of the outlines of the plurality of pixel sharing units 539 of the second substrate 200 do not need to be aligned. For example, the two pixel sharing units 539 arranged in the H direction of the second substrate 200 are arranged such that their outline positions in the V direction are shifted with each other. This configuration makes it possible to shorten the distance between the amplification transistor AMP and the pad portion 120. This makes it easier to miniaturize the imaging device 1.

The repeated arrangement of the pixel sharing units 539 in the pixel array unit 540 will be described with reference to FIGS. 7B and 9. The pixel sharing unit 539 of the first substrate 100 has the size of two pixels 541 in the H direction and the size of two pixels 541 in the V direction (FIG. 7B). For example, in the pixel array unit 540 of the first substrate 100, the pixel sharing unit 539 having the size corresponding to the four pixels 541 is repeatedly arranged adjacent to each other at a pitch of two pixels in the H direction (a pitch corresponding to two pixels 541) and at a pitch of two pixels in the V direction (a pitch corresponding to two pixels 541).

Alternatively, the pixel array unit 540 of the first substrate 100 may include a pair of pixel sharing units 539 in which two pixel sharing units 539 are arranged adjacent to each other in the V direction. In the pixel array unit 540 of the first substrate 100, for example, the pair of pixel sharing units 539 adjacent to each other is repeatedly arranged at a pitch of two pixels in the H direction (a pitch corresponding to two pixels 541) and at a pitch of four pixels in the V direction (a pitch corresponding to four pixels 541). The pixel sharing unit 539 of the second substrate 200 has the size of one pixel 541 in the H direction and the size of four pixels 541 in the V direction (FIG. 9). For example, the pixel array unit 540 of the second substrate 200 includes a pair of pixel sharing units 539 including two pixel sharing units 539 having a size corresponding to the four pixels 541. The pixel sharing units 539 are arranged adjacent to each other in the H direction and are arranged to be shifted from each other in the V direction. In the pixel array unit 540 of the second substrate 200, for example, the pair of pixel sharing units 539 adjacent to each other is repeatedly arranged without a gap at a pitch of two pixels in the H direction (a pitch corresponding to two pixels 541) and at a pitch of four pixels in the V direction (a pitch corresponding to four pixels 541). Such repetitive arrangement of the pixel sharing units 539 enables the pixel sharing units 539 to be arranged without any gap. This makes it easier to miniaturize the imaging device 1.

The amplification transistor AMP preferably has a three-dimensional structure such as a Fin-shaped transistor, for example (FIG. 6). This increases the effective gate width, making it possible to suppress noise. The selection transistor SEL, the reset transistor RST, and the FD conversion gain switching transistor FDG have, for example, a planar structure. The amplification transistor AMP may have a planar structure. Alternatively, the selection transistor SEL, the reset transistor RST, or the FD conversion gain switching transistor FDG may have a three-dimensional structure.

The wiring layer 200T includes, for example, a passivation film 221, an interlayer insulating film 222, and a plurality of wiring layers (a first wiring layer W1, a second wiring layer W2, a third wiring layer W3, and a fourth wiring layer W4). For example, the passivation film 221 is in contact with the front surface of the semiconductor layer 200S and covers the entire front surface of the semiconductor layer 200S. The passivation film 221 covers the gate electrodes of the selection transistor SEL, the amplification transistor AMP, the reset transistor RST, and the FD conversion gain switching transistor FDG individually. The interlayer insulating film 222 is provided between the passivation film 221 and the third substrate 300. The interlayer insulating film 222 isolates the plurality of wiring layers (first wiring layer W1, second wiring layer W2, third wiring layer W3, and fourth wiring layer W4) from each other. The interlayer insulating film 222 is formed of silicon oxide, for example.

The wiring layer 200T includes, from the semiconductor layer 200S side, a first wiring layer W1, a second wiring layer W2, a third wiring layer W3, a fourth wiring layer W4, and the contact portions 201 and 202 in this order, and these portions are insulated from each other by the interlayer insulating film 222. The interlayer insulating film 222 includes a plurality of connection portions that connects the first wiring layer W1, the second wiring layer W2, the third wiring layer W3 or the fourth wiring layer W4 with their lower layers. The connection portion is a portion obtained by embedding a conductive material in a connection hole provided in the interlayer insulating film 222. For example, the interlayer insulating film 222 includes a connection portion 218V that connects the first wiring layer W1 and the VSS contact region 218 of the semiconductor layer 200S. For example, the hole diameter of the connection portion connecting the elements of the second substrate 200 is different from the hole diameters of the through-substrate electrodes 120E and 121E and the through-substrate electrode TGV. Specifically, the hole diameter of the connection hole connecting the elements of the second substrate 200 is preferably smaller than the hole diameters of the through-substrate electrodes 120E and 121E and the through-substrate electrode TGV. Hereinafter, the reason for this will be described. The depth of the connection portion provided in the wiring layer 200T (the connection portion 218V or the like) is smaller than the depths of the through-substrate electrodes 120E and 121E and the through-substrate electrode TGV. Therefore, the connection portion can easily fill the connection hole with the conductive material as compared with the through-substrate electrodes 120E and 121E and the through-substrate electrode TGV. By forming the hole diameter of the connection portion smaller than the hole diameters of the through-substrate electrodes 120E and 121E and the through-substrate electrode TGV, it is possible to facilitate miniaturization of the imaging device 1.

For example, the through-substrate electrode 120E is connected to the gate of the amplification transistor AMP and the source of the FD conversion gain switching transistor FDG (specifically, a connection hole reaching the source of the FD conversion gain switching transistor FDG) by the first wiring layer W1. The first wiring layer W1 connects the through-substrate electrode 121E and the connection portion 218V to each other, for example, enabling electrical connection between the VSS contact region 218 of the semiconductor layer 200S and the VSS contact region 118 of the semiconductor layer 100S.

Next, a planar configuration of the wiring layer 200T will be described with reference to FIGS. 10 to 12. FIG. 10 illustrates an example of a planar configuration of the first wiring layer W1 and the second wiring layer W2. FIG. 11 illustrates an example of a planar configuration of the second wiring layer W2 and the third wiring layer W3. FIG. 12 illustrates an example of a planar configuration of the third wiring layer W3 and the fourth wiring layer W4.

For example, the third wiring layer W3 includes wiring lines TRG1, TRG2, TRG3, TRG4, SELL, RSTL, and FDGL extending in the H direction (row direction) (FIG. 11). These wiring lines correspond to the plurality of row drive signal lines 542 described with reference to FIG. 4. The wiring lines TRG1, TRG2, TRG3, and TRG4 are provided for sending drive signals to the transfer gates TG1, TG2, TG3, and TG4, respectively. The wiring lines TRG1, TRG2, TRG3, and TRG4 are respectively connected to the transfer gates TG1, TG2, TG3, and TG4 via the second wiring layer W2, the first wiring layer W1, and the through-substrate electrode 120E. The wiring line SELL is provided for sending a drive signal to the gate of the selection transistor SEL, the wiring line RSTL is provided for sending a drive signal to the gate of the reset transistor RST, and the wiring line FDGL is provided for sending a drive signal to the gate of the FD conversion gain switching transistor FDG. The wiring lines SELL, RSTL, and FDGL are connected to the gates of the selection transistor SEL, the reset transistor RST, and the FD conversion gain switching transistor FDG via the second wiring layer W2, the first wiring layer W1, and the connection portion, respectively.

For example, the fourth wiring layer W4 includes a power supply line VDD, a reference potential line VSS, and a vertical signal line 543 extending in the V direction (column direction) (FIG. 12). The power supply line VDD is connected to the drain of the amplification transistor AMP and the drain of the reset transistor RST via the third wiring layer W3, the second wiring layer W2, the first wiring layer W1, and the connection portion. The reference potential line VSS is connected to the VSS contact region 218 via the third wiring layer W3, the second wiring layer W2, the first wiring layer W1, and the connection portion 218V. In addition, the reference potential line VSS is connected to the VSS contact region 118 of the first substrate 100 via the third wiring layer W3, the second wiring layer W2, the first wiring layer W1, the through-substrate electrode 121E, and the pad portion 121. The vertical signal line 543 is connected to the source (Vout) of the selection transistor SEL via the third wiring layer W3, the second wiring layer W2, the first wiring layer W1, and the connection portion.

The contact portions 201 and 202 may be provided at a position overlapping the pixel array unit 540 in plan view (for example, FIG. 3), or may be provided in the peripheral portion 540B outside the pixel array unit 540 (for example, FIG. 6). The contact portions 201 and 202 are provided on the front surface (surface on the wiring layer 200T side) of the second substrate 200. The contact portions 201 and 202 are formed of metal such as copper (Cu) and aluminum (Al), for example. The contact portions 201 and 202 are exposed on the front surface (surface on the third substrate 300 side) of the wiring layer 200T. The contact portions 201 and 202 are used for electrical connection between the second substrate 200 and the third substrate 300 and bonding between the second substrate 200 and the third substrate 300.

FIG. 6 illustrates an example in which a peripheral circuit is provided in the peripheral portion 540B of the second substrate 200. This peripheral circuit may include a part of the row drive unit 520, a part of the column signal processing unit 550, and the like. Furthermore, as illustrated in FIG. 3, the connection holes H1 and H2 may be arranged in the vicinity of the pixel array unit 540, instead of disposing the peripheral circuit in the peripheral portion 540B of the second substrate 200.

The third substrate 300 includes the wiring layer 300T and the semiconductor layer 300S in this order from the second substrate 200 side, for example. For example, the front surface of the semiconductor layer 300S is provided on the second substrate 200 side. The semiconductor layer 300S is formed with a silicon substrate. The semiconductor layer 300S includes a circuit provided at its portion on the front surface side. Specifically, for example, the portion on the front surface side of the semiconductor layer 300S includes at least a part of the input unit 510A, the row drive unit 520, the timing control unit 530, the column signal processing unit 550, the image signal processing unit 560, and the output unit 510B. The wiring layer 300T provided between the semiconductor layer 300S and the second substrate 200 includes an interlayer insulating film, a plurality of wiring layers isolated by the interlayer insulating film, and the contact portions 301 and 302. The contact portions 301 and 302 are exposed on the front surface (the surface on the second substrate 200 side) of the wiring layer 300T, with the contact portion 301 being in contact with the contact portion 201 of the second substrate 200, and with the contact portion 302 being in contact with the contact portion 202 of the second substrate 200, individually. The contact portions 301 and 302 are electrically connected to a circuit (for example, at least one of the input unit 510A, the row drive unit 520, the timing control unit 530, the column signal processing unit 550, the image signal processing unit 560, or the output unit 510B) formed in the semiconductor layer 300S. The contact portions 301 and 302 are formed of metal such as copper (Cu) and aluminum (Al), for example. For example, an external terminal TA is connected to the input unit 510A via the connection hole H1, while an external terminal TB is connected to the output unit 510B via the connection hole H2.

Here, features of the imaging device 1 will be described.

Typically, an imaging device includes a photodiode and a pixel circuit, as main components. Here, increasing the area of the photodiode will increase the charge generated as a result of photoelectric conversion. As a result, the signal/noise ratio (S/N ratio) of the pixel signal is improved, and the imaging device can output better image data (image information). In contrast, increasing the size of the transistor (particularly, the size of the amplification transistor) included in the pixel circuit will decrease the noise generated in the pixel circuit. As a result, the S/N ratio of the imaging signal is improved, enabling the imaging device to output better image data (image information).

However, in an imaging device in which a photodiode and a pixel circuit are provided on the same semiconductor substrate, increasing the area of the photodiode in a limited area of the semiconductor substrate might decrease the size of a transistor included in the pixel circuit. Furthermore, increasing the size of the transistor included in the pixel circuit might decrease the area of the photodiode.

In order to solve these problems, for example, the imaging device 1 of the present embodiment uses a structure in which a plurality of pixels 541 shares one pixel circuit 210 and the shared pixel circuit 210 is arranged to overlap the photodiode PD. This configuration makes it possible to realize maximization of the area of the photodiode PD and maximization of the size of the transistor included in the pixel circuit 210 within the limited area of the semiconductor substrate. This configuration makes it possible to improve the S/N ratio of the pixel signal, enabling the imaging device 1 to output better image data (image information).

In implementation of a structure in which the plurality of pixels 541 shares one pixel circuit 210 and the shared pixel circuit 210 is arranged to overlap the photodiode PD, a plurality of wiring lines connected to one pixel circuit 210 extends from the floating diffusion FD of each of the plurality of pixels 541. In order to ensure a large area of the semiconductor substrate 200 forming the plurality of pixel circuits 210, a plurality of extending wiring lines can be mutually connected to form integrated connected wiring. Similarly, for the plurality of wiring lines extending from the VSS contact region 118, it is possible to mutually connect the plurality of extending wiring lines to form the integrated connected wiring.

Forming a connected wiring that mutually connects a plurality of wiring lines extending from the floating diffusion FD of each of the plurality of pixels 541 in the semiconductor substrate 200 on which the pixel circuit 210 is to be formed, however, would lead to a conceivable concern of decreasing an area for forming transistors included in the pixel circuit 210. Similarly, forming an integrated connected wiring of mutually connecting a plurality of wiring lines extending from the VSS contact region 118 of each of the plurality of pixels 541 in the semiconductor substrate 200 on which the pixel circuit 210 is to be formed would lead to a conceivable concern of decreasing the area for forming the transistors included in the pixel circuit 210.

In order to solve these problems, for example, the imaging device 1 of the present embodiment can use a structure in which a plurality of pixels 541 shares one pixel circuit 210, and the shared pixel circuit 210 is arranged to overlap the photodiode PD, the structure being a structure in which an integrated connected wiring of mutually connecting the floating diffusions FD of each of the plurality of pixels 541, and an integrated connected wiring of mutually connecting the VSS contact regions 118 included in each of the plurality of pixels 541, are provided on the first substrate 100.

Here, by utilizing the second manufacturing method described above as the manufacturing method for providing, on the first substrate 100, the integrated connected wiring of mutually connecting the floating diffusion FD of each of the plurality of pixels 541 and the integrated connected wiring of mutually connecting the VSS contact region 118 of each of the plurality of pixels 541, it is possible to achieve manufacturing using an appropriate process according to the configuration of each of the first substrate 100 and the second substrate 200, leading to the manufacture of an imaging device with high quality and high performance. In addition, the connected wiring of the first substrate 100 and the second substrate 200 can be formed by a facilitated process. Specifically, in the case of using the second manufacturing method, an electrode connected to the floating diffusion FD and an electrode connected to the VSS contact region 118 are each provided on the front surface of the first substrate 100 and the front surface of the second substrate 200, which are the bonding boundary surfaces between the first substrate 100 and the second substrate 200. Furthermore, it is preferable to enlarge the electrodes formed on the front surfaces of the two substrates, namely, the first substrate 100 and the second substrate 200 so that the electrodes formed on the front surfaces of the two substrates come into contact with each other even when misalignment occurs between the electrodes provided on the front surfaces of the two substrates when the two substrates are bonded together. In this case, however, there is a conceivable concern of difficulty in disposing the electrodes in a limited area of individual pixels included in the imaging device 1.

In order to solve the problem of requirement for a large electrode at the bonding boundary surface between the first substrate 100 and the second substrate 200, the imaging device 1 of the present embodiment can use, for example, the first manufacturing method described above as the manufacturing method in which the plurality of pixels 541 shares one pixel circuit 210, and the shared pixel circuit 210 is arranged to overlap the photodiode PD. With this configuration, it is possible to facilitate alignment of elements formed on the first substrate 100 and the second substrate 200 with each other, leading to achievement of manufacturing a high-quality and high-performance imaging device. Furthermore, a unique structure generated by using this manufacturing method can be provided. That is, the imaging device includes a structure in which the semiconductor layer 100S, the wiring layer 100T of the first substrate 100, and the semiconductor layer 200S and the wiring layer 200T of the second substrate 200, are stacked in this order, in other words, a structure in which the first substrate 100 and the second substrate 200 are stacked in a face-to-back arrangement, and the device is provided with the through-substrate electrodes 120E and 121E penetrating from the front surface of the semiconductor layer 200S of the second substrate 200 through the semiconductor layer 200S and the wiring layer 100T of the first substrate 100 to reach the front surface of the semiconductor layer 100S of the first substrate 100.

Regarding this structure, however, having the integrated connected wiring of mutually connecting the floating diffusion FD of each of the plurality of pixels 541, and the integrated connected wiring of mutually connecting the VSS contact region 118 of each of the plurality of pixels 541, being provided on the first substrate 100, stacking this structure and the second substrate 200 using the first manufacturing method and then forming the pixel circuit 210 on the second substrate 200 would lead to a possibility that the heating process necessary at formation of the active elements included in the pixel circuit 210 might affect the connected wiring that has been formed on the first substrate 100.

Therefore, in order to solve the problem that the connected wiring is affected by the heating process at formation of active elements, it is desirable that the imaging device 1 of the present embodiment use a conductive material having high heat resistance for the integrated connected wiring of mutually connecting the floating diffusion FD of each of the plurality of pixels 541 and the integrated connected wiring of mutually connecting the VSS contact regions 118 of each of the plurality of pixels 541. Specifically, as the conductive material having high heat resistance, it is possible to use a material having a melting point higher than that of at least a part of the wiring material included in the wiring layer 200T of the second substrate 200.

In this manner, for example, the imaging device 1 of the present embodiment includes: (1) a structure in which the first substrate 100 and the second substrate 200 are stacked in a face-to-back arrangement (specifically, a structure in which the semiconductor layer 100S and the wiring layer 100T of the first substrate 100, and the semiconductor layer 200S and the wiring layer 200T of the second substrate 200 are stacked in this order); (2) a structure in which the through-substrate electrodes 120E and 121E are provided from the front surface of the semiconductor layer 200S of the second substrate 200, penetrating through the semiconductor layer 200S and the wiring layer 100T of the first substrate 100 to reach the front surface of the semiconductor layer 100S of the first substrate 100; and (3) a structure in which the integrated connected wiring of mutually connecting the floating diffusion FD included in each of the plurality of pixels 541, and the integrated connected wiring of mutually connecting the VSS contact regions 118 included in each of the plurality of pixels 541, are formed of a conductive material having high heat resistance. With this configuration, it is possible to provide the integrated connected wiring of mutually connecting the floating diffusion FD included in each of the plurality of pixels 541 and the integrated connected wiring of mutually connecting the VSS contact regions 118 included in each of the plurality of pixels 541, on the first substrate 100 without providing a large electrode at the boundary surface between the first substrate 100 and the second substrate 200.

[Operations of Imaging Device 1]

Figure 13:
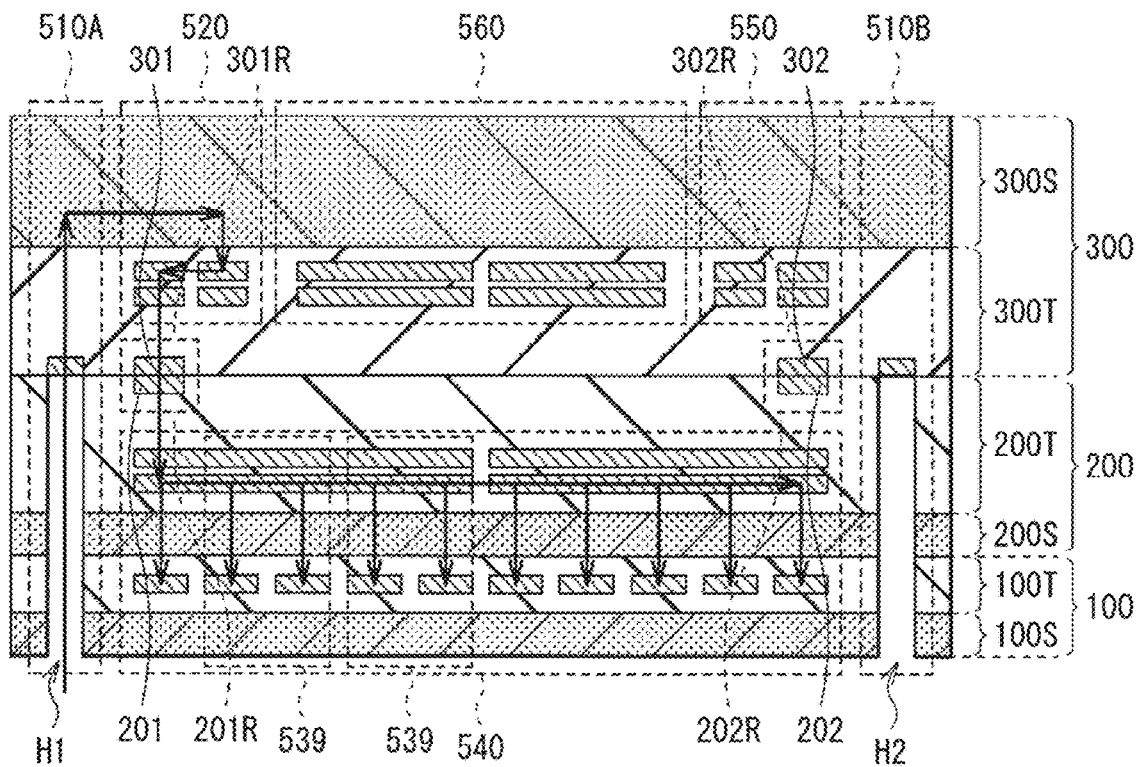
FIG. 13 is a schematic view illustrating a route of an input signal to the imaging device illustrated in FIG. 3.
Figure 14:
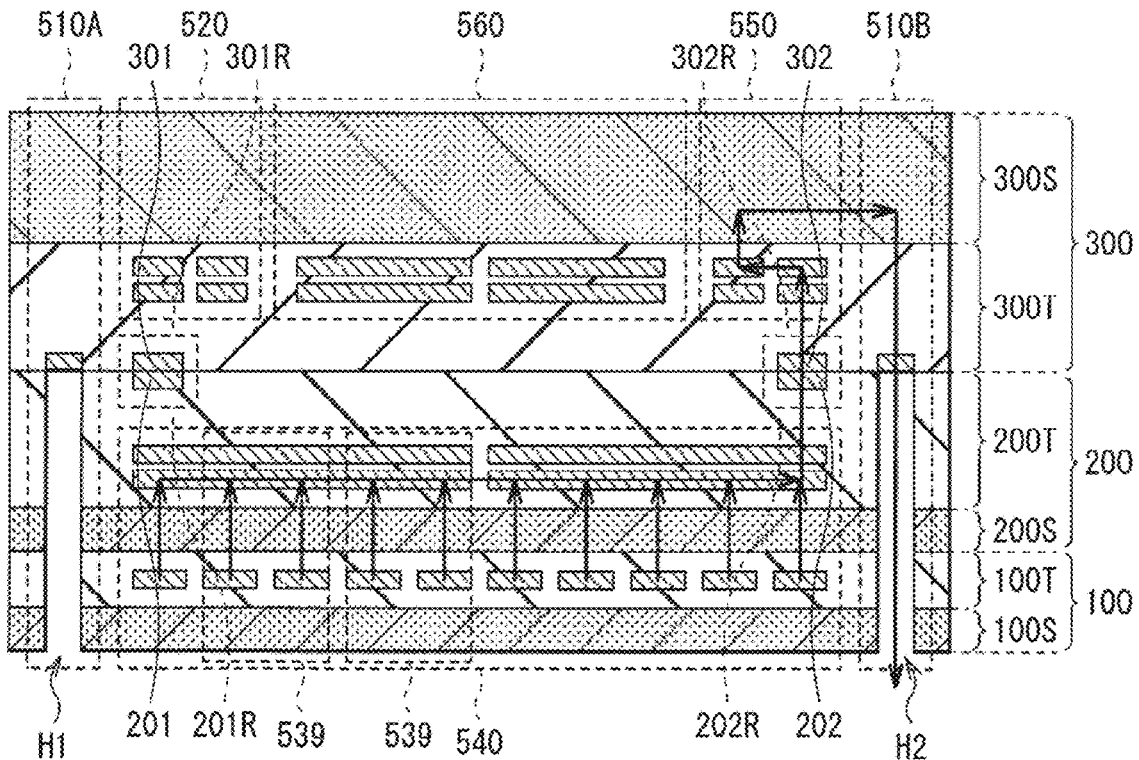
FIG. 14 is a schematic view illustrating a signal route of a pixel signal of the imaging device illustrated in FIG. 3.

Next, operations of the imaging device 1 will be described with reference to FIGS. 13 and 14. FIGS. 13 and 14 are diagrams having arrows representing routes of individual signals added to FIG. 3. In FIG. 13, routes of an input signal input to the imaging device 1 from the outside and routes of a power supply potential and a reference potential are indicated by arrows. In FIG. 14, a signal route regarding a pixel signal output from the imaging device 1 to the outside is indicated by arrows. For example, an input signal (for example, a pixel clock and a synchronization signal) input to the imaging device 1 via the input unit 510A is transmitted to the row drive unit 520 of the third substrate 300 to allow the row drive unit 520 to generate a row drive signal. The row drive signal is sent to the second substrate 200 via the contact portions 301 and 201. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D (FIG. 13). Furthermore, the power supply potential and the reference potential supplied from the outside of the imaging device 1 to the input unit 510A (input terminal 511) of the third substrate 300 are sent to the second substrate 200 via the contact portions 301 and 201, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539 via the through-substrate electrode 120E. The pixel signal based on this pixel signal is sent from the pixel circuit 210 to the third substrate 300 via the vertical signal line 543 and the contact portions 202 and 302. This pixel signal is processed by the column signal processing unit 550 and the image signal processing unit 560 of the third substrate 300, and then output to the outside via the output unit 510B.

[Effects]

In the present embodiment, the pixels 541A, 541B, 541C, and 541D (pixel sharing unit 539) and the pixel circuit 210 are provided on mutually different substrates (first substrate 100 and second substrate 200, respectively). With this configuration, the areas of the pixels 541A, 541B, 541C, and 541D and the pixel circuit 210 can be enlarged as compared with a case where the pixels 541A, 541B, 541C, and 541D and the pixel circuit 210 are formed on the same substrate. As a result, the amount of pixel signals obtained by photoelectric conversion can be increased, and transistor noise of the pixel circuit 210 can be reduced. This makes it possible to improve the signal/noise ratio of the pixel signal, enabling the imaging device 1 to output better pixel data (image information). In addition, it is possible to achieve miniaturization of the imaging device 1 (in other words, reduction of the pixel size and downsizing of the imaging device 1). By reducing the pixel size, the imaging device 1 can increase the number of pixels per unit area and can output a high-quality image.

Furthermore, in the imaging device 1, the first substrate 100 and the second substrate 200 are electrically connected to each other by the through-substrate electrodes 120E and 121E provided in the insulating region 212. For example, there is a conceivable method of connecting the first substrate 100 and the second substrate 200 by bonding pad electrodes to each other, or a method of connecting the first substrate 100 and the second substrate 200 by through-substrate wiring (for example, through Si via (TSV)) penetrating the semiconductor layer. As compared with such a method, by providing the through-substrate electrodes 120E and 121E in the insulating region 212, it is possible to decrease the area required for connecting the first substrate 100 and the second substrate 200 to each other. This configuration makes it possible to reduce the pixel size and further downsize the imaging device 1. Furthermore, further miniaturization of the area per pixel leads to achievement of higher resolution. When there is no need to reduce the chip size, the formation region of the pixels 541A, 541B, 541C, and 541D and the pixel circuit 210 can be enlarged. As a result, the amount of pixel signals obtained by photoelectric conversion can be increased, with reduction of the noise of the transistor included in the pixel circuit 210. This makes it possible to improve the signal/noise ratio of the pixel signal, enabling the imaging device 1 to output better pixel data (image information).

Furthermore, in the imaging device 1, the pixel circuit 210 is provided on a substrate (the second substrate 200) different from the substrate (the third substrate 300) on which the column signal processing unit 550 and the image signal processing unit 560 are provided. With this configuration, the area of the pixel circuit 210 and the areas of the column signal processing unit 550 and the image signal processing unit 560 can be enlarged as compared with the case where the pixel circuit 210 is formed on the same substrates as that for the column signal processing unit 550 and the image signal processing unit 560. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel array unit 540 is provided on the first substrate 100 and the second substrate 200, and the column signal processing unit 550 and the image signal processing unit 560 are provided on the third substrate 300. In addition, the contact portions 201, 202, 301, and 302 connecting the second substrate 200 and the third substrate 300 are formed above the pixel array unit 540. This enables flexible layout of the contact portions 201, 202, 301, and 302 without receiving layout interference from various wiring lines provided in the pixel array.

Accordingly, the contact portions 201, 202, 301, and 302 can be applied to electrical connection between the second substrate 200 and the third substrate 300. With application of the contact portions 201, 202, 301, 302, for example, the column signal processing unit 550 and the image signal processing unit 560 have a higher degree of freedom in layout. This makes it possible to reduce the noise generated in the column signal processing unit 550, enabling a further advanced image processing circuit to be mounted by using the image signal processing unit 560. This leads to improvement of the signal/noise ratio of the pixel signal, enabling the imaging device 1 to output better pixel data (image information).

Furthermore, in the imaging device 1, the pixel isolation portion 117 penetrates the semiconductor layer 100S. With this configuration, even when the distance between adjacent pixels (pixels 541A, 541B, 541C, and 541D) is reduced due to miniaturization of the area per pixel, it is possible to suppress color mixing among the pixels 541A, 541B, 541C, and 541D. This makes it possible to improve the signal/noise ratio of the pixel signal, enabling the imaging device 1 to output better pixel data (image information).

Furthermore, the imaging device 1 includes the pixel circuit 210 for each of the pixel sharing units 539. With this configuration, as compared with a case where the pixel circuit 210 is provided in each of the pixels 541A, 541B, 541C, and 541D, it is possible to increase the formation region of the transistors (amplification transistor AMP, reset transistor RST, selection transistor SEL, FD conversion gain switching transistor FDG) constituting the pixel circuit 210. For example, increasing the formation region of the amplification transistor AMP can suppress noise. This makes it possible to improve the signal/noise ratio of the pixel signal, enabling the imaging device 1 to output better pixel data (image information).

Furthermore, in the imaging device 1, the pad portion 120 that electrically connects the floating diffusion FD (floating diffusion FD1, FD2, FD3, and FD4) of the four pixels (pixels 541A, 541B, 541C, and 541D) is provided on the first substrate 100. With this configuration, it is possible to decrease the number of through-substrate electrodes (through-substrate electrodes 120E) connecting the first substrate 100 and the second substrate 200 to each other as compared with the case where the pad portion 120 is provided on the second substrate 200. This makes it possible to reduce the size the insulating region 212 and ensure a sufficient size of the transistor formation region (semiconductor layer 200S) constituting the pixel circuit 210. This makes it possible reduce the noise of the transistor included in the pixel circuit 210, leading to improvement in the signal/noise ratio of the pixel signal, enabling the imaging device 1 to output better pixel data (image information).

Hereinafter, modifications of the imaging device 1 according to the above embodiment will be described. In the following modifications, the same reference numerals are given to the same configurations as those of the above embodiment.

2. First Modification

Figure 15:
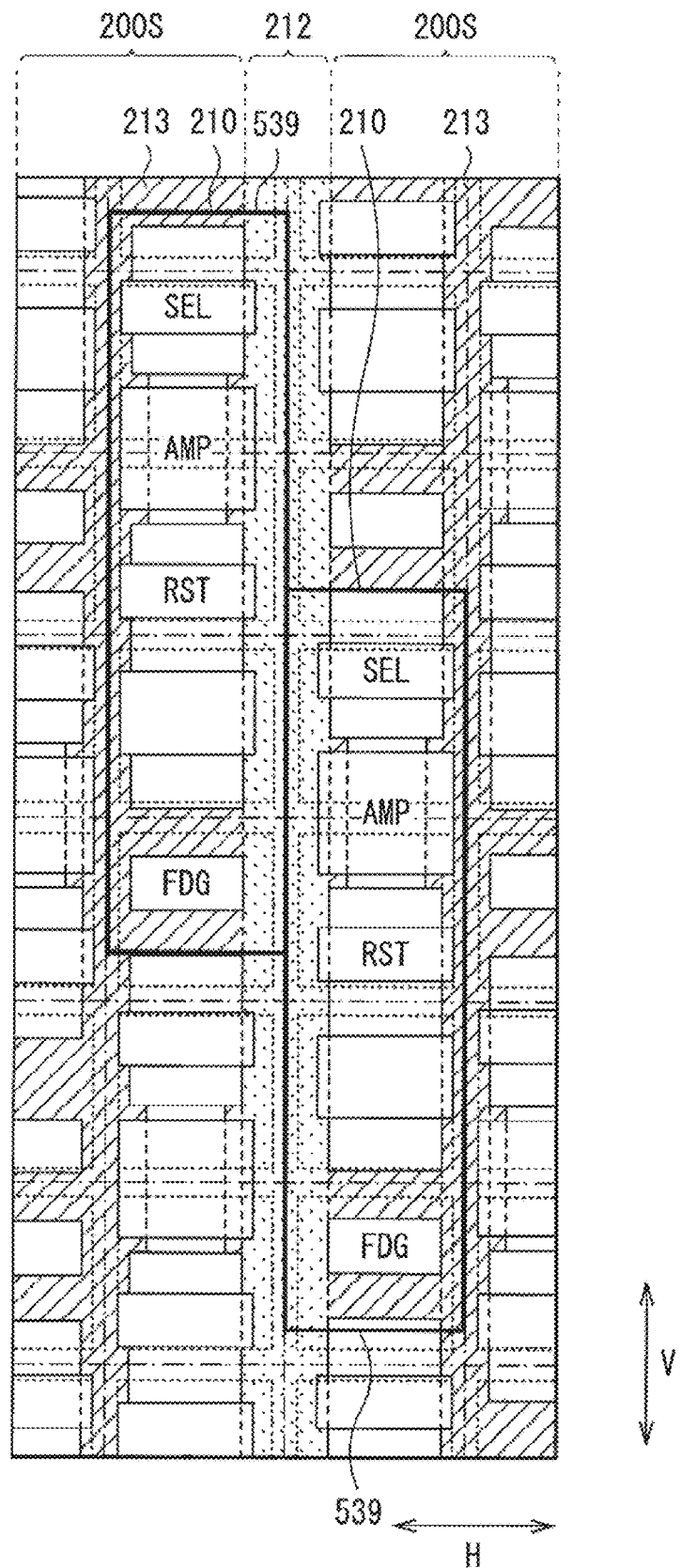
FIG. 15 is a schematic view illustrating a modification of the planar configuration of the second substrate (semiconductor layer) illustrated in FIG. 8.
Figure 16:
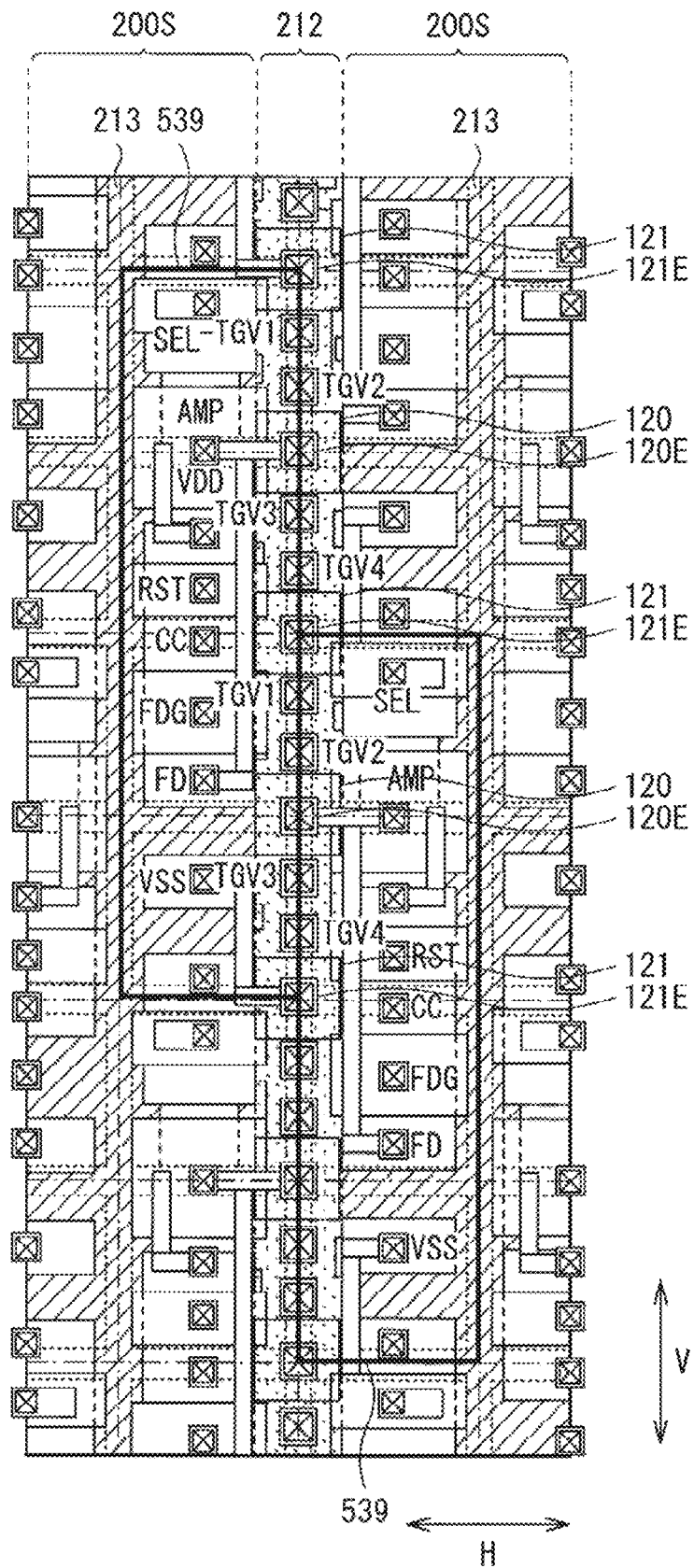
FIG. 16 is a schematic view illustrating a planar configuration of a main part of the first wiring layer and the first substrate together with a pixel circuit illustrated in FIG. 15.
Figure 17:
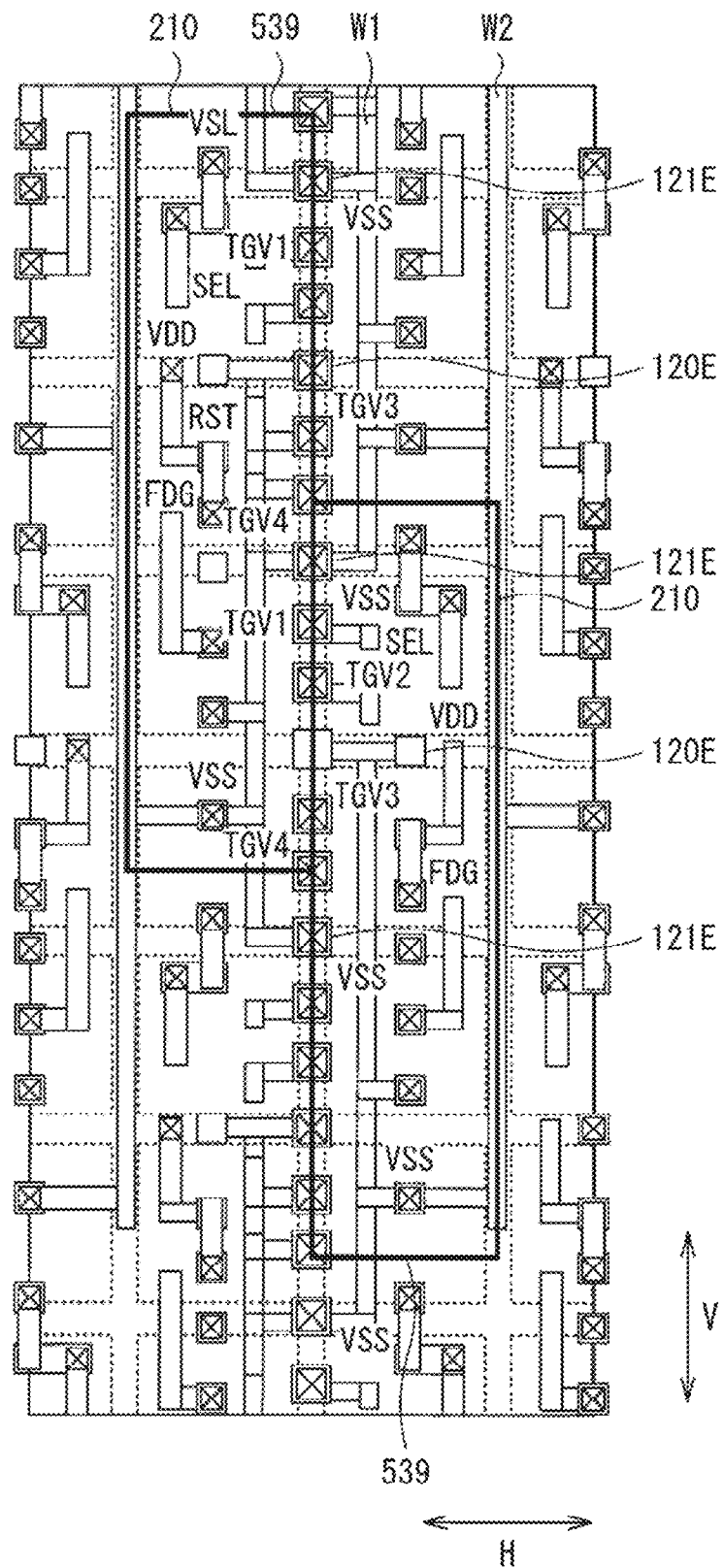
FIG. 17 is a schematic view illustrating an example of a planar configuration of the second wiring layer together with the first wiring layer illustrated in FIG. 16.
Figure 18:
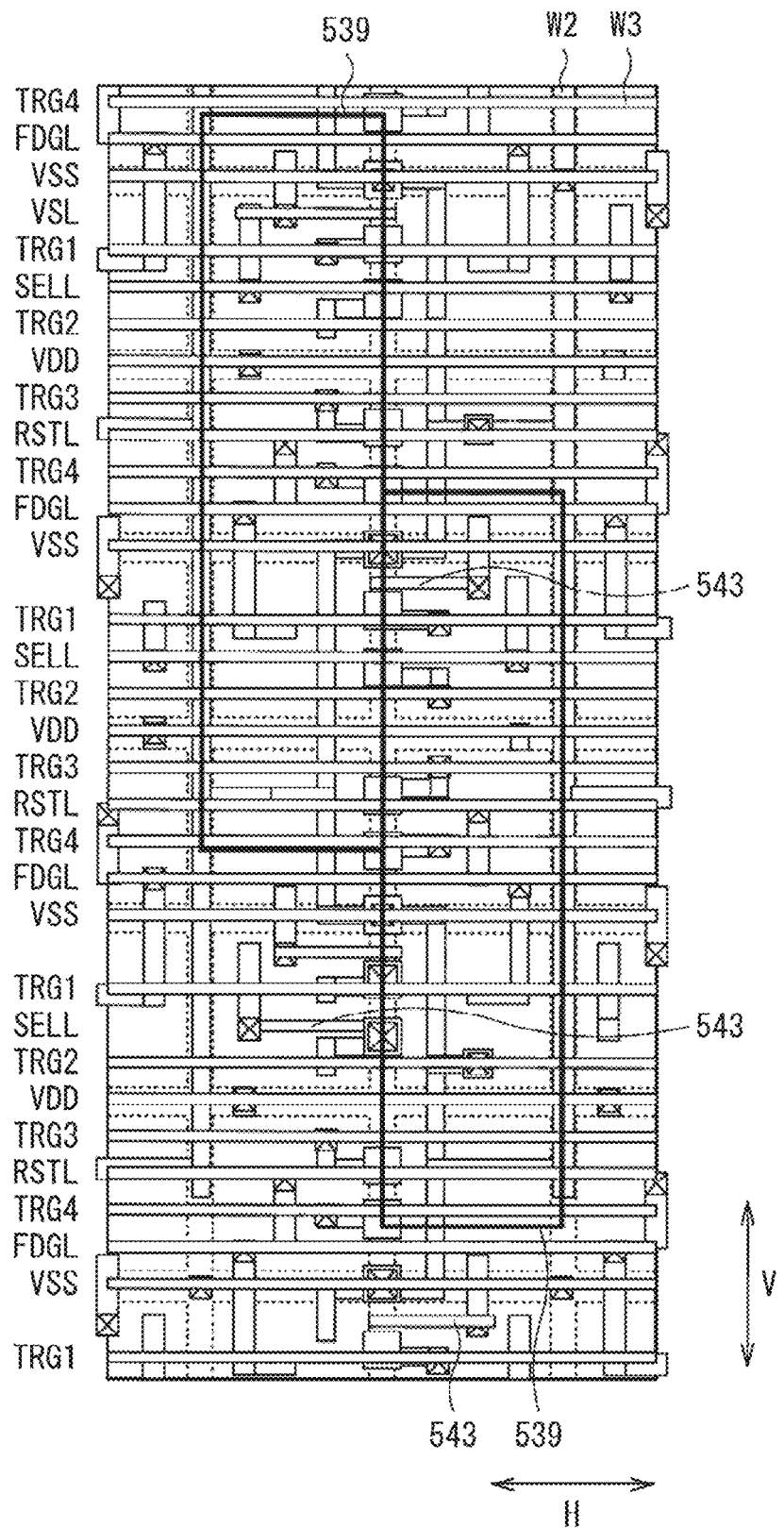
FIG. 18 is a schematic view illustrating an example of a planar configuration of the third wiring layer together with the second wiring layer illustrated in FIG. 17.
Figure 19:
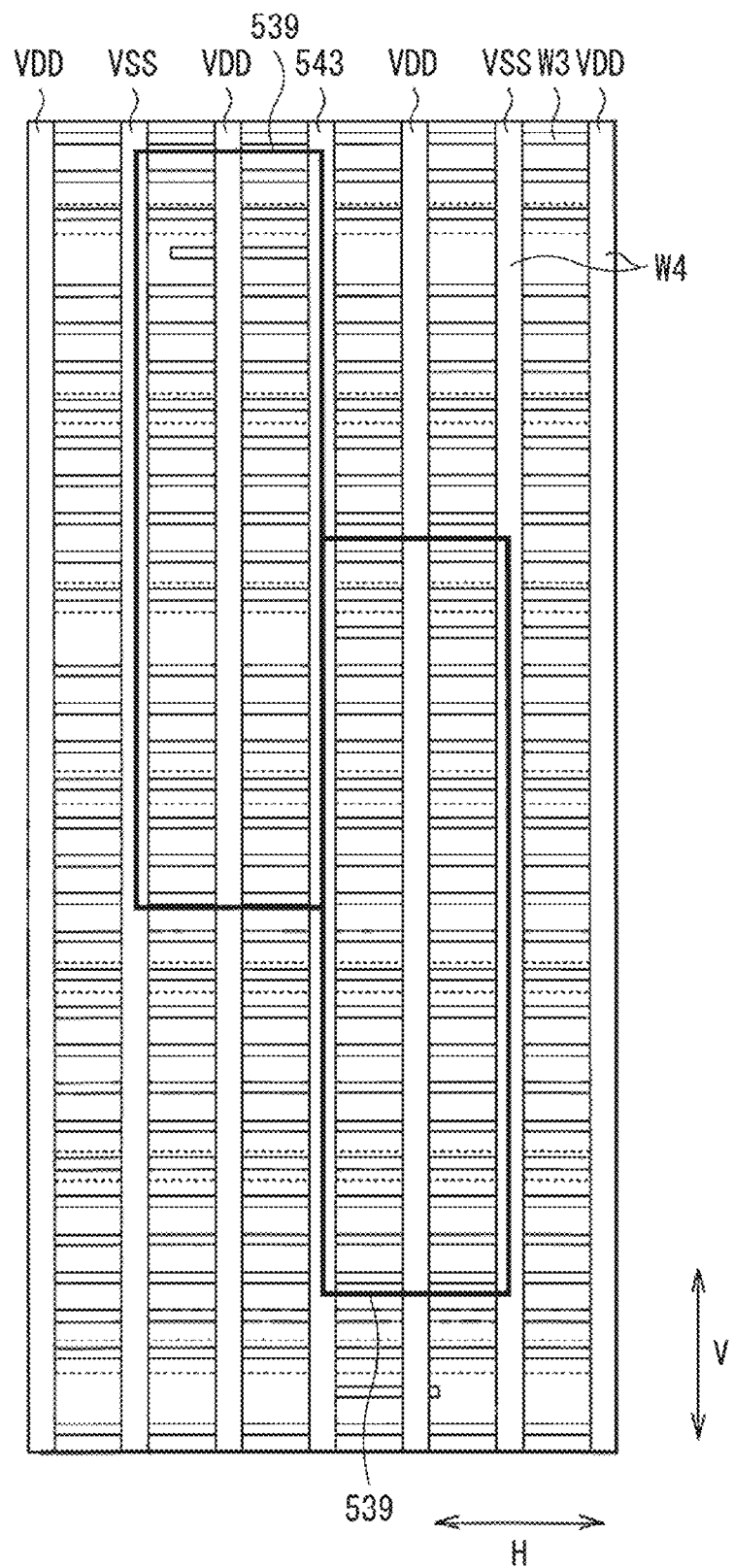
FIG. 19 is a schematic view illustrating an example of a planar configuration of the fourth wiring layer together with the third wiring layer illustrated in FIG. 18.

FIGS. 15 to 19 illustrate a modification of the planar configuration of the imaging device 1 according to the above embodiment. FIG. 15 schematically illustrates a planar configuration in the vicinity of the front surface of the semiconductor layer 200S of the second substrate 200, and corresponds to FIG. 8 described in the above embodiment. FIG. 16 schematically illustrates a configuration of each of portions of the first wiring layer W1, the semiconductor layer 200S connected to the first wiring layer W1, and the first substrate 100, and corresponds to FIG. 9 described in the above embodiment. FIG. 17 illustrates an example of a planar configuration of the first wiring layer W1 and the second wiring layer W2, and corresponds to FIG. 10 described in the above embodiment. FIG. 18 illustrates an example of a planar configuration of the second wiring layer W2 and the third wiring layer W3, and corresponds to FIG. 11 described in the above embodiment. FIG. 19 illustrates an example of a planar configuration of the third wiring layer W3 and the fourth wiring layer W4, and corresponds to FIG. 12 described in the above embodiment.

As illustrated in FIG. 16, the present modification has a configuration in which the internal layout of one pixel sharing unit 539 (for example, one on the right side in the drawing) among the two pixel sharing units 539 arranged in the H direction on the second substrate 200 is obtained by inverting the internal layout of the other pixel sharing unit 539 (for example, one on the left side in the drawing) only in the H direction. In addition, the shift in the V direction between the outline of one pixel sharing unit 539 and the outline of the other pixel sharing unit 539 is larger than the shift described in the above embodiment (FIG. 9). In this manner, with a larger shift in the V direction, it is possible to shorten the distance between the amplification transistor AMP of the other pixel sharing unit 539 and the connected pad portion 120 (the pad portion 120 of the other pixel sharing units 539 (one on lower side of the drawing) of the two pixel sharing units 539 arranged in the V direction illustrated in FIGS. 7A and 7B). With such a layout, the first modification of the imaging device 1 illustrated in FIGS. 15 to 19 can achieve the area of the planar layout of the two pixel sharing units 539 arranged in the H direction the same as the area of the pixel sharing unit 539 of the second substrate 200 described in the above embodiment without mutually inverting the planar layout of the two pixel sharing units 539 in the V direction. Note that the planar layout of the pixel sharing unit 539 of the first substrate 100 is the same as the planar layout described in the above embodiment (FIGS. 7A and 7B). Therefore, the imaging device 1 of the present modification can obtain the effects similar to those of the imaging device 1 described in the above embodiment. The arrangement of the pixel sharing unit 539 of the second substrate 200 is not limited to the arrangement described in the above embodiment and the present modification.

3. Second Modification

Figure 20:
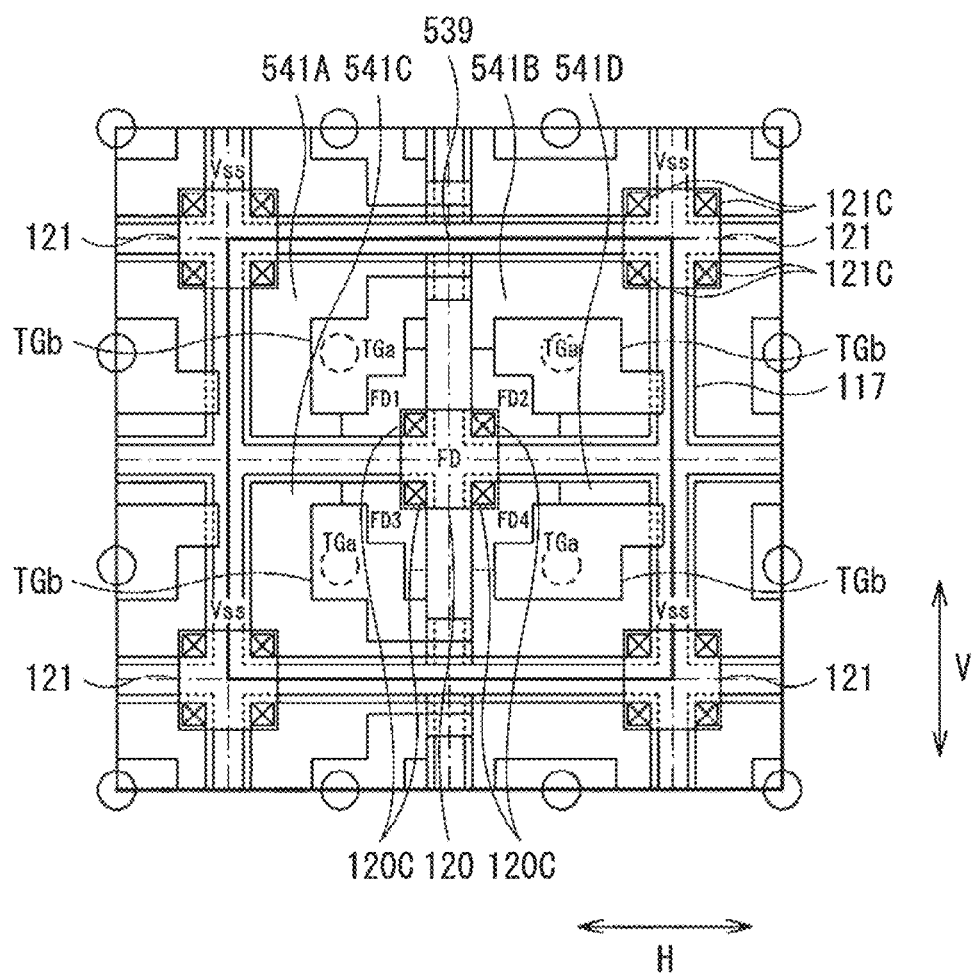
FIG. 20 is a schematic view illustrating a modification of the planar configuration of the first substrate illustrated in FIG. 7A.
Figure 21:
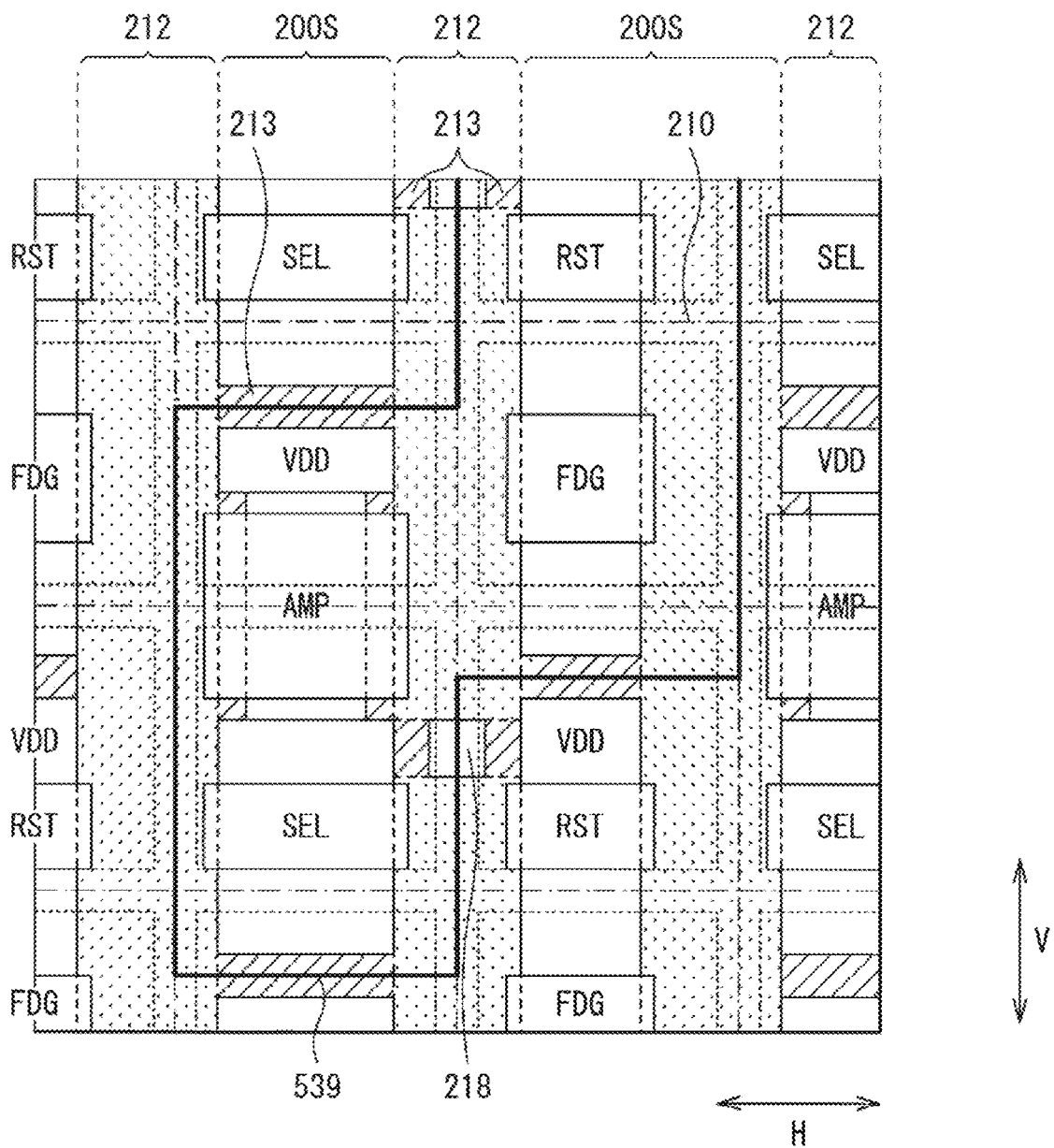
FIG. 21 is a schematic view illustrating an example of a planar configuration of the second substrate (semiconductor layer) stacked on the first substrate illustrated in FIG. 20.
Figure 22:
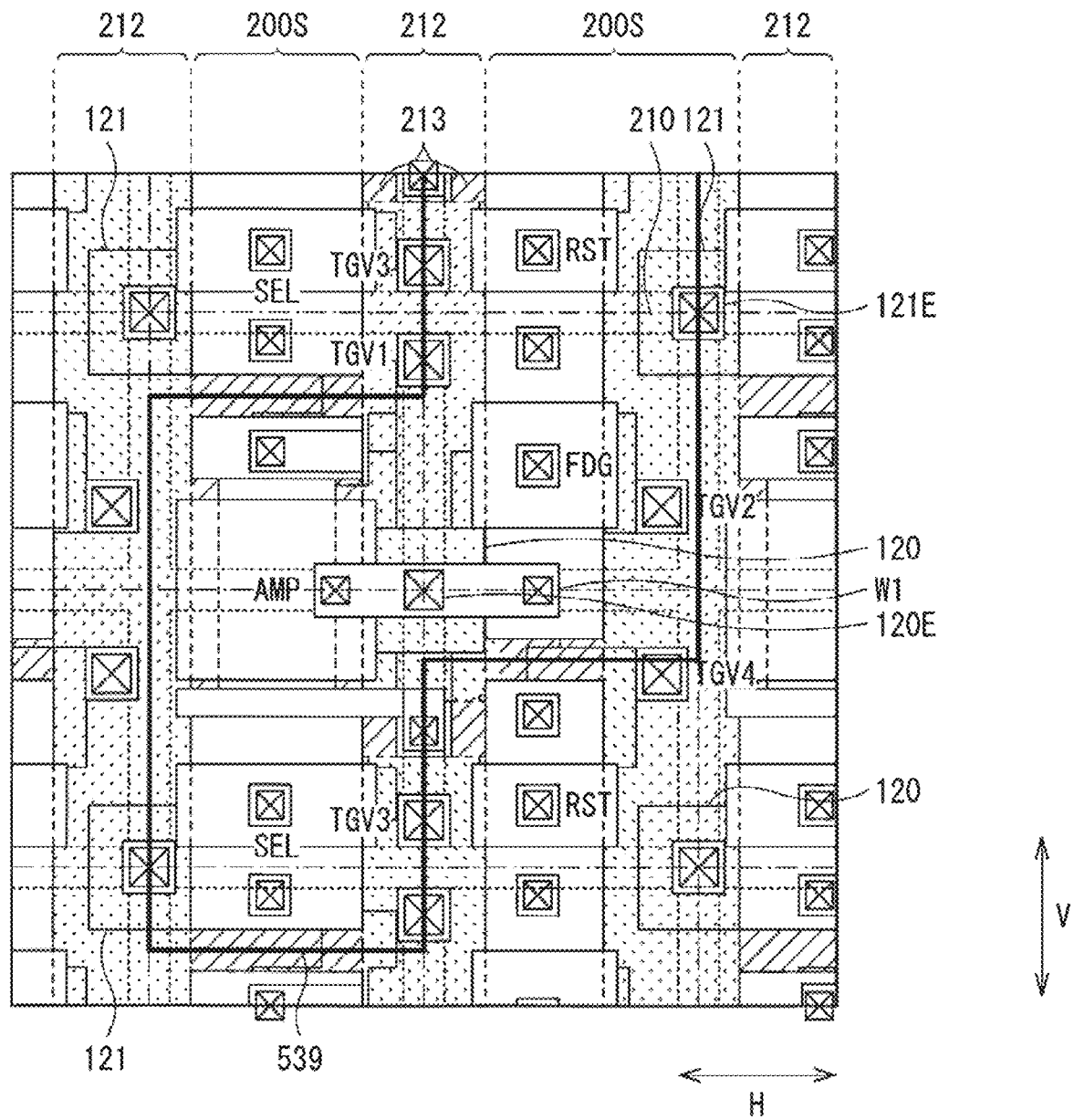
FIG. 22 is a schematic view illustrating an example of a planar configuration of the first wiring layer together with the pixel circuit illustrated in FIG. 21.
Figure 23:
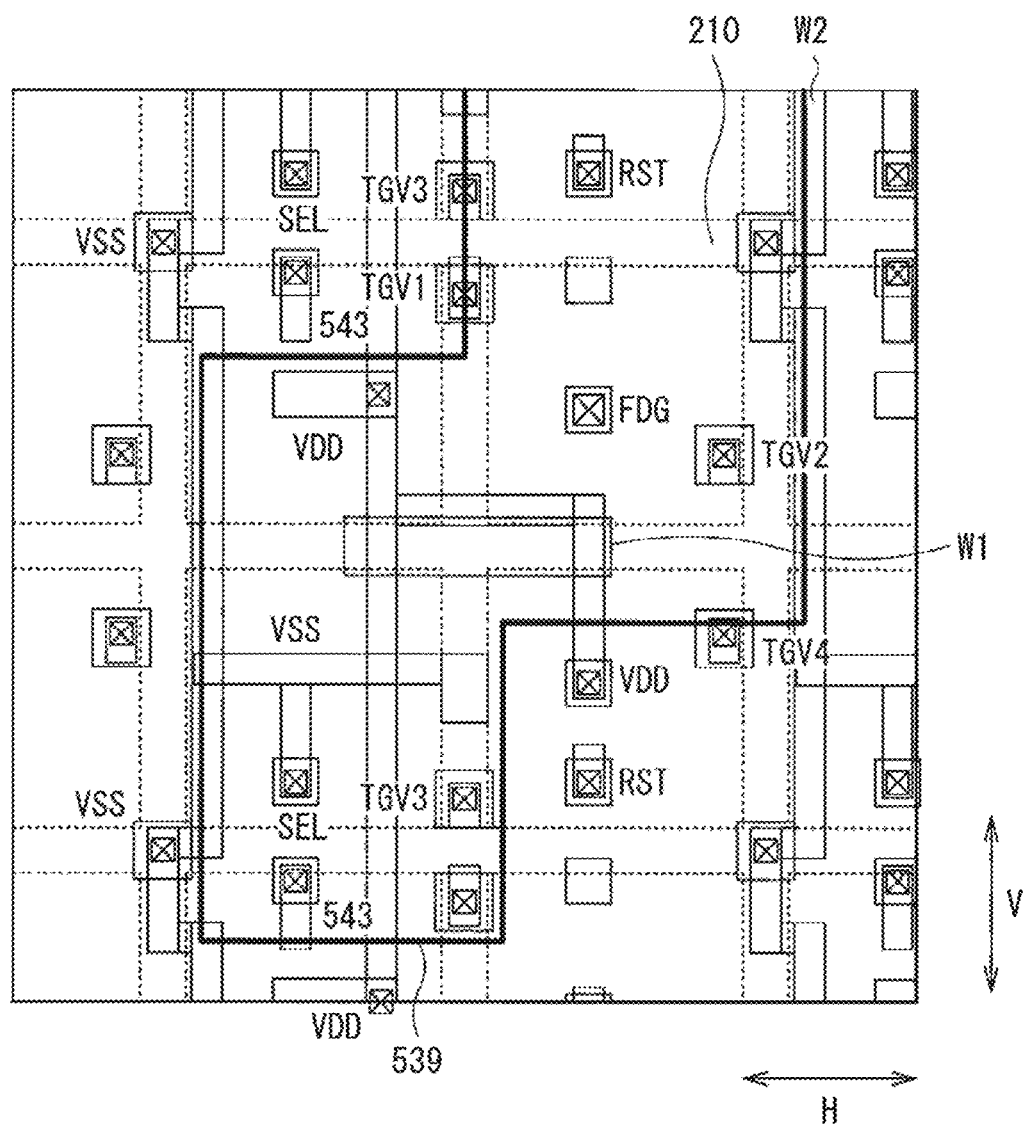
FIG. 23 is a schematic view illustrating an example of a planar configuration of the second wiring layer together with the first wiring layer illustrated in FIG. 22.
Figure 24:
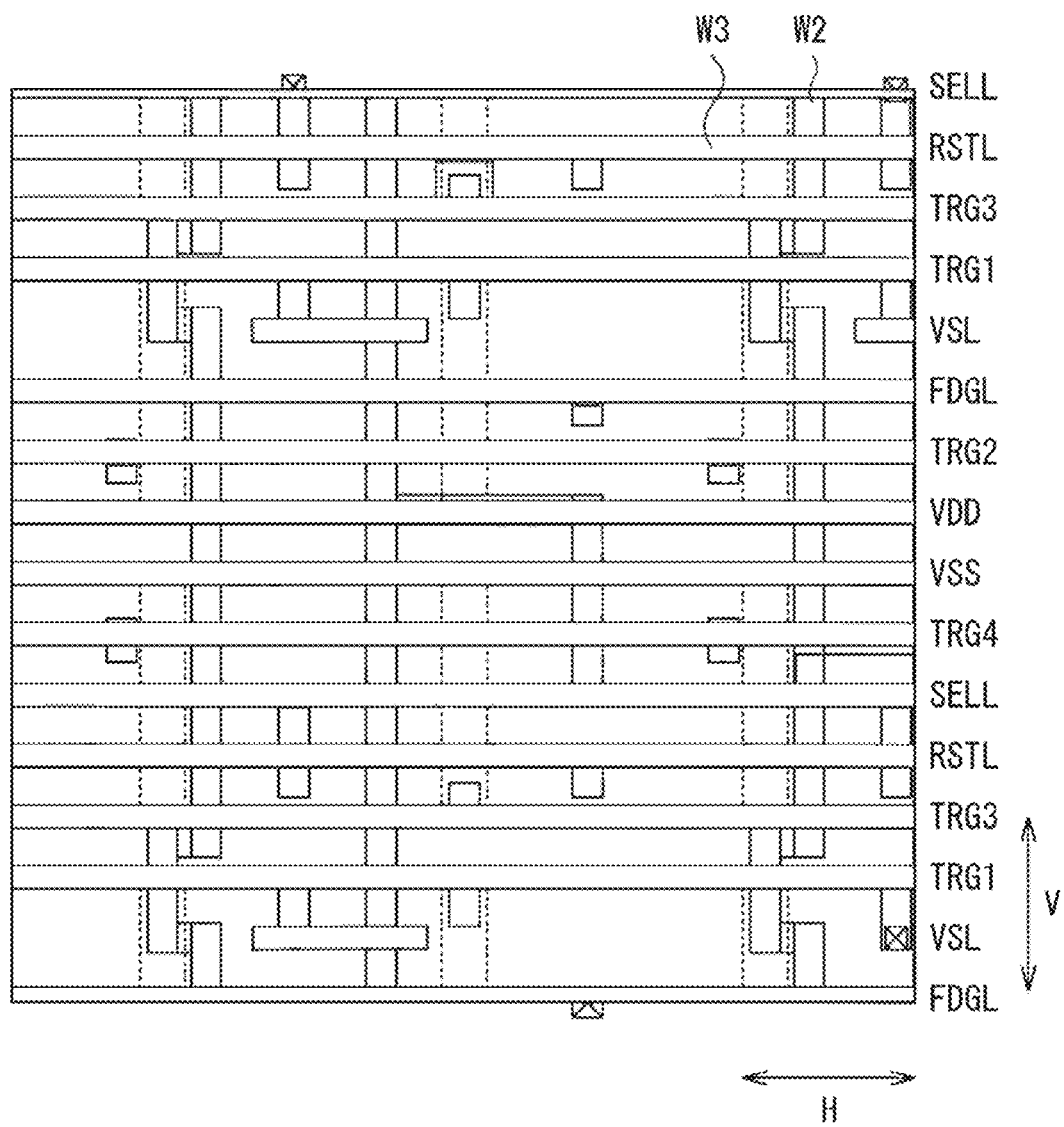
FIG. 24 is a schematic view illustrating an example of a planar configuration of the third wiring layer together with the second wiring layer illustrated in FIG. 23.
Figure 25:
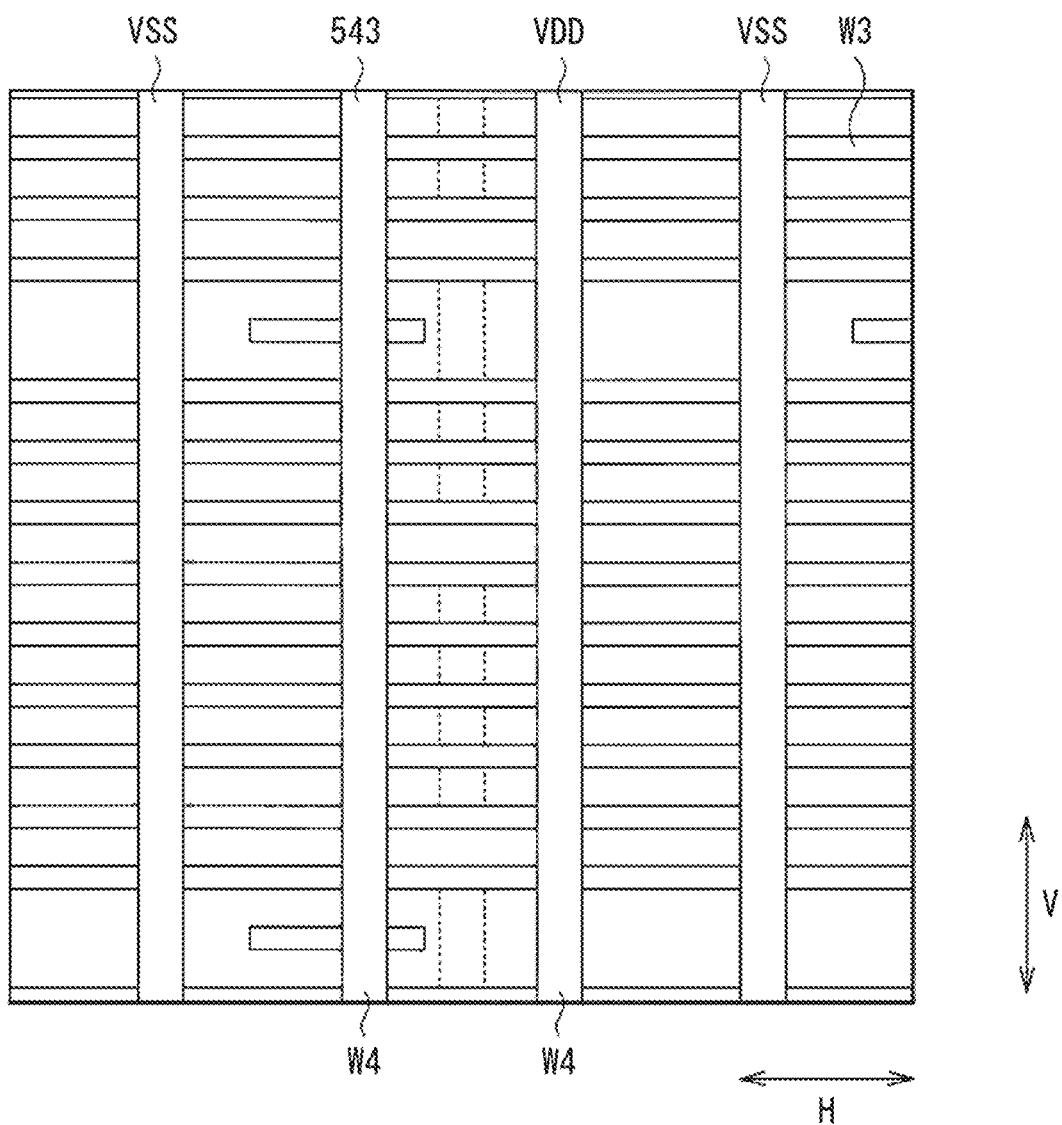
FIG. 25 is a schematic view illustrating an example of a planar configuration of the fourth wiring layer together with the third wiring layer illustrated in FIG. 24.

FIGS. 20 to 25 illustrate a modification of the planar configuration of the imaging device 1 according to the above embodiment. FIG. 20 schematically illustrates a planar configuration of the first substrate 100, and corresponds to FIG. 7A described in the above embodiment. FIG. 21 schematically illustrates a planar configuration in the vicinity of the front surface of the semiconductor layer 200S of the second substrate 200, and corresponds to FIG. 8 described in the above embodiment. FIG. 22 schematically illustrates a configuration of each of portions of the first wiring layer W1, the semiconductor layer 200S connected to the first wiring layer W1, and the first substrate 100, and corresponds to FIG. 9 described in the above embodiment. FIG. 23 illustrates an example of a planar configuration of the first wiring layer W1 and the second wiring layer W2, and corresponds to FIG. 10 described in the above embodiment. FIG. 24 illustrates an example of a planar configuration of the second wiring layer W2 and the third wiring layer W3, and corresponds to FIG. 11 described in the above embodiment. FIG. 25 illustrates an example of a planar configuration of the third wiring layer W3 and the fourth wiring layer W4, and corresponds to FIG. 12 described in the above embodiment.

In the present modification, the outer shape of each of the pixel circuits 210 has a substantially square planar shape (FIG. 21 and the like). In this respect, the planar configuration of the imaging device 1 of the present modification is different from the planar configuration of the imaging device 1 described in the above embodiment.

For example, the pixel sharing unit 539 of the first substrate 100 is formed over a pixel region of 2 rows×2 columns, and has a substantially square planar shape (FIG. 20), similarly to the description in the above embodiment. For example, in each of the pixel sharing units 539, the horizontal portions TGb of the transfer gates TG1 and TG3 of the respective pixel 541A and the pixel 541C of one pixel column extend in the direction from a position overlapping the vertical portion TGa toward the central portion of the pixel sharing unit 539 in the H direction (more specifically, a direction toward the outer edges of the pixels 541A and 541C and a direction toward the central portion of the pixel sharing unit 539), while the horizontal portions TGb of the transfer gates TG2 and TG4 of the respective pixel 541B and the pixel 541D of the other pixel column extend in the direction from a position overlapping the vertical portion TGa toward the outer side of the pixel sharing unit 539 in the H direction (more specifically, a direction toward the outer edges of the pixels 541B and 541D and a direction toward the outer side of the pixel sharing unit 539). The pad portion 120 connected to the floating diffusion FD is provided at a central portion of the pixel sharing unit 539 (a central portion of the pixel sharing unit 539 in the H direction and the V direction), while the pad portion 121 connected to the VSS contact region 118 is provided at an end of the pixel sharing unit 539 at least in the H direction (in the H direction and the V direction in FIG. 20).

As another arrangement example, it is also conceivable to provide the horizontal portions TGb of the transfer gates TG1, TG2, TG3, and TG4 only in a region facing the vertical portion TGa. At this time, the semiconductor layer 200S is likely to be divided into a large number of pieces similarly to the description in the above embodiment. This would make it difficult to enlarge the transistors of the pixel circuit 210. On the other hand, when the horizontal portions TGb of the transfer gates TG1, TG2, TG3, and TG4 are extended in the H direction from the position overlapping the vertical portion TGa as in the above modification, the width of the semiconductor layer 200S can be increased as described similarly to the description in the above embodiment. Specifically, the positions in the H direction of the through-substrate electrodes TGV1 and TGV3 respectively connected to the transfer gates TG1 and TG3 can be arranged close to the position in the H direction of the through-substrate electrode 120E, while the positions in the H direction of the through-substrate electrodes TGV2 and TGV4 respectively connected to the transfer gates TG2 and TG4 can be arranged close to the position in the H direction of the through-substrate electrode 121E (FIG. 22). This configuration can increase the width (size in the H direction) of the semiconductor layer 200S extending in the V direction similarly to the description in the above embodiment. This makes it possible to increase the size of the transistors of the pixel circuit 210, particularly, the size of the amplification transistor AMP. As a result, the signal/noise ratio of the pixel signal can be improved, enabling the imaging device 1 to output better pixel data (image information).

The pixel sharing unit 539 of the second substrate 200 has substantially the same size as that of the pixel sharing unit 539 of the first substrate 100 in the H direction and the V direction, for example, and is provided over a region corresponding to a pixel region of approximately 2 rows×2 columns, for example. For example, in each of the pixel circuits 210, the selection transistor SEL and the amplification transistor AMP are arranged side by side in the V direction in one semiconductor layer 200S extending in the V direction, while the FD conversion gain switching transistor FDG and the reset transistor RST are arranged side by side in the V direction in one semiconductor layer 200S extending in the V direction. The one semiconductor layer 200S including the selection transistor SEL and the amplification transistor AMP and the one semiconductor layer 200S including the FD conversion gain switching transistor FDG and the reset transistor RST are arranged in the H direction via the insulating region 212. The insulating region 212 extends in the V direction (FIG. 21).

Here, the outer shape of the pixel sharing unit 539 of the second substrate 200 will be described with reference to FIGS. 21 and 22. For example, the pixel sharing unit 539 of the first substrate 100 illustrated in FIG. 20 is connected to the amplification transistor AMP and the selection transistor SEL provided on one side of the pad portion 120 in the H direction (the left side of FIG. 22), and connected to the FD conversion gain switching transistor FDG and the reset transistor RST provided on the other side of the pad portion 120 in the H direction (the right side of FIG. 22). The outer shape of the pixel sharing unit 539 of the second substrate 200, including the amplification transistor AMP, the selection transistor SEL, the FD conversion gain switching transistor FDG, and the reset transistor RST, is determined by the following four outer edges.

A first outer edge is an outer edge of one end in the V direction of the semiconductor layer 200S including the selection transistor SEL and the amplification transistor AMP (end on the upper side of FIG. 22). The first outer edge is provided between the amplification transistor AMP included in the pixel sharing unit 539 and the selection transistor SEL included in the pixel sharing unit 539 adjacent to one side in the V direction of the pixel sharing unit 539 (the upper side of FIG. 22). More specifically, the first outer edge is provided at the central portion in the V direction of the element isolation region 213 between the amplification transistor AMP and the selection transistor SEL. A second outer edge is an outer edge of the other end in the V direction of the semiconductor layer 200S including the selection transistor SEL and the amplification transistor AMP (the lower end of FIG. 22). The second outer edge is provided between the selection transistor SEL included in the pixel sharing unit 539 and the amplification transistor AMP included in the pixel sharing unit 539 adjacent to the other side in the V direction of the pixel sharing unit 539 (the lower side of FIG. 22). More specifically, the second outer edge is provided at the central portion in the V direction of the element isolation region 213 between the selection transistor SEL and the amplification transistor AMP. A third outer edge is an outer edge of the other end in the V direction (the lower end of FIG. 22) of the semiconductor layer 200S including the reset transistor RST and the FD conversion gain switching transistor FDG. The third outer edge is provided between the FD conversion gain switching transistor FDG included in the pixel sharing unit 539 and the reset transistor RST included in the pixel sharing unit 539 adjacent to the other side in the V direction of the pixel sharing unit 539 (the lower side of FIG. 22). More specifically, the third outer edge is provided at the central portion in the V direction of the element isolation region 213 between the FD conversion gain switching transistor FDG and the reset transistor RST. A fourth outer edge is an outer edge of one end in the V direction of the semiconductor layer 200S including the reset transistor RST and the FD conversion gain switching transistor FDG (end on upper side of FIG. 22). The fourth outer edge is provided between the reset transistor RST included in the pixel sharing unit 539 and the FD conversion gain switching transistor FDG (not illustrated) included in the pixel sharing unit 539 adjacent to one side of the V direction the pixel sharing unit 539 (one on upper side of FIG. 22). More specifically, the fourth outer edge is provided at the central portion in the V direction of the element isolation region 213 (not illustrated) between the reset transistor RST and the FD conversion gain switching transistor FDG.

In the outer shape of the pixel sharing unit 539 of the second substrate 200 including such first, second, third, and fourth outer edges, the third and fourth outer edges are arranged to be shifted to one side in the V direction (in other words, offset to one side in the V direction) with respect to the first and second outer edges. By using such a layout, both the gate of the amplification transistor AMP and the source of the FD conversion gain switching transistor FDG can be disposed as close as possible to the pad portion 120. This makes it possible to reduce the area of the wiring connecting these, facilitating miniaturization of the imaging device 1. Note that the VSS contact region 218 is provided between the semiconductor layer 200S including the selection transistor SEL and the amplification transistor AMP and the semiconductor layer 200S including the reset transistor RST and the FD conversion gain switching transistor FDG. For example, the plurality of pixel circuits 210 has the same arrangement.

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification.

4. Third Modification

Figure 26:
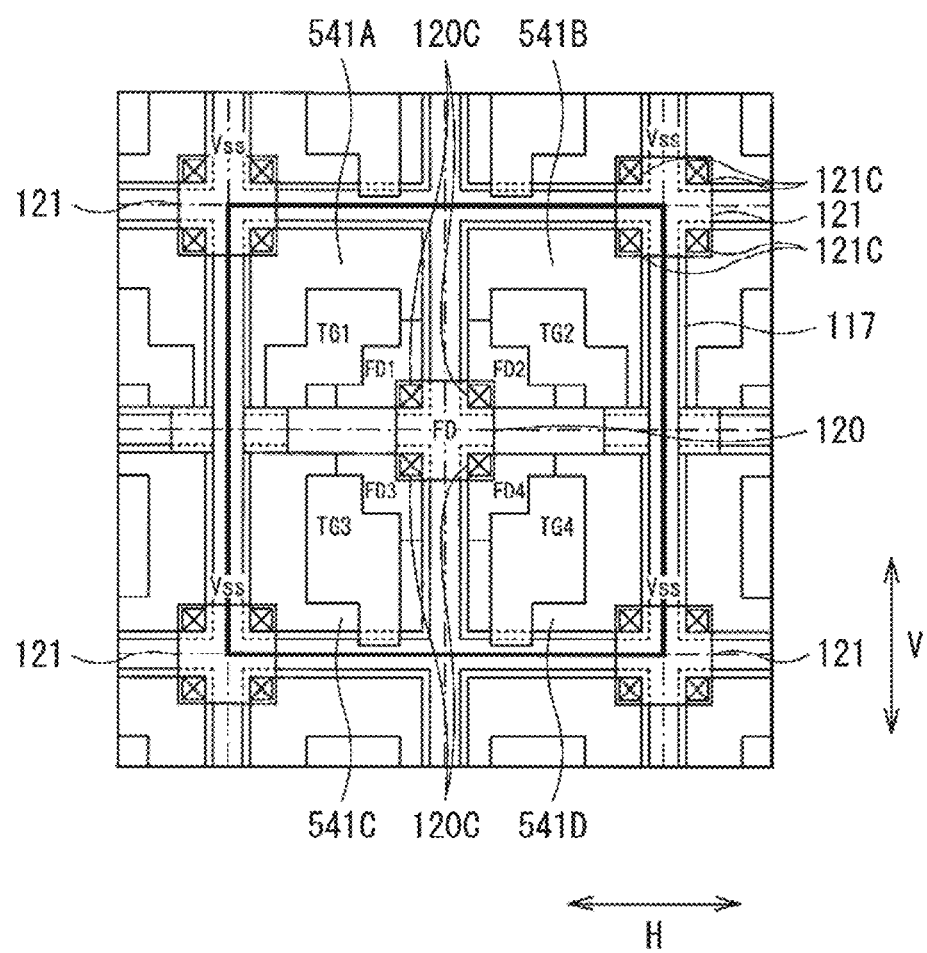
FIG. 26 is a schematic view illustrating another example of the planar configuration of the first substrate illustrated in FIG. 20.
Figure 27:
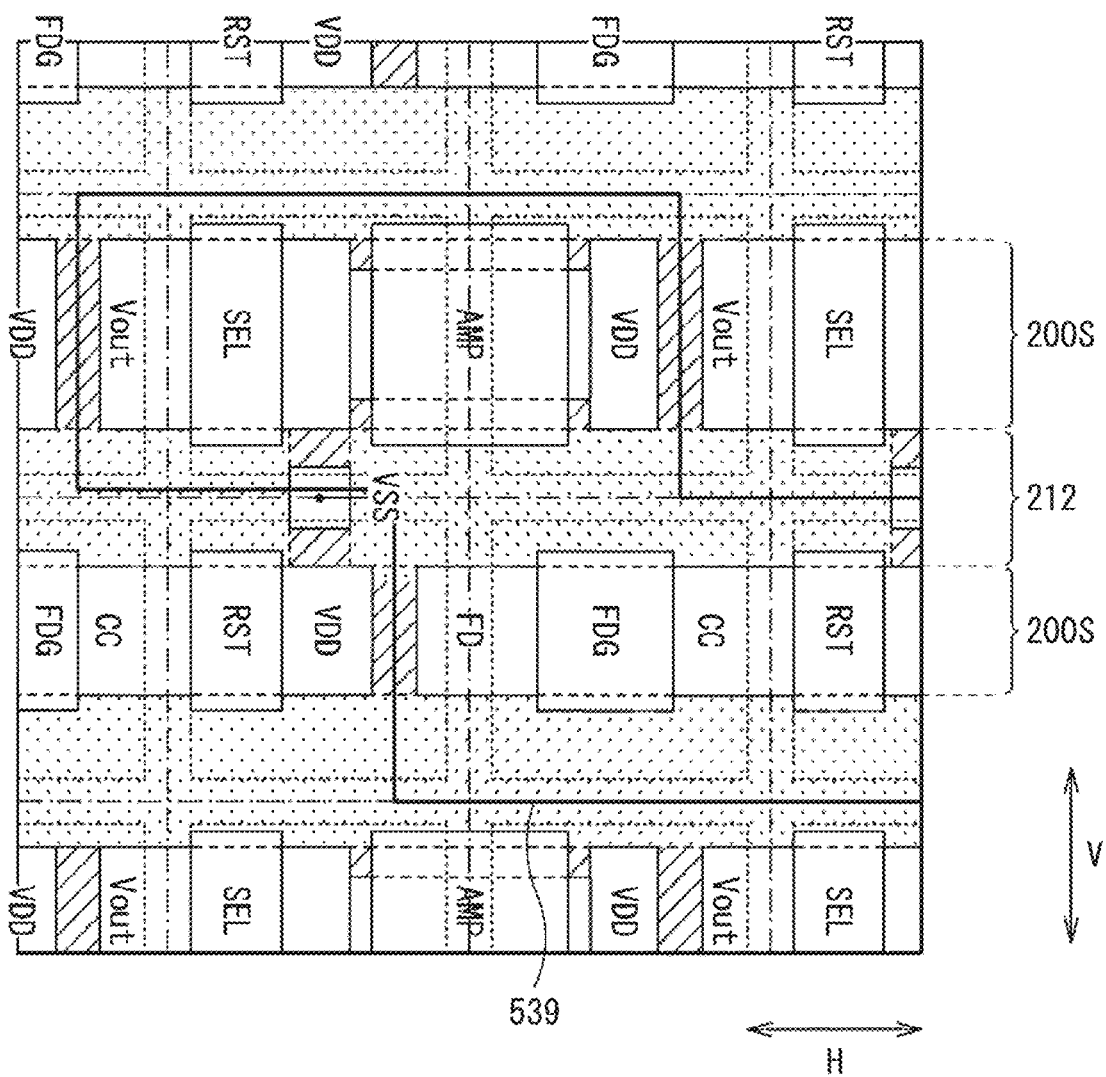
FIG. 27 is a schematic view illustrating an example of a planar configuration of the second substrate (semiconductor layer) stacked on the first substrate illustrated in FIG. 26.
Figure 28:
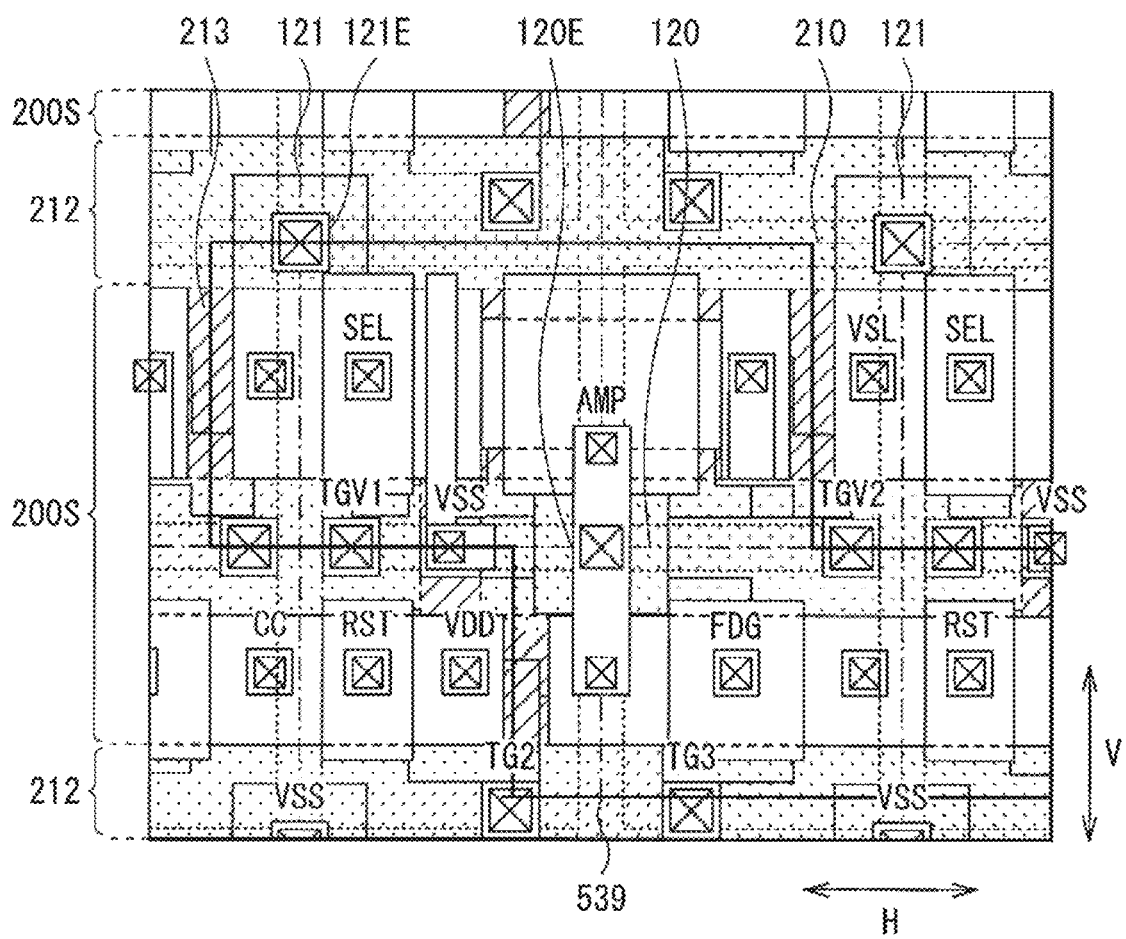
FIG. 28 is a schematic view illustrating an example of a planar configuration of the first wiring layer together with the pixel circuit illustrated in FIG. 27.
Figure 29:
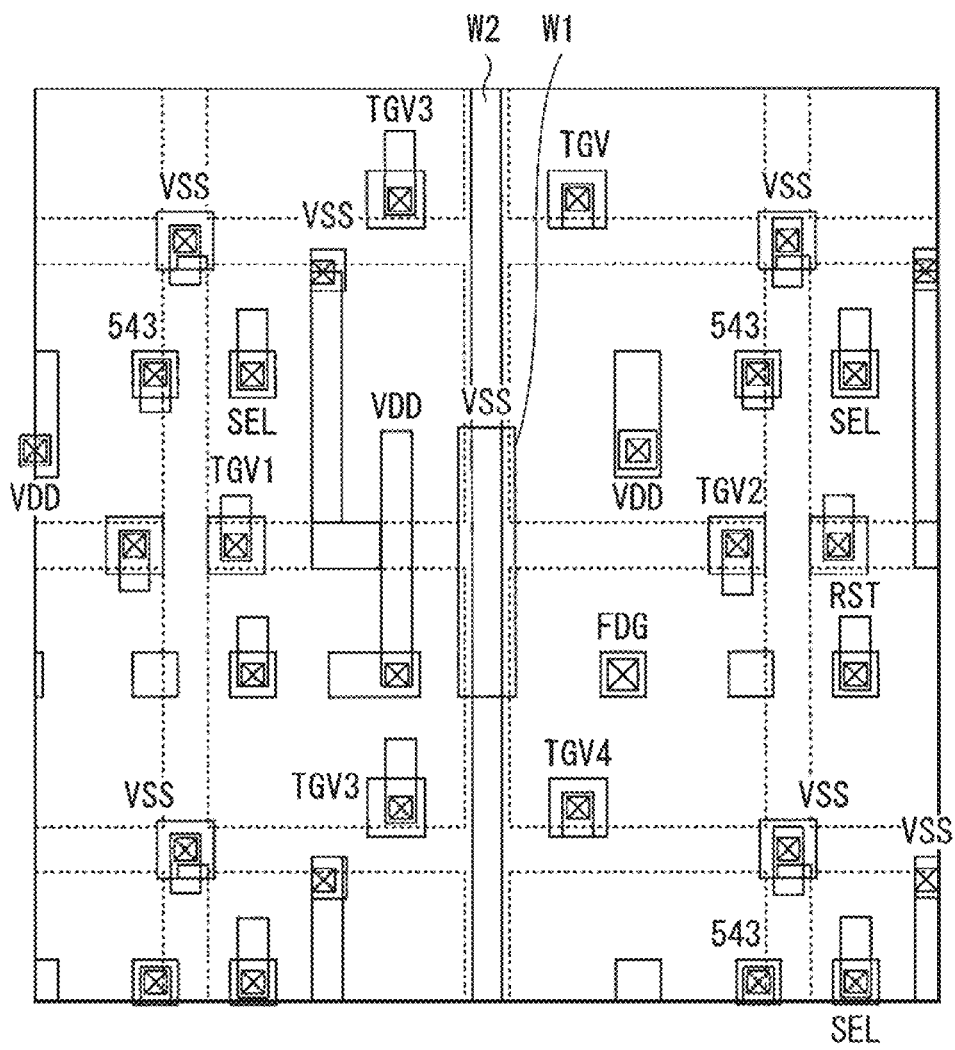
FIG. 29 is a schematic view illustrating an example of a planar configuration of the second wiring layer together with the first wiring layer illustrated in FIG. 28.
Figure 30:
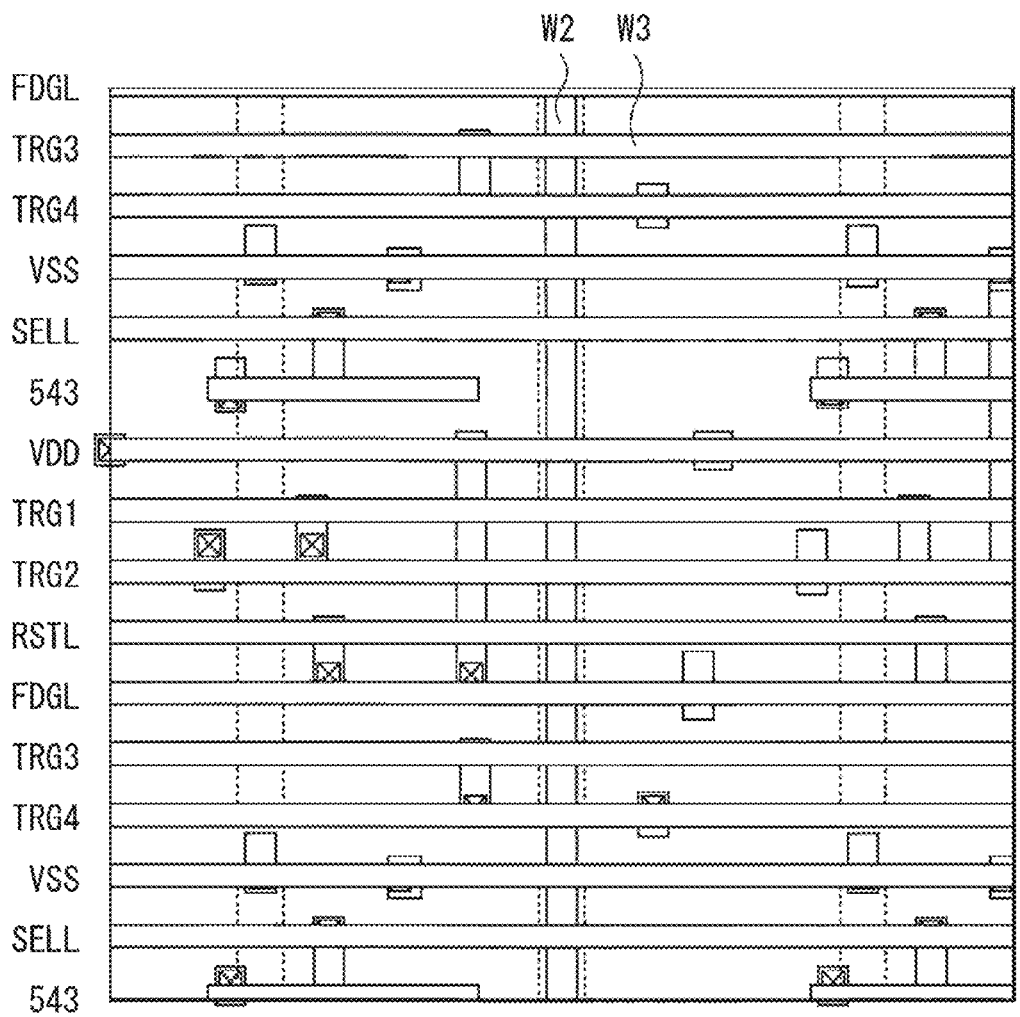
FIG. 30 is a schematic view illustrating an example of a planar configuration of the third wiring layer together with the second wiring layer illustrated in FIG. 29.
Figure 31:
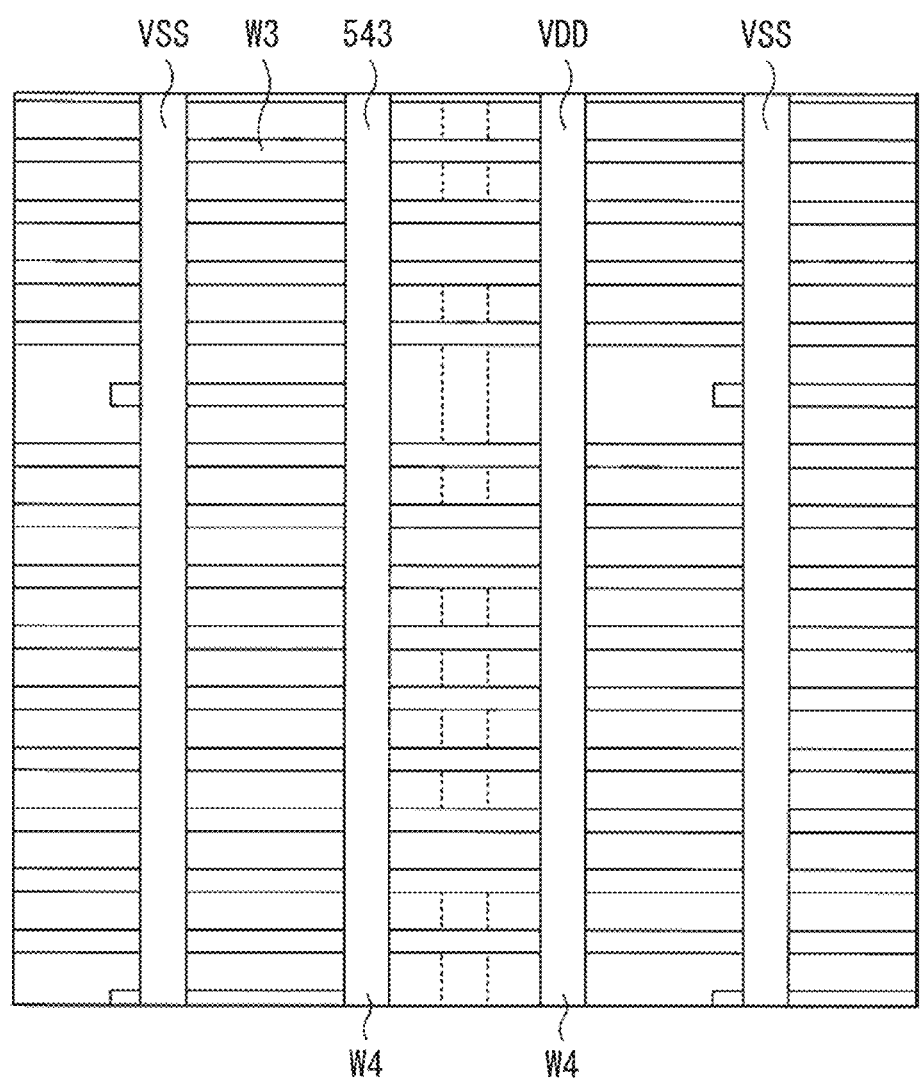
FIG. 31 is a schematic view illustrating an example of a planar configuration of the fourth wiring layer together with the third wiring layer illustrated in FIG. 30.

FIGS. 26 to 31 illustrate a modification of the planar configuration of the imaging device 1 according to the above embodiment. FIG. 26 schematically illustrates a planar configuration of first substrate 100, and corresponds to FIG. 7B described in the above embodiment. FIG. 27 schematically illustrates a planar configuration in the vicinity of the front surface of the semiconductor layer 200S of the second substrate 200, and corresponds to FIG. 8 described in the above embodiment. FIG. 28 schematically illustrates a configuration of each of portions of the first wiring layer W1, the semiconductor layer 200S connected to the first wiring layer W1, and the first substrate 100, and corresponds to FIG. 9 described in the above embodiment. FIG. 29 illustrates an example of a planar configuration of the first wiring layer W1 and the second wiring layer W2, and corresponds to FIG. 10 described in the above embodiment. FIG. 30 illustrates an example of a planar configuration of the second wiring layer W2 and the third wiring layer W3, and corresponds to FIG. 11 described in the above embodiment. FIG. 31 illustrates an example of a planar configuration of the third wiring layer W3 and the fourth wiring layer W4, and corresponds to FIG. 12 described in the above embodiment.

In the present modification, the semiconductor layer 200S of the second substrate 200 extends in the H direction (FIG. 28). That is, this configuration substantially corresponds to the configuration in which the planar configuration of the imaging device 1 illustrated in FIG. 21 and the like is rotated by 90 degrees.

For example, similarly to the description in the above embodiment, the pixel sharing unit 539 of the first substrate 100 is formed over a pixel region of 2 rows×2 columns, and has a substantially square planar shape (FIG. 26). For example, in each of the pixel sharing units 539, the transfer gates TG1 and TG2 of the respective pixel 541A and the pixel 541B of one pixel row extend toward the central portion of the pixel sharing unit 539 in the V direction, while the transfer gates TG3 and TG4 of the respective pixel 541C and the pixel 541D of the other pixel row extend in the outer direction of the pixel sharing unit 539 in the V direction. The pad portion 120 connected to the floating diffusion FD is provided at a central portion of the pixel sharing unit 539, while the pad portion 121 connected to the VSS contact region 118 is provided at an end of the pixel sharing unit 539 at least in the V direction (in the V direction and the H direction in FIG. 26). At this time, the positions in the V direction of the through-substrate electrodes TGV1 and TGV2 of the transfer gates TG1 and TG2 are closer to the positions in the V direction of the through-substrate electrode 120E, and the positions in the V direction of the through-substrate electrodes TGV3 and TGV4 of the transfer gates TG3 and TG4 are closer to the positions in the V direction of the through-substrate electrode 121E (FIG. 28). Therefore, the width (the size in the V direction) of the semiconductor layer 200S extending in the H direction can be increased for the reason similar to the description in the above embodiment. This makes it possible to increase the size of the amplification transistor AMP and suppress noise.

In each of the pixel circuits 210, the selection transistor SEL and the amplification transistor AMP are arranged side by side in the H direction, while the reset transistor RST is arranged at a position adjacent in the V direction with and interposed between the selection transistor SEL and the insulating region 212 (FIG. 27). The FD conversion gain switching transistor FDG is arranged side by side with the reset transistor RST in the H direction. The VSS contact region 218 is provided in an island shape in the insulating region 212. For example, the third wiring layer W3 extends in the H direction (FIG. 30), and the fourth wiring layer W4 extends in the V direction (FIG. 31).

The imaging device 1 including such a second substrate 200 can also obtain the effects similar to those described in the above embodiment. The arrangement of the pixel sharing unit 539 of the second substrate 200 is not limited to the arrangement described in the above embodiment and the present modification. For example, the semiconductor layer 200S described in the above embodiment and Modification 1 may extend in the H direction.

5. Fourth Modification

Figure 32:
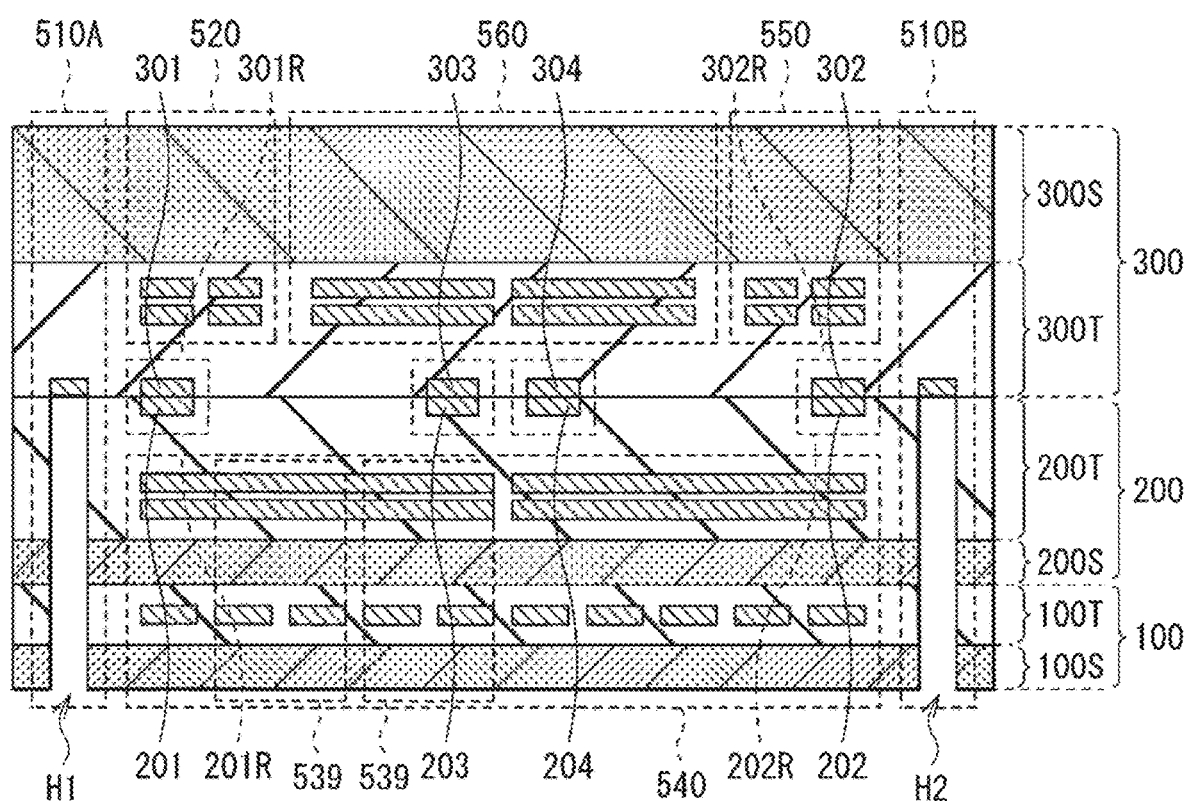
FIG. 32 is a schematic cross-sectional view illustrating another example of the imaging device illustrated in FIG. 3.

FIG. 32 schematically illustrates a modification of the cross-sectional configuration of imaging device 1 according to the exemplary embodiment. FIG. 32 corresponds to FIG. 3 described in the above embodiment. In the present modification, in addition to the contact portions 201, 202, 301, and 302, the imaging device 1 includes a contact portions 203, 204, 303, and 304 at facing positions at the central portion of the pixel array unit 540. In this respect, the imaging device 1 of the present modification is different from the imaging device 1 described in the above embodiment.

The contact portions 203 and 204 are provided on the second substrate 200, and are exposed on a bonding surface with the third substrate 300. The contact portions 303 and 304 are provided on the third substrate 300 and are exposed on a bonding surface with the second substrate 200. The contact portion 203 is in contact with the contact portion 303, while the contact portion 204 is in contact with the contact portion 304. That is, in the imaging device 1, the second substrate 200 and the third substrate 300 are connected by the contact portions 203, 204, 303, and 304 in addition to the contact portions 201, 202, 301, and 302.

Figure 33:
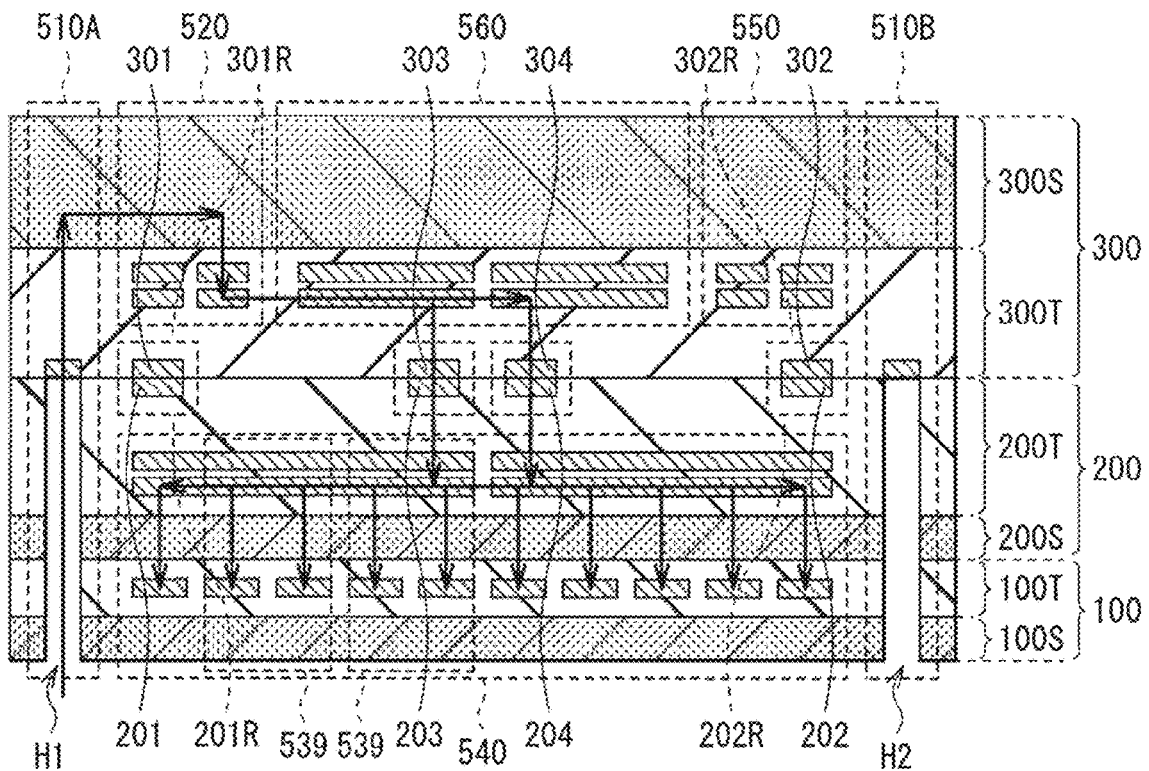
FIG. 33 is a schematic view illustrating a route of an input signal to the imaging device illustrated in FIG. 32.
Figure 34:
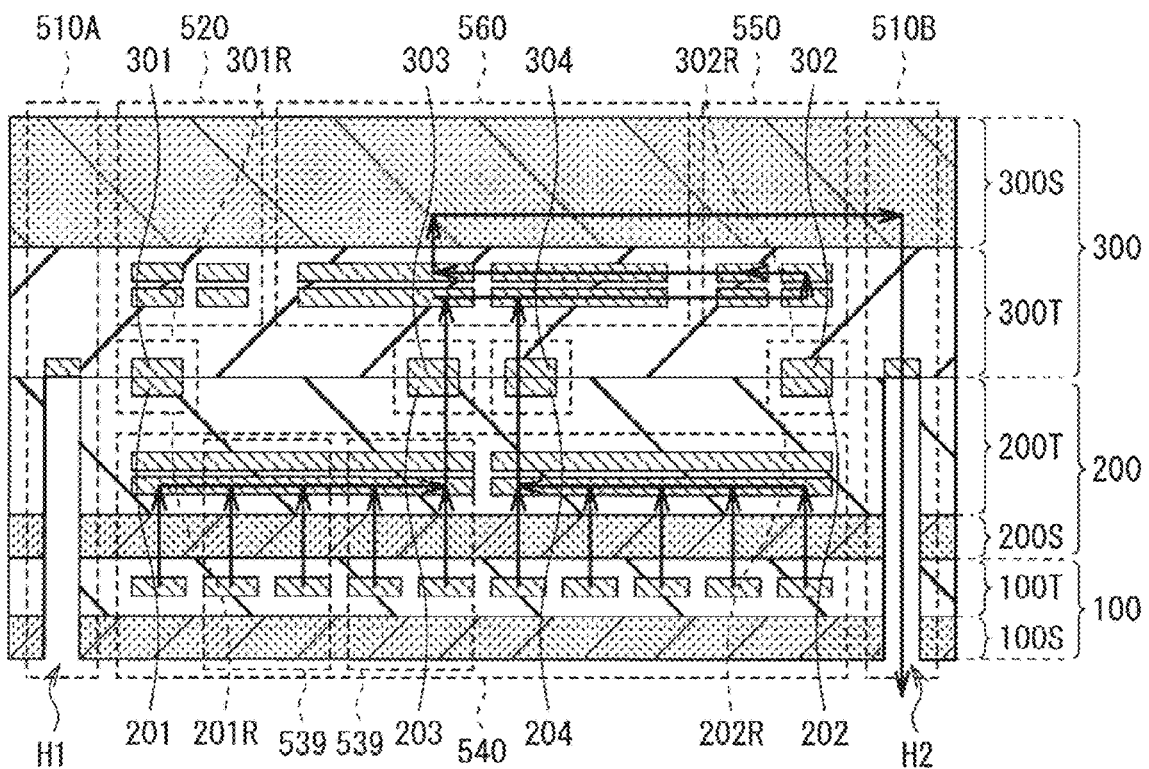
FIG. 34 is a schematic view illustrating a signal route of a pixel signal of the imaging device illustrated in FIG. 32.

Next, operations of the imaging device 1 will be described with reference to FIGS. 33 and 34. In FIG. 33, routes of an input signal input to the imaging device 1 from the outside and routes of a power supply potential and a reference potential are indicated by arrows. In FIG. 34, a signal route regarding a pixel signal output from the imaging device 1 to the outside is indicated by arrows. For example, an input signal input to the imaging device 1 via the input unit 510A is transmitted to the row drive unit 520 of the third substrate 300 to allow the row drive unit 520 to generate a row drive signal. The row drive signal is sent to the second substrate 200 via the contact portions 303 and 203. Furthermore, the row drive signal reaches each of the pixel sharing units 539 of the pixel array unit 540 via the row drive signal line 542 in the wiring layer 200T. Among the row drive signals reaching the pixel sharing unit 539 of the second substrate 200, drive signals other than those for the transfer gate TG are input to the pixel circuit 210 so as to drive each of transistors included in the pixel circuit 210. The drive signal for the transfer gate TG is input to the transfer gates TG1, TG2, TG3, and TG4 of the first substrate 100 via the through-substrate electrode TGV so as to drive the pixels 541A, 541B, 541C, and 541D. Furthermore, the power supply potential and the reference potential supplied from the outside of the imaging device 1 to the input unit 510A (input terminal 511) of the third substrate 300 are sent to the second substrate 200 via the contact portions 303 and 203, and supplied to the pixel circuit 210 of each of the pixel sharing units 539 via the wiring in the wiring layer 200T. The reference potential is further supplied to the pixels 541A, 541B, 541C, and 541D of the first substrate 100 via the through-substrate electrode 121E. On the other hand, the pixel signal photoelectrically converted by the pixels 541A, 541B, 541C, and 541D of the first substrate 100 is sent to the pixel circuit 210 of the second substrate 200 for each of the pixel sharing units 539. The pixel signal based on this pixel signal is sent from the pixel circuit 210 to the third substrate 300 via the vertical signal line 543 and the contact portions 204 and 304. This pixel signal is processed by the column signal processing unit 550 and the image signal processing unit 560 of the third substrate 300, and then output to the outside via the output unit 510B.

The imaging device 1 including such a contact portions 203, 204, 303, and 304 can also obtain effects similar to those described in the above embodiment. The position, the number, and the like of the contact portions can be changed according to the design of the circuit and the like of the third substrate 300 to which the wiring lines are to be connected via the contact portions 303 and 304.

6. Fifth Modification

Figure 35:
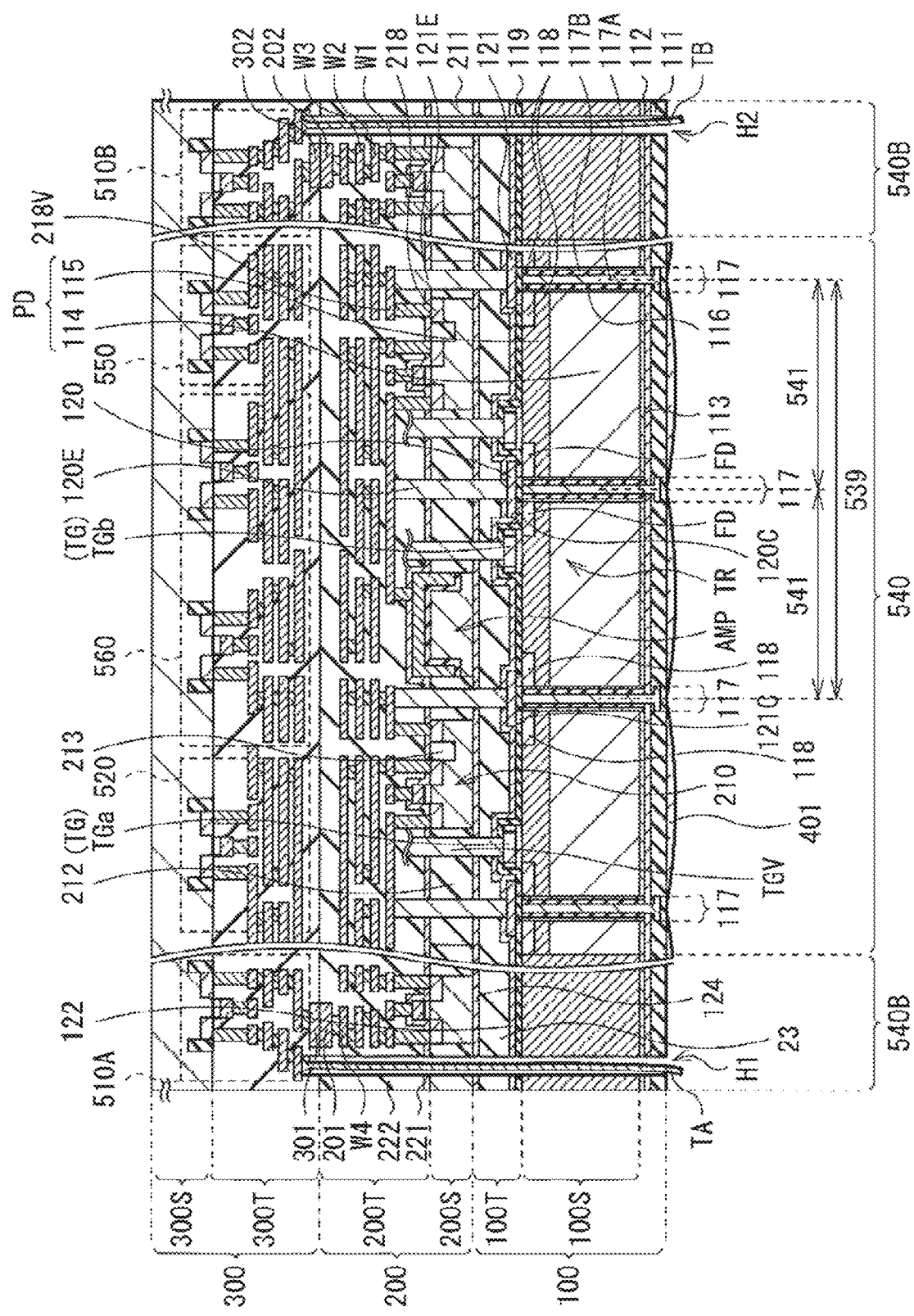
FIG. 35 is a schematic cross-sectional view illustrating another example of the imaging device illustrated in FIG. 6.

FIG. 35 illustrates a modification of the cross-sectional configuration of the imaging device 1 according to the embodiment. FIG. 35 corresponds to FIG. 6 described in the above embodiment. In the present modification, the transfer transistor TR having a planar structure is provided on the first substrate 100. In this respect, the imaging device 1 of the present modification is different from the imaging device 1 described in the above embodiment.

In the transfer transistor TR, the transfer gate TG is configured only by the horizontal portion TGb. In other words, the transfer gate TG has no vertical portion TGa, and is provided to face the semiconductor layer 100S.

The imaging device 1 including the transfer transistor TR having such a planar structure can also obtain the effects similar to those described in the above embodiment. Furthermore, it is also conceivable to form the photodiode PD closer to the front surface of the semiconductor layer 100S by providing the planar transfer gate TG on the first substrate 100 as compared with the case where the vertical transfer gate TG is provided on the first substrate 100, thereby increasing a saturation signal amount (Qs). In addition, the method of forming the planar transfer gate TG on the first substrate 100 can be considered to have a smaller number of manufacturing steps than the method of forming the vertical transfer gate TG on the first substrate 100, with less likelihood of occurrence of adverse effects due to the manufacturing steps on the photodiode PD.

7. Sixth Modification

Figure 36:
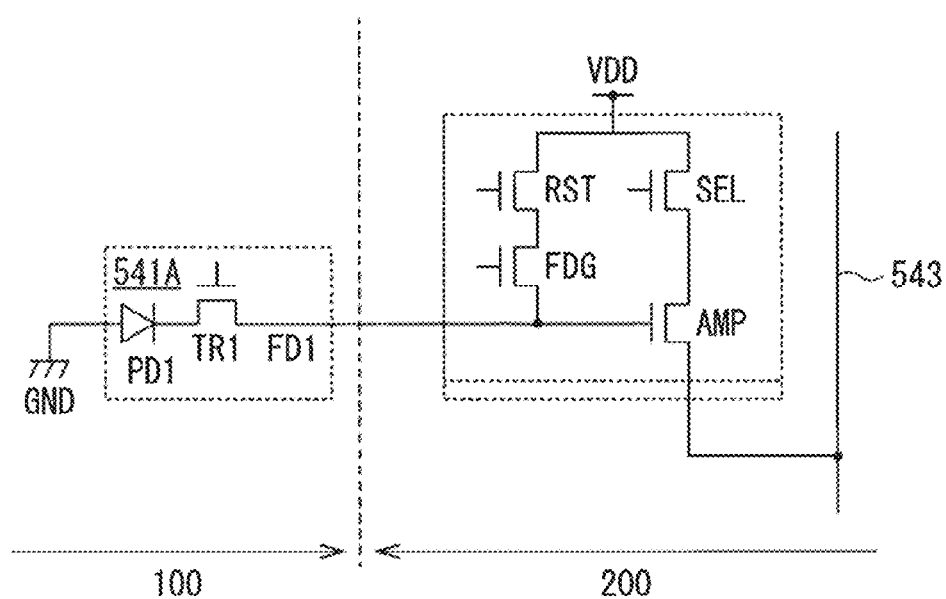
FIG. 36 is a diagram illustrating another example of the equivalent circuit illustrated in FIG. 4.

FIG. 36 illustrates a modification of the pixel circuit of imaging device 1 according to the embodiment. FIG. 36 corresponds to FIG. 4 described in the above embodiment. In the present modification, the pixel circuit 210 is provided for each pixel (pixel 541A). That is, the pixel circuit 210 is not shared by a plurality of pixels. In this respect, the imaging device 1 of the present modification is different from the imaging device 1 described in the above embodiment.

The imaging device 1 of the present modification is the same as the imaging device 1 described in the above embodiment in that the pixel 541A and the pixel circuit 210 are provided on different substrates (the first substrate 100 and the second substrate 200, respectively). Therefore, the imaging device 1 according to the present modification can also obtain effects similar to those described in the above embodiment.

8. Seventh Modification

Figure 37:
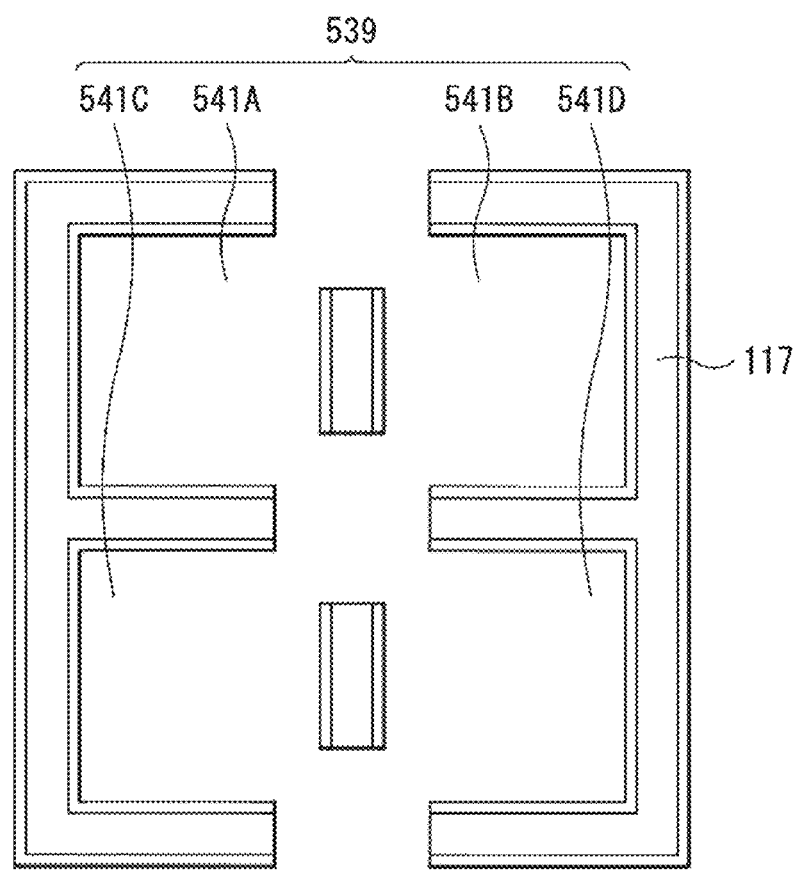

FIG. 37 illustrates a modification of the planar configuration of the pixel isolation portion 117 described in the above embodiment. The pixel isolation portion 117 surrounding each of the pixels 541A, 541B, 541C, and 541D may have gaps. That is, the entire circumference of the pixels 541A, 541B, 541C, and 541D does not have to be surrounded by the pixel isolation portion 117. For example, the gaps of the pixel isolation portion 117 are provided in the vicinity of the pad portions 120 and 121 (refer to FIG. 7B).

Although the above embodiment is an example in which the pixel isolation portion 117 has the FTI structure penetrating the semiconductor layer 100S (refer to FIG. 6), the pixel isolation portion 117 may have a configuration other than the FTI structure. For example, the pixel isolation portion 117 does not have to completely penetrate the semiconductor layer 100S, and may have a structure referred to as a deep trench isolation (DTI) structure.

9. Embodiment 2

9.1 Problem to be Solved by Embodiment 2

In accordance with the shooting environment of a subject, the conversion efficiency levels need to be switched by achieving variable capacitance of the floating diffusion FD. Accordingly, there is a method of switching the FD capacitance in accordance with shooting environments, using an additional capacitor Cfd2 disposed in the pixel in addition to a capacitor Cfd1 of the floating diffusion FD in the pixel. Moreover, there is a method of connecting the additional capacitor Cfd2 to the floating diffusion FD in the case of a dark subject.

Figure 38:
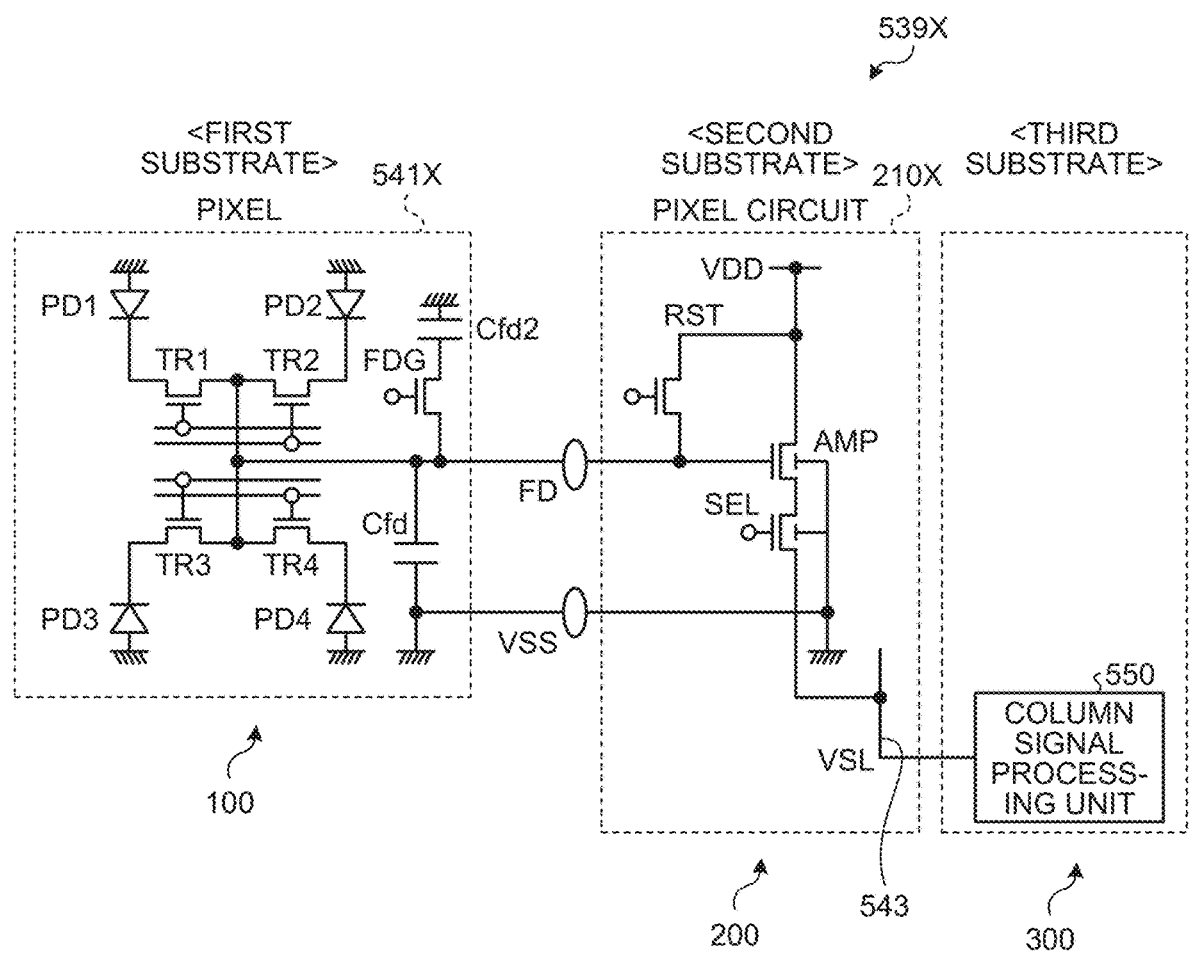
FIG. 38 is an equivalent circuit diagram illustrating an example of a configuration of a pixel sharing unit of a comparative example.

FIG. 38 is an equivalent circuit diagram illustrating an example of a configuration of a pixel sharing unit 539X of a comparative example. A pixel common unit 539X illustrated in FIG. 38 includes a pixel 541X in a first substrate 100 and a pixel circuit 210X in a second substrate. The pixel 541X includes four photodiodes PD, four transfer transistors TR, and a capacitor Cfd1 in the floating diffusion FD, for example. Furthermore, the pixel 541X includes an additional capacitor Cfd2 and an FD transfer transistor FDG. The pixel circuit 210X in the second substrate 200 includes a reset transistor RST, an amplification transistor AMP, a selection transistor SEL, a power supply line (VDD), and a vertical signal line (VSL) 543, for example. The vertical signal line 543 electrically connects each pixel circuit 210X and the column signal processing unit 550 disposed on the third substrate 300. The column signal processing unit 550 then detects a pixel signal from each pixel circuit 210X emerging in the vertical signal line 543.

There is a FD wiring line FDL in the pixel sharing unit 539X to be a floating diffusion FD region electrically connecting between the drain of the transfer transistor TR in the pixel 541X and the gate of the amplification transistor AMP in the pixel circuit 210X. The FD wiring line FDL electrically connects the additional capacitor Cfd2 via the FD transfer transistor FDG. The additional capacitor Cfd2 is electrically connected to the drain of the FD transfer transistor FDG, while the FD wiring line FDL is electrically connected to the source of the FD transfer transistor FDG. In a case of shooting a dark subject, the gate of the FD transfer transistor FDG is turned on, and the FD wiring line FDL is to be electrically connected to the additional capacitor Cfd2 in addition to the capacitor Cfd1. In contrast, in a case of shooting a bright subject, the gate of the FD transfer transistor FDG is turned off, and the electrical connection between the FD wiring line FDL and the additional capacitor Cfd2 is to be disconnected.

That is, when shooting a dark subject, the gate of the FD transfer transistor FDG is turned on and the additional capacitor Cfd2 is electrically connected to the FD wiring line FDL, thereby increasing the capacitance of the floating diffusion FD. In contrast, when shooting a bright subject, the gate of the FD transfer transistor FDG is turned off and the electrical connection between the FD wiring line FDL and the additional capacitor Cfd2 is disconnected, thereby decreasing the capacitance of the floating diffusion FD.

The FD wiring line FDL is electrically connected to the additional capacitor Cfd2 in addition to the floating diffusion FD including the capacitor Cfd1 under the switching control of the FD transfer transistor FDG. As a result, the charge-voltage conversion efficiency levels can be switched by switching the capacitance of the floating diffusion FD.

However, the necessity to dispose the FD transfer transistor FDG and the additional capacitor Cfd2 for each pixel sharing unit 539 in the first substrate 100 leads to the necessity to provide an arrangement space for the FD transfer transistor FDG and the additional capacitor Cfd2, which is disadvantageous in achieving higher pixel count for higher resolution.

9.2 Outline of Embodiment 2

Therefore, the imaging device includes a first substrate, a second substrate, a third substrate, and a switching unit. The first substrate has a pixel including a photodiode and floating diffusion that holds the charge converted by the photodiode. The second substrate has a pixel circuit that reads out a pixel signal based on the charge held in the floating diffusion in the pixel, and is stacked on the first substrate. The third substrate has a processing circuit that detects a pixel signal read out by the pixel circuit, and is stacked on the second substrate. The switching unit is provided to enable electrical connection between the floating diffusion and a floating diffusion of another pixel in the first substrate, and is provided on the second substrate.

By the switching control of the switching unit, the imaging device enables electrical connection between the floating diffusion of a pixel and the floating diffusion of another pixel. As a result, by switching the capacitance of the floating diffusion of the pixel using the floating diffusion of another pixel, it is possible to switch the charge-voltage conversion efficiency levels without increasing the additional capacitor Cfd2. Moreover, since the switching unit is provided not on the first substrate but on the second substrate, it is possible to contribute not only to improvement of charge-voltage conversion efficiency but also to achievement of higher pixel count for higher resolution.

9.3 Specific Example of Embodiment 2-1

9.3.1 Configuration of Embodiment 2-1

Figure 39:
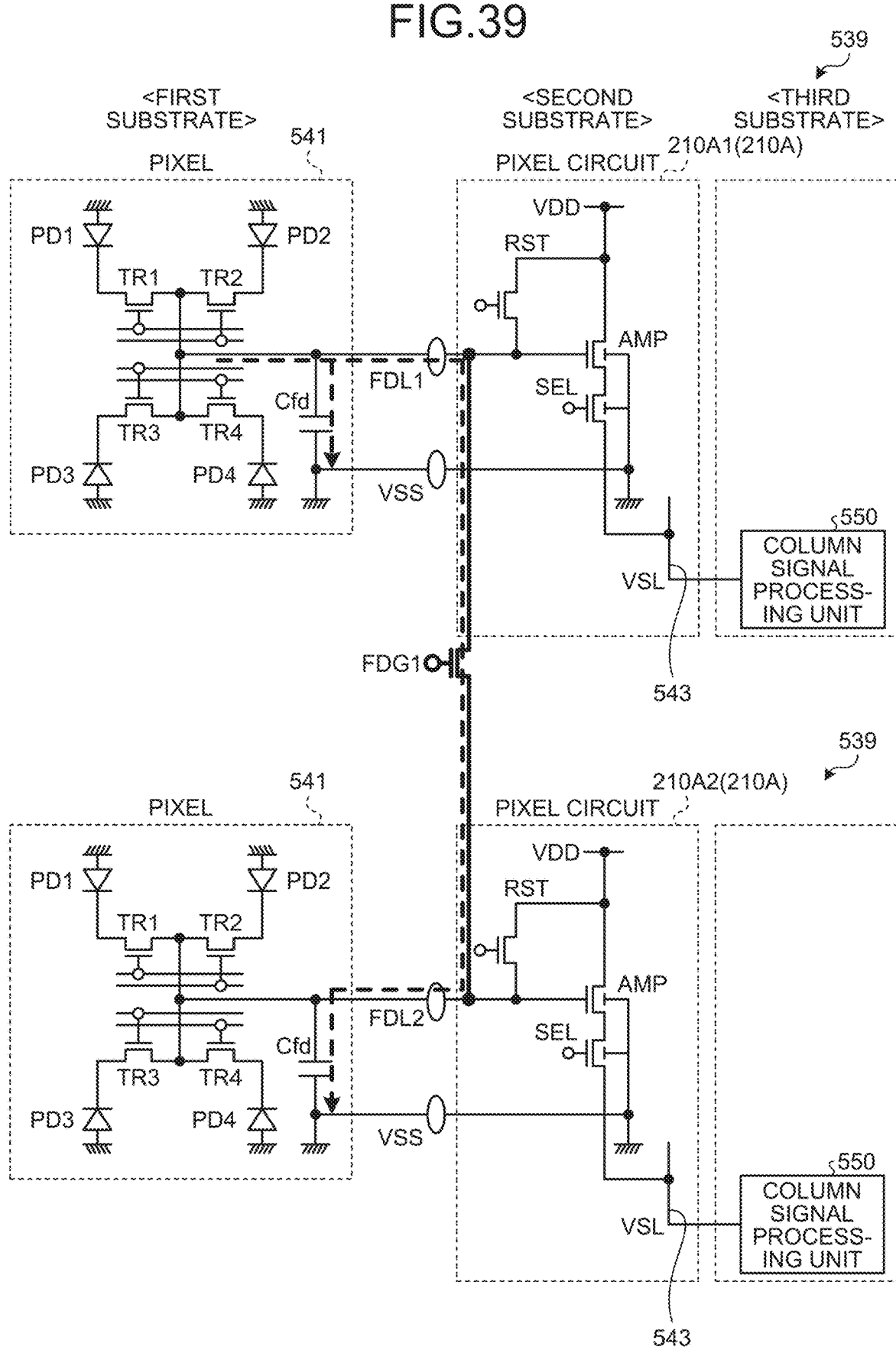
FIG. 39 is an equivalent circuit diagram illustrating an example of a configuration of a pixel sharing unit of Embodiment 2-1.

FIG. 39 is an equivalent circuit diagram illustrating an example of a configuration of the pixel sharing unit 539 in Embodiment 2-1. The imaging device 1 has a three-layer structure in which a first substrate 100, a second substrate 200, and a third substrate 300 are stacked. The first substrate 100 includes a plurality of pixels 541 that perform photoelectric conversion. The second substrate 200 includes a pixel circuit 210A that reads out a pixel signal based on the charge output from the pixel 541. The third substrate 300 includes a processing circuit that processes a pixel signal. The pixel sharing unit 539 includes the pixel 541 and the pixel circuit 210A. The pixel 541 includes four photodiodes PD, four transfer transistors TR that transfer the charge converted by the individual photodiodes PD, and floating diffusion FD that holds the charge transferred by the transfer transistor TR.

The pixel circuit 210A includes a reset transistor RST, an amplification transistor AMP, a selection transistor SEL, a power supply line (VDD), and a vertical signal line (VSL) 543, for example. The reset transistor RST resets the potential of the floating diffusion FD to a predetermined potential. The amplification transistor AMP generates a signal at a voltage corresponding to the level of the charge held in the floating diffusion FD as a pixel signal. The selection transistor SEL controls connection between the drain of the amplification transistor AMP and the vertical signal line 543. The floating diffusion FD of the first substrate is electrically connected, via FD wiring line FDL, to the gate of the amplification transistor AMP in the pixel circuit 210 of the second substrate 200.

The vertical signal line 543 electrically connects each pixel circuit 210A and the column signal processing unit 550 disposed on the third substrate 300. Then, the column signal processing unit 550 detects the pixel signal emerging in the vertical signal line 543 from each of the pixel circuits 210A.

The second substrate 200 includes an FD transfer transistor FDG1 that enables connection of a second FD wiring line FDL2 to a first FD wiring line FDL1. The first FD wiring line FDL1 is a wiring line that connects the pixel 541 and a first pixel circuit 210A1 corresponding to the pixel 541. The second FD wiring line FDL2 is a wiring line that connects another pixel 541 and a second pixel circuit 210A2 corresponding to the another pixel 541. The FD transfer transistor FDG1 electrically connects the drain of the FD transfer transistor FDG1 to the first FD wiring line FDL1, and electrically connects the source of the FD transfer transistor FDG1 to the second FD wiring line FDL2. The FD transfer transistor FDG1 is referred to as a switching unit, for example. Furthermore, the gate of the FD transfer transistor FDG1 is electrically connected to the row drive unit 520. It is assumed that a gate-on section of the FD transfer transistor FDG1 includes a part of an off-section before and after an on-section of the transfer transistor TR that overlaps with the gate-on section of the transfer transistor TR of the currently selected pixel 541.

The FD transfer transistor FDG1 turns off the gate voltage when shooting a bright subject. When the gate voltage is turned off, the FD transfer transistor FDG1 disconnects the electrical connection between the first FD wiring line FDL1 and the second FD wiring line FDL2. The first FD wiring line FDL1 is a wiring line that connects the currently selected pixel 541 and the first pixel circuit 210A1 to each other. The second FD wiring line FDL2 is a wiring that connects the pixel 541 not currently selected and the second pixel circuit 210A2 to each other. As a result, the FD capacitance of the selected pixel 541 is equivalent to the capacitance corresponding to the first FD wiring line FDL1 of the capacitor Cfd1.

In contrast, the FD transfer transistor FDG1 turns on the gate voltage when shooting a dark subject. In a case where the gate voltage is turned on, the FD transfer transistor FDG1 electrically connects the first FD wiring line FDL1 and the second FD wiring line FDL2 to each other. As a result, in addition to the capacitance corresponding to the first FD wiring line FDL1 including the capacitor Cfd in the selected pixel 541, the capacitance of the capacitor Cfd1 in the pixel 541 not currently selected is to be added to the FD capacitance. With addition of the capacitance of the capacitor Cfd1 in the pixel 541 not currently selected, the FD capacitance of the currently selected pixel 541 is to be increased, as compared with the capacitance of the floating diffusion FD when the FD transfer transistor FDG1 is turned off. That is, by the switching control of the FD transfer transistor FDG1, the FD capacitance of the currently selected pixel 541 can be switched so as to achieve switching of the charge-voltage conversion efficiency levels.

9.3.2 Operation and Effect of Embodiment 2-1

In the imaging device 1 of Embodiment 2-1, the FD transfer transistor FDG1 that enables electrical connection between the first FD wiring line FDL1 of the currently selected pixel 541 and the second FD wiring line FDL2 of the pixel 541 not currently selected is arranged on the second substrate 200. Furthermore, the imaging device 1 performs switching control of the FD transfer transistor FDG1, thereby achieving variable FD capacitance of the currently selected first FD wiring line FDL1. As a result, by switching the FD capacitance according to the imaging environment without increasing the arrangement area of the first substrate 100, the charge-voltage conversion efficiency can be switched. That is, as compared with the comparative example illustrated in FIG. 38, the capacitor Cfd2 and the FD transfer transistor FDG for each of the pixel sharing units 539 are unnecessary on the first substrate 100, which can contribute to the achievement of higher pixel count for higher resolution

9.4 Modification of Embodiment 2

The currently selected pixel 541 is, for example, the pixel 541 selected in units of rows among one or more pixels 541 arranged in the row direction. Alternatively, the non-selected pixel 541 may be any pixel 541 other than the selected pixel 541, and can be changed as appropriate.

Although the currently selected pixel 541 is the pixel 541 selected in units of rows, the pixel 541 may be, for example, the pixel 541 selected in units of columns among one or more pixels 541 arranged in the column direction, and can be appropriately changed. In this case, the pixel 541 not currently selected may be any pixel 541 other than the selected pixel 541, and can be changed as appropriate.

The pixel 541 includes a total of four (2×2) photodiodes PD, for example, but is not limited to four. The number of photodiodes PD can be appropriately changed as long as the number is 1 or more.

The above is an exemplary case where the FD transfer transistor FDG1 electrically connects the second FD wiring line FDL2 of the single pixel 541 not currently selected to the first FD wiring line FDL1 of the currently selected pixel 541. However, the present disclosure is not limited to the second FD wiring line FDL2 of the single pixel 541, and the second FD wiring lines FDL2 of the plurality of pixels 541 not currently selected may be electrically connected to the first FD wiring lines FDL1 of the currently selected pixel 541.

Although the above is an exemplary case where the FD transfer transistor FDG1 is disposed on the second substrate 200, the FD transfer transistor FDG1, may be arranged on the the third substrate 300 and can be appropriately changed.

10. Embodiment 3

10.1 Problem to be Solved by Embodiment 3

Figure 40:
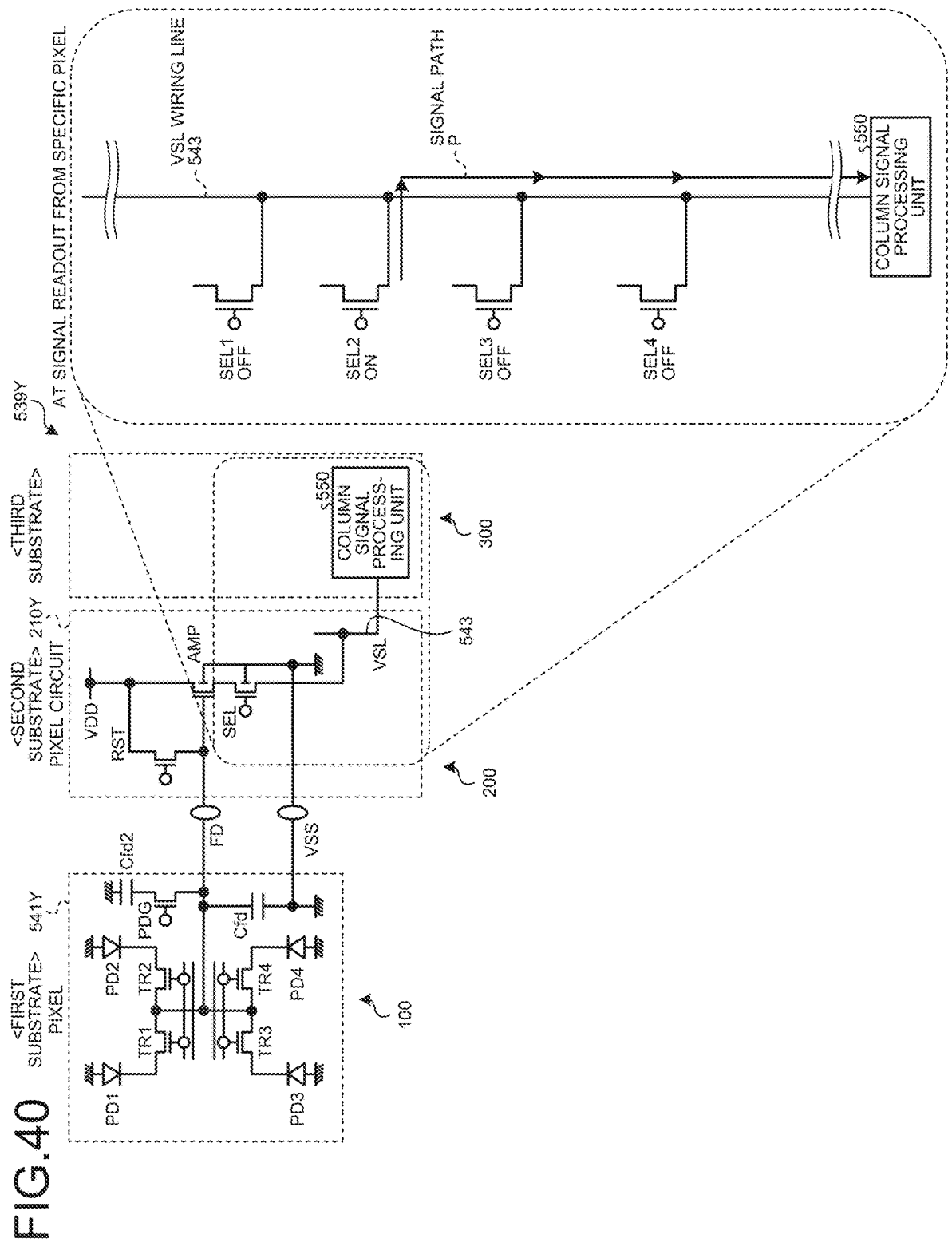
FIG. 40 is an equivalent circuit diagram illustrating an example of a configuration of the pixel sharing unit of the comparative example.

FIG. 40 is an equivalent circuit diagram illustrating an example of a configuration of a pixel sharing unit 539Y of a comparative example. The pixel sharing unit 539Y includes a pixel 541Y and a pixel circuit 210Y. The selection transistor SEL in each pixel circuit 210Y is electrically connected to the vertical signal line 543 connected to the column signal processing unit 550 disposed on the third substrate 300. The drain of the selection transistor SEL in the pixel circuit 210Y is electrically connected to the source of the amplification transistor AMP in the pixel circuit 210Y, and the source of the selection transistor SEL is electrically connected to the vertical signal line 543. The pixel circuit 210Y corresponding to the currently selected pixel 541Y turns on the selection transistor SEL and transfers a pixel signal to the column signal processing unit 550. At this time, the pixel circuit 210Y corresponding to the pixel 541Y not currently selected turns off the selection transistor SEL.

The pixel circuit 210Y causes the pixel signal of the currently selected pixel 541 to emerge in the vertical signal line 543. The column signal processing unit 550 reads out the pixel signal emerging in the vertical signal line 543. At this time, series resistance of a signal path P in which the pixel signal on the vertical signal line 543 emerges, parasitic capacitance of the vertical signal line 543 other than the signal path P, and parasitic capacitance obtained by totaling the fringe capacitance of the selection transistor SEL in the off state connected to the vertical signal line 543 have an influence on readout of signals. As a result, VSL waveform rounding occurs over the signal path P. The VSL waveform rounding over the signal path P also causes a decrease in the frame rate of the final output image. To handle this, it is conceivable to increase the Load MOS (LM) current of the column signal processing unit 550 in order to improve the VSL waveform rounding, but this leads to an increase in power consumption.

10.2 Outline of Embodiment 3

Therefore, the imaging device includes a first substrate, a second substrate, a third substrate, and a switching unit. The first substrate has a pixel including a photodiode and floating diffusion that holds the charge converted by the photodiode. The second substrate includes: a pixel circuit that reads out a pixel signal based on the charge held in the floating diffusion in the pixel; and a readout wiring line in which a pixel signal read out from each pixel circuit emerges, and the second substrate is stacked on the first substrate. The third substrate has a processing circuit that detects a pixel signal emerging in the readout wiring line from the pixel circuit, and is stacked on the second substrate. The switching unit is provided on the readout wiring line of the second substrate and disconnects electrical connection between the pixel circuit and the processing circuit.

In the imaging device, the switching unit that disconnects electrical connection between the pixel circuit and the processing circuit is provided on the readout wiring line of the second substrate. This result in reduction of the influence of the parasitic capacitance of the readout wiring line other than the signal path and the parasitic capacitance of the selection transistor connected to the readout wiring line other than the signal path, leading to the suppression of the waveform rounding of the readout wiring line on the signal path.

10.3 Specific Example of Embodiment 3-1

10.3.1 Configuration of Embodiment 3-1

Figure 41:
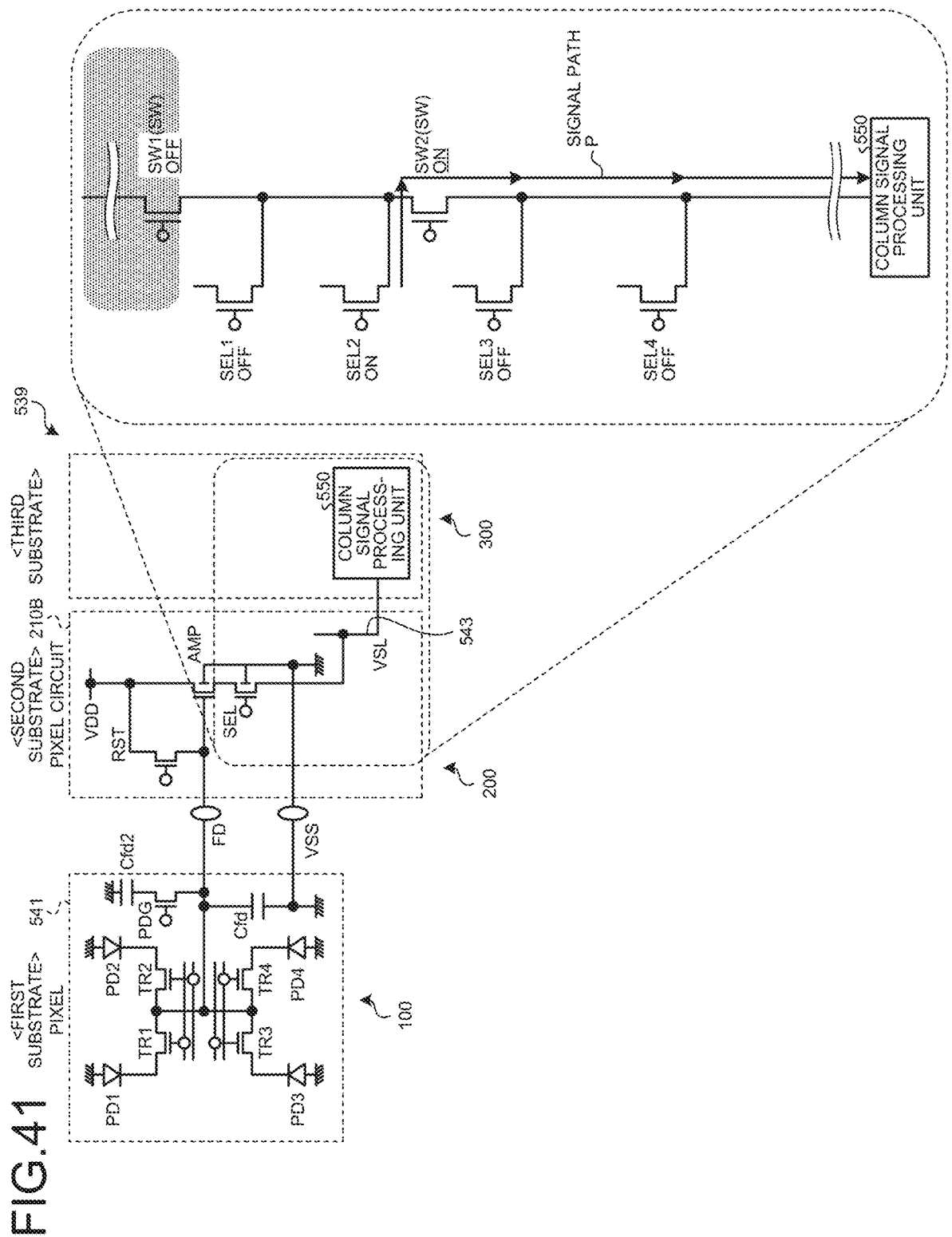
FIG. 41 is an equivalent circuit diagram illustrating an example of a configuration of a pixel sharing unit of Embodiment 3-1.

FIG. 41 is an equivalent circuit diagram illustrating an example of a configuration of a pixel sharing unit 539 in Embodiment 3-1. The imaging device 1 has a structure in which a first substrate 100, a second substrate 200, and a third substrate 300 are stacked. The first substrate 100 includes a plurality of pixels 541 that perform photoelectric conversion. The second substrate 200 includes a pixel circuit 210B that reads out a pixel signal based on the charge output from the pixel 541. The third substrate 300 includes a processing circuit such as a column signal processing unit 550 that detects a pixel signal. The pixel sharing unit 539 includes the pixel 541 and the pixel circuit 210B.

The pixel 541 includes four photodiodes PD, four transfer transistors TR that transfer the charge converted by the individual photodiodes PD, and floating diffusion FD that holds the charge transferred by the transfer transistor TR.

The pixel circuit 210B includes a reset transistor RST, an amplification transistor AMP, a selection transistor SEL, a power supply line (VDD), and a vertical signal line (VSL) 543, for example. The reset transistor RST resets the potential of the floating diffusion FD to a predetermined potential. The amplification transistor AMP generates a signal at a voltage corresponding to the level of the charge held in the floating diffusion FD as a pixel signal. The selection transistor SEL controls connection between the drain of the amplification transistor AMP and the vertical signal line 543. The floating diffusion FD of the first substrate 100 is electrically connected, via FD wiring line FDL, to the gate of the amplification transistor AMP in the pixel circuit 210B of the second substrate 200.

The vertical signal line 543 electrically connects each pixel circuit 210B and the column signal processing unit 550 in the processing circuit disposed on the third substrate 300. Then, the column signal processing unit 550 detects the pixel signal emerging in the vertical signal line 543 from each of the pixel circuits 210B. The vertical signal line 543 is also referred to as a readout wiring line.

The selection transistor SEL in each pixel circuit 210B is electrically connected to the vertical signal line 543 connected to the column signal processing unit 550 disposed on the third substrate 300. The drain of the selection transistor SEL in the pixel circuit 210B is electrically connected to the source of the amplification transistor AMP in the pixel circuit 210B, and the source of the selection transistor SEL is electrically connected to the vertical signal line 543.

FIG. 41 illustrates an example of switching operation of a vertical signal line switch SW on the vertical signal line 543 related to the turn-on of the second selection transistor SEL2. The vertical signal line switch SW is also referred to as a switching unit. Note that, for convenience of description, the vertical signal line 543 is electrically connected to a first selection transistor SEL1, a second selection transistor SEL2, a third selection transistor SEL3, and a fourth selection transistor SEL4. The first selection transistor SEL1 is a selection transistor SEL in a first pixel circuit 210B1, and the second selection transistor SEL2 is a selection transistor SEL in a second pixel circuit 210B2. The third selection transistor SEL3 is a selection transistor SEL in a third pixel circuit 210B3, and the fourth selection transistor SEL4 is a selection transistor SEL in a fourth pixel circuit 210B4. A plurality of the vertical signal line switches SW is disposed on the vertical signal line 543 connecting the selection transistor SEL of each pixel circuit 210B and the column signal processing unit 550 to each other. Note that the vertical signal line switches SW may be disposed on the vertical signal line 543 at specific intervals, and can be appropriately changed.

The vertical signal line switch SW may be a normally-on SW, for example, may use the same transistor as the selection transistor SEL, and can be appropriately changed. The vertical signal line switch SW on the signal path P of the vertical signal line 543 through which the pixel signal flows from the pixel circuit 210B to the column signal processing unit 550 is in an on state. Among the vertical signal line switches SW disposed in the vertical signal line 543 other than the signal path P, the vertical signal line switch SW closest to the column signal processing unit 550, that is, the vertical signal line switch SW electrically connecting the signal path P with the vertical signal line 543 other than the signal path P is turned off.

The vertical signal line switch SW includes a first vertical signal line switch SW1 and a second vertical signal line switch SW2, for example. The first vertical signal line switch SW1 disconnects the electrical connection between the first selection transistor SEL1 on the vertical signal line 543 and the upstream side of the vertical signal line 543. The second vertical signal line switch SW2 disconnects the electrical connection between the second selection transistor SEL2 and the third selection transistor SEL3 on the vertical signal line 543.

For convenience of description, the above is an exemplary case where the first pixel circuit 210B1 to the fourth pixel circuit 210B4 are disposed as the pixel circuit 210B, and the first selection transistor SEL1 to the fourth selection transistor SEL4 are disposed as the selection transistor SEL. Furthermore, the above is an exemplary case where the first vertical signal line switch SW1 and the second vertical signal line switch SW2 are disposed as the vertical signal line switch SW. However, the numbers of the pixel circuits 210B, the selection transistors SEL, and the vertical signal line switches SW are not limited thereto, and can be changed as appropriate.

The drain of the first selection transistor SEL1 of the first pixel circuit 210B1 is electrically connected to the source of the amplification transistor AMP in the first pixel circuit 210B1, while the source of the first selection transistor SEL1 is electrically connected to the vertical signal line 543. The drain of the second selection transistor SEL2 of the second pixel circuit 210B2 is electrically connected to the source of the amplification transistor AMP in the second pixel circuit 210B2, while the source of the second selection transistor SEL2 is electrically connected to the vertical signal line 543. The drain of the third selection transistor SEL3 of the third pixel circuit 210B3 is electrically connected to the source of the amplification transistor AMP of the third pixel circuit 210B3, while the source of the third selection transistor SEL3 is electrically connected to the vertical signal line 543. The drain of the fourth selection transistor SEL4 of the fourth pixel circuit 210B4 is electrically connected to the source of the amplification transistor AMP in the fourth pixel circuit 210B4, while the source of the fourth selection transistor SEL4 is electrically connected to the vertical signal line 543.

For example, in a case where the second selection transistor SEL2 is turned on as illustrated in FIG. 41 in the second pixel circuit 210B2 corresponding to the currently selected pixel 541, the vertical signal line 543 in which the pixel signal from the second selection transistor SEL2 to the column signal processing unit 550 emerges is the signal path P. At this time, the first vertical signal line switch SW1 electrically connecting the signal path P with the vertical signal line 543 other than the signal path P is turned off. That is, the first vertical signal line switch SW1 is turned off, and the second vertical signal line switch SW2 is turned on. As a result, in the signal path P, it is possible to reduce the influence of the parasitic capacitance of the vertical signal line 543 subsequent to the first vertical signal line switch SW1 among the vertical signal lines 543 other than the signal path P, the parasitic capacitance of the selection transistor SEL, and the like.

Figure 42:
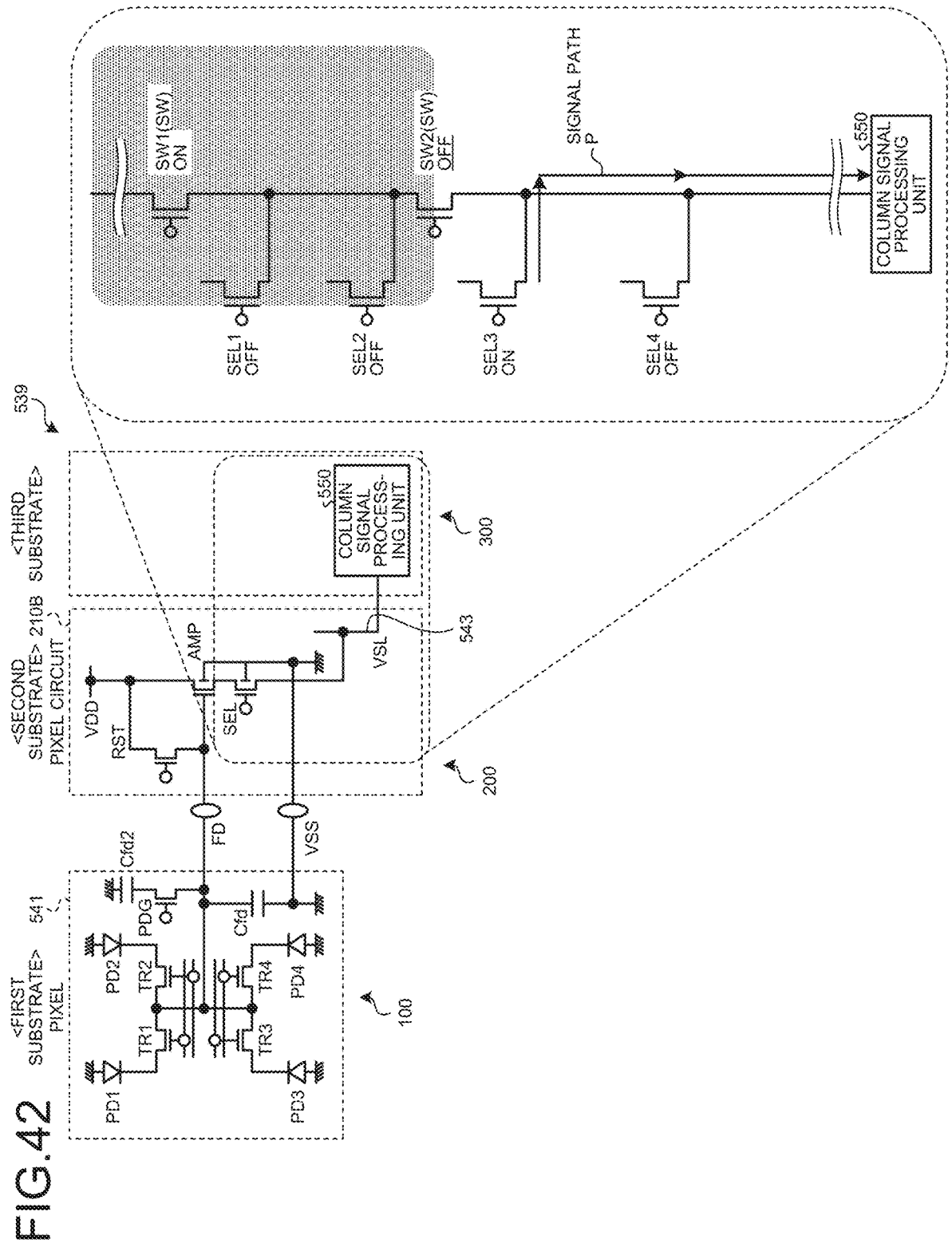
FIG. 42 is a diagram illustrating an example of switching operation of a vertical signal line switch SW on a vertical signal line (turn-on of a third selection transistor SEL3).

FIG. 42 is a diagram illustrating an example of switching operation of the vertical signal line switch SW on the vertical signal line 543 (turn-on of the third selection transistor SEL3). In a case where the third selection transistor SEL3 is turned on as illustrated in FIG. 42 in the third pixel circuit 210B3 corresponding to the currently selected pixel 541, the vertical signal line 543 in which the pixel signal from the third selection transistor SEL3 to the column signal processing unit 550 emerges is the signal path P. At this time, the second vertical signal line switch SW2 electrically connecting the signal path P with the vertical signal line 543 other than the signal path P is turned off. That is, the first vertical signal line switch SW1 is turned on, and the second vertical signal line switch SW2 is turned off. As a result, the signal path P can reduce the influence of the parasitic capacitance of the vertical signal line 543 subsequent to the second vertical signal line switch SW2 and the parasitic capacitance of the first selection transistor SEL1 and the second selection transistor SEL2 among the vertical signal lines 543 other than the signal path P.

The signal path P in a case where the third selection transistor SEL3 is turned on can further reduce the influence of the parasitic capacitance as compared with the signal path P in a case where the second selection transistor SEL2 is turned on. For example, it is possible to reduce the influence of the parasitic capacitance of the vertical signal line 543 other than the signal path P, the parasitic capacitance with the adjacent wiring of the vertical signal line 543, the parasitic capacitance of the silicon substrate, and the like. In addition, it is possible to reduce an influence of a parasitic capacitance or the like obtained by totaling the fringe capacitances of the plurality of selection transistors SEL currently turned off (particularly, the gate fringe capacitances of the selection transistors SEL1 and SEL2) connected to the vertical signal line 543.

10.3.2 Operation and Effect of Embodiment 3-1

In the imaging device 1 of Embodiment 3-1, the vertical signal line switch SW electrically connecting the signal path P on the vertical signal line 543 from the pixel circuit 210B of the selected pixel 541 to the column signal processing unit 550 and the vertical signal line 543 other than the signal path P is turned off. As a result, by reducing the influence of the parasitic capacitance or the like of the vertical signal line 543 subsequent to the first vertical signal line switch SW1 among the vertical signal lines 543 other than the signal path P or reducing the parasitic capacitance of the selection transistor SEL, it is possible to suppress the VSL waveform rounding on the signal path P.

By selectively using, among the plurality of vertical signal line switches SW on the vertical signal line 543, the optimal drive mode corresponding to the portion where the vertical signal line switch SW is turned off, the LM current is applied to the column signal processing unit 550 when reading out the pixel signal of the pixel circuit 210B farthest from the column signal processing unit 550. As a result, when the pixel signal of the pixel circuit 210A close to the column signal processing unit 550 is read out, the VSL waveform rounding can be reduced. This makes it possible to achieve shortened drive pulse or reduction of the consumption of the LM current By using a plurality of drive modes corresponding to turn-off of the vertical signal line switch SW, it is possible to improve the frame rate of the final output image. In addition, application of a plurality of LM current settings corresponding to turn-off of each of the vertical signal line switches SW makes it possible to reduce power consumption.

At the time of readout at the pixel circuit 210B close to the column signal processing unit 550, reduction of the parasitic capacitance of the vertical signal line 543 by the vertical signal line switch SW leads to improvement of VSL waveform rounding on the signal path P. With application of the setting for reducing the LM current amount corresponding to the amount of improvement, the total current amount required at the time of reading can be reduced.

Figure 43:
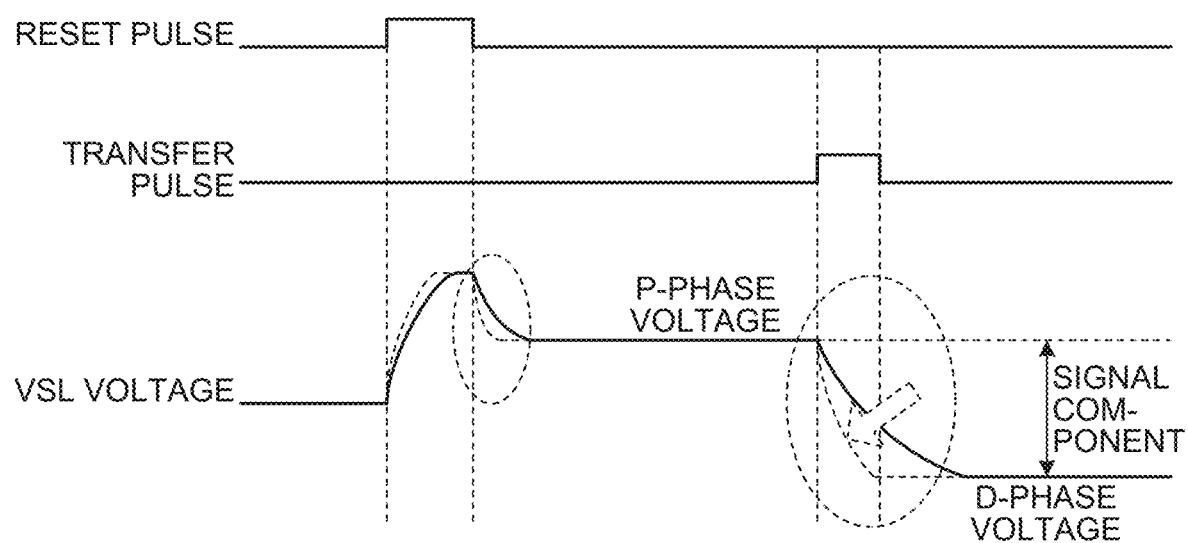
FIG. 43 is a timing chart illustrating an example of operation of a pixel circuit.

FIG. 43 is a timing chart illustrating an example of operation of the pixel circuit 210B. As the pixel circuit 210B is closer to the column signal processing unit 550, the capacitance of the vertical signal line 543 can be reduced to shorten the settling period. As illustrated in FIG. 43, for example, the settling period of the vertical signal line voltage (VSL voltage) immediately after the reset pulse of the reset transistor RST is at the high level can be shortened as indicated by a dotted line. In addition, the settling period of the vertical signal line voltage (VSL voltage) immediately after the high level of the transfer pulse of the transfer transistor TR can be shortened as indicated by a dotted line. Switching the drive mode to a mode having a short settling period contributes to frame rate improvement or power saving in the LM current.

Note that the vertical signal line switch SW desirably uses a transistor having a low on-resistance and a low parasitic capacitance. For example, when the structure of the selection transistor SEL is applied as the vertical signal line switch SW, a plurality of transistors of the vertical signal line switch SW is to be connected in parallel within a range in which the parasitic capacitance would not affect the VSL waveform. As a result, it is possible to increase the effective gate length and decrease the on-resistance of the vertical signal line switch SW.

The above description regarding the imaging device 1 of Embodiment 3-1 is an exemplary case where the plurality of vertical signal line switches SW is arranged on the vertical signal line 543. However, the number of vertical signal line switches SW arranged on the vertical signal line 543 might be too large. For example, when electrically connecting, on the vertical signal line 543, the vertical signal line switches SW as many as the selection transistors SEL electrically connected on the vertical signal line 543, the SW capacitance and the SW resistance of the vertical signal line switch SW itself would be factors of the VSL waveform rounding on the signal path. Therefore, it is necessary to appropriately adjust the number of vertical signal line switches SW to be disposed on the vertical signal line 543.

10.4 Specific Example of Embodiment 3-2

10.4.1 Configuration of Embodiment 3-2

Figure 44:
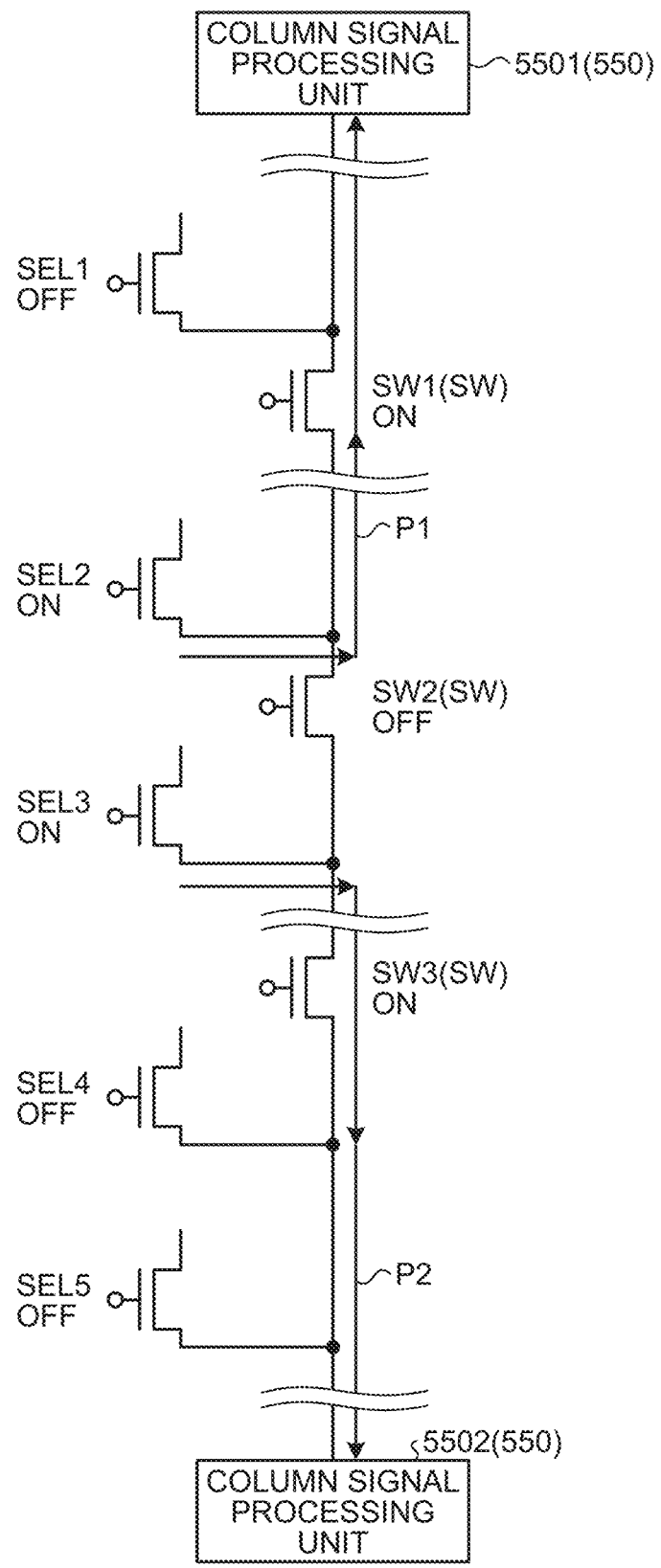
FIG. 44 is a diagram illustrating an example of switching operation of the vertical signal line switch SW on the vertical signal line (turn-on of a second selection transistor SEL2 and the third selection transistor SEL3).

FIG. 44 is a diagram illustrating an example of switching operation of the vertical signal line switch SW on the vertical signal line 543 (turn-on of the second selection transistor SEL2 and the third selection transistor SEL3). For convenience of description, the same reference numerals are given to the same configurations as those of the Embodiment 3-1, and description of duplicated configurations and operations will be omitted.

In the imaging device 1 of Embodiment 3-2, the pixel signal from each pixel circuit 210B is detected by the column signal processing unit 550 arranged on both sides of one vertical signal line 543. The third substrate 300 includes a plurality of column signal processing units 550, for example, a first column signal processing unit 5501 and a second column signal processing unit 5502. The first column signal processing unit 5501 is connected to one end of one vertical signal line 543, and the second column signal processing unit 5502 is connected to the other end of the vertical signal line 543.

For convenience of description, the above is an exemplary case where the first pixel circuit 210B1 to the fifth pixel circuit 210B5 are disposed as the pixel circuit 210B, and the first selection transistor SEL1 to the fifth selection transistor SEL5 are disposed as the selection transistor SEL. Furthermore, the above is an exemplary case where the first vertical signal line switch SW1 to the third vertical signal line switch SW3 are disposed as the vertical signal line switch SW. However, the numbers of the pixel circuits 210B, the selection transistors SEL, and the vertical signal line switches SW are not limited thereto, and can be changed as appropriate.

Each of the pixel circuits 210A is electrically connected to the vertical signal line 543 connected to the first column signal processing unit 5501 and the second column signal processing unit 5502. The drain of the first selection transistor SEL1 of the first pixel circuit 210B1 is electrically connected to the source of the amplification transistor AMP in the first pixel circuit 210B1, while the source of the first selection transistor SEL1 is electrically connected to the vertical signal line 543. The drain of the second selection transistor SEL2 of the second pixel circuit 210B2 is connected to the source of the amplification transistor AMP in the second pixel circuit 210B2, while the source of the second selection transistor SEL is electrically connected to the vertical signal line 543. The drain of the third selection transistor SEL3 of the third pixel circuit 210B3 is electrically connected to the source of the amplification transistor AMP in the third pixel circuit 210B3, while the source of the third selection transistor SEL3 is electrically connected to the vertical signal line 543. The drain of the fourth selection transistor SEL4 of the fourth pixel circuit 210B4 is electrically connected to the source of the amplification transistor AMP in the fourth pixel circuit 210B4, while the source of the fourth selection transistor SEL4 is electrically connected to the vertical signal line 543. The drain of the fifth selection transistor SEL5 of the fifth pixel circuit 210B5 is electrically connected to the source of the amplification transistor AMP in the fifth pixel circuit 210B5, while the source of the fifth selection transistor SEL5 is electrically connected to the vertical signal line 543.

The plurality of vertical signal line switches SW is disposed on the vertical signal line 543 electrically connecting the selection transistor SEL with the column signal processing unit 550 of each pixel circuit 210B. Note that the vertical signal line switches SW may be disposed on the vertical signal line 543 at specific intervals, and can be appropriately changed. The vertical signal line switch SW is a normally-on SW. The vertical signal line switch SW on the signal path P of the vertical signal line 543 in which the pixel signal from the pixel circuit 210B to the column signal processing unit 550 has emerged is turned on. Among the vertical signal line switches SW disposed in the vertical signal line 543 other than the signal path P, the vertical signal line switch SW connecting the signal path P to the vertical signal line 543 other than the signal path P is turned off. Among the vertical signal line switches SW disposed on the vertical signal lines 543 other than the signal path P, the vertical signal line switch SW closest to the column signal processing unit 550 on the opposite side of the readout side is turned off.

The first vertical signal line switch SW1 is disposed on the vertical signal line 543 between the first selection transistor SEL1 and the second selection transistor SEL2. The second vertical signal line switch SW2 is disposed on the vertical signal line 543 between the second selection transistor SEL2 and the third selection transistor SEL3. The third vertical signal line switch SW3 is arranged on the vertical signal line 543 between the third selection transistor SEL3 and the fourth selection transistor SEL4.

The pixel circuit 210B turns on the selection transistor SEL in the pixel circuit 210B according to the position of the pixel 541 to be selected. For example, here is an assumable case where the second selection transistor SEL2 of the second pixel circuit 210B2 and the third selection transistor SEL3 of the third pixel circuit 210B3 are turned on. In this case, the vertical signal line 543 from the second selection transistor SEL2 to the first column signal processing unit 5501 is a first signal path P1, while the vertical signal line 543 from the third selection transistor SEL3 to the second column signal processing unit 5502 is a second signal path P2. At this time, the second vertical signal line switch SW2 is turned off in order to disconnect the connection between the first signal path P1 and the vertical signal line 543 other than the first signal path P1 and to disconnect the connection between the second signal path P2 and the vertical signal line 543 other than the second signal path P2. That is, the first vertical signal line switch SW1 is turned on, the second vertical signal line switch SW2 is turned off, and the third vertical signal line switch SW3 is turned on.

As a result, in the first signal path P1, it is possible to reduce the influence of the parasitic capacitance of the vertical signal line 543 on the second column signal processing unit 5502 side subsequent to the second vertical signal line switch SW2 among the vertical signal lines 543 other than the first signal path P1. In addition, it is possible to reduce the influence of parasitic capacitance or the like of the third selection transistor SEL3 to the fifth selection transistor SEL5. In the second signal path P2, it is possible to reduce the influence of the parasitic capacitance of the vertical signal line 543 on the first column signal processing unit 5501 side subsequent to the second vertical signal line switch SW2 among the vertical signal lines 543 other than the second signal path P2. In addition, it is possible to reduce the influence of parasitic capacitance or the like of the first selection transistor SEL1 and the second selection transistor SEL2.

Figure 45:
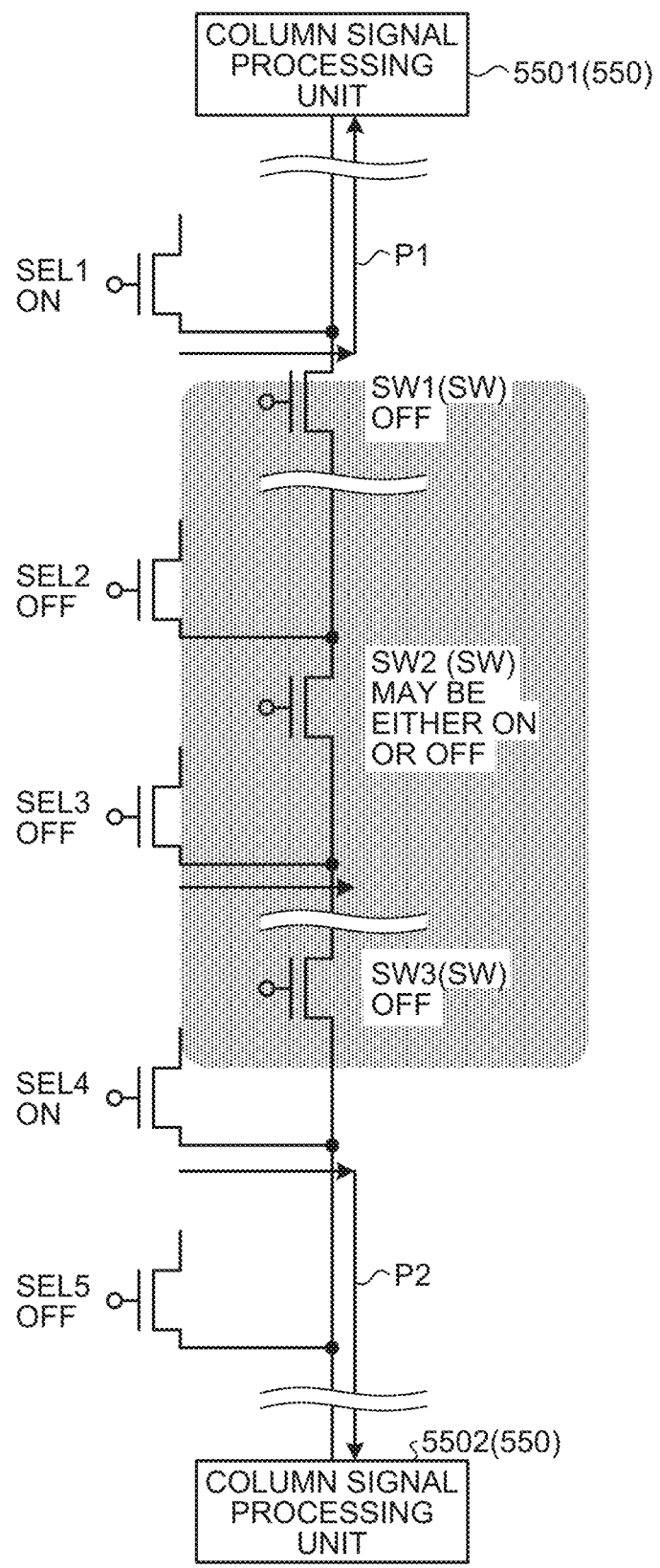
FIG. 45 is a diagram illustrating an example of a switching operation of the vertical signal line switch SW on the vertical signal line (turn-on of a first selection transistor SEL1 and a fourth selection transistor SEL4).

FIG. 45 is a diagram illustrating an example of switching operation of the vertical signal line switch SW on the vertical signal line 543 (turn-on of the first selection transistor SEL1 and the fourth selection transistor SEL4). For example, here is an assumable case where the first selection transistor SEL1 of the first pixel circuit 210B1 and the fourth selection transistor SEL4 of the fourth pixel circuit 210B4 are turned on. In this case, the vertical signal line 543 from the first selection transistor SEL1 to the first column signal processing unit 5501 is the first signal path P1, while the vertical signal line 543 from the fourth selection transistor SEL4 to the second column signal processing unit 5502 is the second signal path P2. At this time, the first vertical signal line switch SW1 electrically connecting the first signal path P1 to the vertical signal line 543 other than the first signal path P1 is turned off. Furthermore, the third vertical signal line switch SW3 electrically connecting the second signal path P2 to the vertical signal line 543 other than the second signal path P2 is turned off. That is, the first vertical signal line switch SW1 is turned off, the second vertical signal line switch SW2 is turned on, and the third vertical signal line switch SW3 is turned off. For convenience of description, the second vertical signal line switch SW2 is turned on, but may be turned off, and can be appropriately changed.

As a result, in the first signal path P1, it is possible to reduce the influence of the parasitic capacitance of the vertical signal line 543 on the second column signal processing unit 5502 side subsequent to the first vertical signal line switch SW1 among the vertical signal lines 543 other than the first signal path P1. In addition, it is possible to reduce the influence of parasitic capacitance or the like of the second selection transistor SEL2 to the fifth selection transistor SEL5. In the second signal path P2, it is possible to reduce the influence of the parasitic capacitance of the vertical signal line 543 on the first column signal processing unit 5501 side subsequent to the third vertical signal line switch SW3 among the vertical signal lines 543 other than the second signal path P2. Furthermore, it is possible to reduce the influence of parasitic capacitance or the like of the first selection transistor SEL1 to the third selection transistor SEL3.

10.4.2 Operation and Effect of Embodiment 3-2

In the imaging device 1 of Embodiment 3-2, the pixel signal from the pixel circuit 210B is detected by the first column signal processing unit 5501 through the first signal path P1 on the vertical signal line 543. Furthermore, in the imaging device 1, the second column signal processing unit 5502 detects a pixel signal from another pixel circuit 210B through the second signal path P2 on the vertical signal line 543. The first signal path P1 connected to the first column signal processing unit 5501 turns off the vertical signal line switch SW that connects the first signal path P1 to the vertical signal line 543 other than the first signal path P1. As a result, it is possible to reduce the influence of the parasitic capacitance of the vertical signal line 543 on the first column signal processing unit 5501 side subsequent to the vertical signal line switch SW, the parasitic capacitance of the selection transistor SEL, and the like. Additionally, the VSL waveform rounding on the first signal path P1 can be reduced.

Furthermore, the second signal path P2 connected to the second column signal processing unit 5502 turns off the vertical signal line switch SW that connects the second signal path P2 to the vertical signal line 543 other than the second signal path P2. As a result, it is possible to reduce the influence of the parasitic capacitance of the vertical signal line 543 on the second column signal processing unit 5502 side subsequent to the vertical signal line switch SW, the parasitic capacitance of the selection transistor SEL, and the like. Additionally, the VSL waveform rounding on the second signal path P2 can be reduced.

Moreover, by selectively using, among the plurality of vertical signal line switches SW on the vertical signal line 543, the optimal drive corresponding to the portion where the vertical signal line switch SW is turned off, the LM current is applied when reading out the pixel signal of the pixel circuit 210A farthest from the column signal processing unit 550. As a result, when reading out the pixel signal of the pixel circuit 210A close to the column signal processing unit 550, it is possible to reduce the VSL waveform rounding, with achievement of shortened drive pulse or reduction of the consumption of the LM current.

For convenience of description, the above has described an exemplary case where the vertical signal line switch SW of Example 2 is an N-type metal-oxide-semiconductor (MOS) transistor that is a normally-on SW. However, the vertical signal line switch SW is not limited to this, and may be a P-type MOS transistor, and can be appropriately changed.

10.5 Specific Example of Embodiment 3-3

10.5.1 Configuration of Embodiment 3-3

Figure 46:
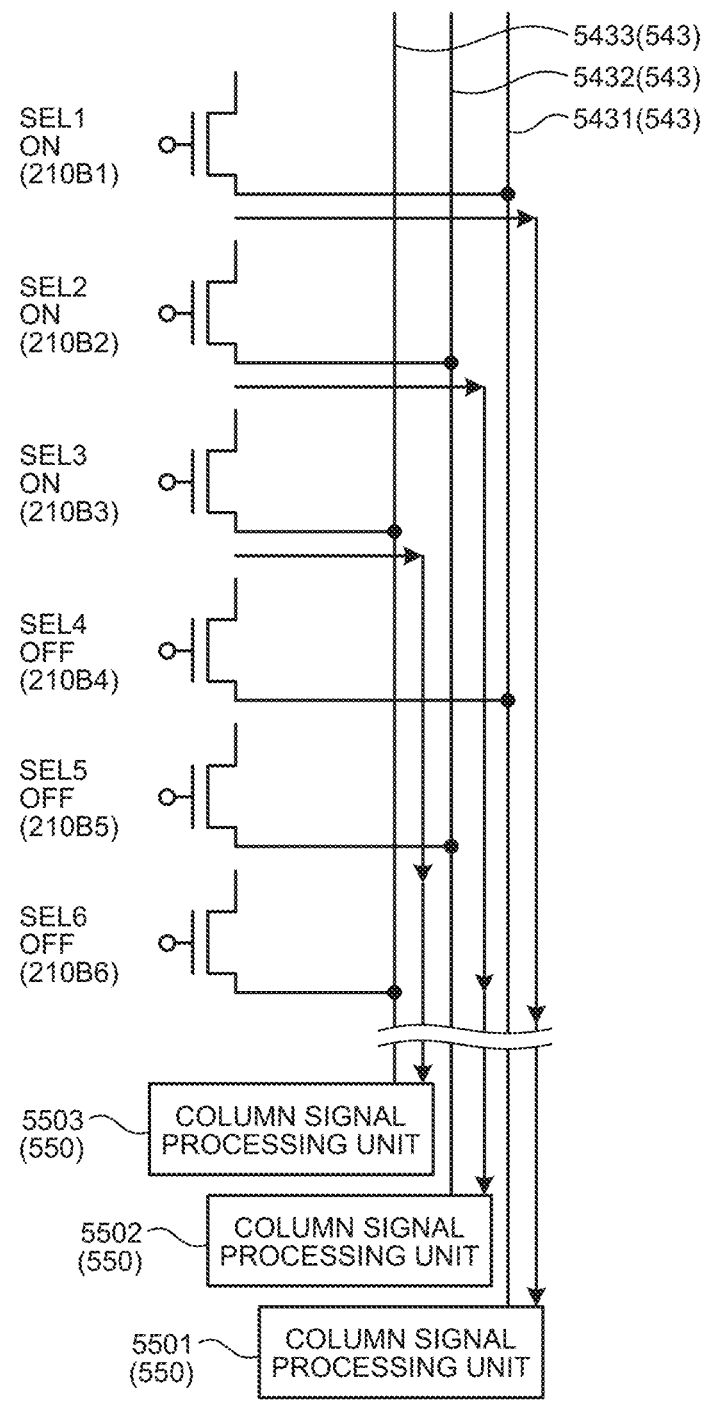
FIG. 46 is an equivalent circuit diagram illustrating an example of configurations of a selection transistor SEL and a column signal processing unit in a pixel circuit of Embodiment 3-3.

FIG. 46 is an equivalent circuit diagram illustrating an example of configurations of the selection transistor SEL and the column signal processing unit 550 in the pixel circuit 210B of Embodiment 3-3. Note that the same reference numerals are given to the same configurations as those of the Embodiment 3-1, and description of duplicated configurations and operations will be omitted.

In the imaging device 1 of Embodiment 3-3, the plurality of column signal processing units 550 is disposed on the third substrate 300, while the vertical signal lines 543 electrically connecting the pixel circuit 210B and the column signal processing unit 550 are arranged in parallel on the second substrate 200 for each of the column signal processing units 550. Each of the column signal processing units 550 can simultaneously read out the pixel signal from the pixel circuit 210B for each of the vertical signal lines 543 to be connected.

The third substrate 300 includes a plurality of column signal processing units 550, for example, a first column signal processing unit 5501 to a third column signal processing unit 5503. The second substrate 200 includes a plurality of pixel circuits 210B, for example, a first pixel circuit 210B1 to a sixth pixel circuit 210B6. Furthermore, the second substrate 200 includes a plurality of vertical signal lines 543, for example, a first vertical signal line 5431 to a third vertical signal line 5433. The first vertical signal line 5431 is electrically connected to the first selection transistor SEL1 and the fourth selection transistor SEL4. A second vertical signal line 5432 is electrically connected to the second selection transistor SEL2 and the fifth selection transistor SEL5. The third vertical signal line 5433 is electrically connected to the third selection transistor SEL3 and the sixth selection transistor SEL6. The first vertical signal line 5431, the second vertical signal line 5432, and the third vertical signal line 5433 are supposed to have the same number of connected selection transistors SEL connected for each of the vertical signal lines 543, with the same the wiring length. Therefore, the parasitic capacitance and the parasitic resistance of the vertical signal line 543 are supposed to be also equivalent for each of the vertical signal lines 543.

The drain of the first selection transistor SEL1 of the first pixel circuit 210B1 is electrically connected to the source of the amplification transistor AMP in the first pixel circuit 210B1, and the source of the first selection transistor SEL1 is electrically connected to the first vertical signal line 5431. The drain of the fourth selection transistor SEL4 of the fourth pixel circuit 210B4 is to be electrically connected to the source of the amplification transistor AMP in the fourth pixel circuit 210B4, while the source of the fourth selection transistor SEL4 is to be electrically connected to the first vertical signal line 5431. Note that the first vertical signal line 5431 is electrically connected to the first column signal processing unit 5501.

The drain of the second selection transistor SEL2 of the second pixel circuit 210B2 is to be electrically connected to the source of the amplification transistor AMP in the second pixel circuit 210B2, while the source of the second selection transistor SEL2 is to be electrically connected to the second vertical signal line 5432. The drain of the fifth selection transistor SEL5 of the fifth pixel circuit 210B5 is to be electrically connected to the source of the amplification transistor AMP in the fifth pixel circuit 210B5, while the source of the fifth selection transistor SEL5 is to be electrically connected to the second vertical signal line 5432. The second vertical signal line 5432 is electrically connected to the second column signal processing unit 5502.

The drain of the third selection transistor SEL3 of the third pixel circuit 210B3 is to be electrically connected to the source of the amplification transistor AMP in the third pixel circuit 210B3, while the source of the third selection transistor SEL3 is to be electrically connected to the third vertical signal line 5433. The drain of the sixth selection transistor SEL6 of the sixth pixel circuit 210B6 is electrically connected to the source of the amplification transistor AMP in the sixth pixel circuit 210B6, while the source of the sixth selection transistor SEL6 is electrically connected to the third vertical signal line 5433. The third vertical signal line 5433 is electrically connected to the third column signal processing unit 5503.

For example, when the first selection transistor SEL1 is turned on, the first pixel circuit 210B1 causes the pixel signal from the first selection transistor SEL1 to emerge in the first vertical signal line 5431. The first column signal processing unit 5501 detects the pixel signal emerging in the first vertical signal line 5431. Furthermore, when the second selection transistor SEL2 is turned on, for example, the second pixel circuit 210B2 causes the pixel signal from the second selection transistor SEL2 to emerge in the second vertical signal line 5432. The second column signal processing unit 5502 detects the pixel signal emerging in the second vertical signal line 5432. Furthermore, for example, when the third selection transistor SEL3 is turned on, the third pixel circuit 210B3 causes the pixel signal from the third selection transistor SEL3 to emerge in the third vertical signal line 5433. The third column signal processing unit 5503 detects the pixel signal emerging in the third vertical signal line 5433. That is, the individual column signal processing units 550 can simultaneously detect the pixel signals of the three pixel circuits 210B using the three vertical signal lines 543.

10.5.2 Operation and Effect of Embodiment 3-3

In the imaging device 1 of Embodiment 3-3, since individual vertical signal lines 543 equally divide and arrange the selection transistors SEL of the connected pixel circuits 210B, the parasitic capacitance values of the signal paths P connecting the selection transistors SEL and the column signal processing unit 550 are equivalent. As a result, there is no need to selectively use a plurality of drive modes. Moreover, the individual column signal processing units 550 can simultaneously detect the pixel signals from the pixel circuit 210B via the vertical signal lines 543, leading to improvement of the frame rate of the output image. In addition, there is no need to apply a plurality of LM currents according to the positions of the readout pixel.

In the imaging device 1, it is possible to improve the frame rate by simultaneously reading out a plurality of pixel signals in a circuit configuration in which a plurality of vertical signal lines 543 is arranged in parallel by utilizing the layout margin of the second substrate 200 having a three-layer structure.

Although Embodiment 3-3 has described an exemplary case where three vertical signal lines 543 are arranged in parallel, the number is not limited to three, and the number of vertical signal lines 543 may be increased according to the number of column signal processing units 550, and can be appropriately changed.

In the embodiments and modifications of the present disclosure, examples of a method of forming individual layers, films, elements, and the like described above include a physical vapor deposition (PVD) method, a CVD method, and the like. Examples of the PVD method include a vacuum vapor deposition method using resistance heating or high frequency heating, an electron beam (EB) vapor deposition method, various sputtering methods (magnetron sputtering method, an RF-DC coupled bias sputtering method, an electron cyclotron resonance (ECR) sputtering method, a facing target sputtering method, a high frequency sputtering method, and the like), an ion plating method, a laser ablation method, and a molecular beam epitaxy (MBE) method, a laser transfer method, and the like. Examples of the CVD method include a plasma CVD method, a thermal CVD method, an MOCVD method, and an optical CVD method. Furthermore, other methods include an electrolytic plating method, an electroless plating method, and a spin coating method; immersion method; casting method; micro-contact printing; drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendering coater method. Examples of a patterning method of individual layers include: chemical etching such as shadow mask, laser transfer, and photolithography; and physical etching using ultraviolet rays, laser, and the like. In addition, examples of the planarization technique include a CMP method, a laser planarization method, and a reflow method. That is, the solid-state imaging device 1 according to the embodiment and the modification of the present disclosure can be easily and inexpensively manufactured using an existing semiconductor device manufacturing process.

Furthermore, regarding the second substrate 200, the above is an example in which the amplification transistor AMP, the reset transistor RST, and the selection transistor SEL that can constitute the readout circuit are formed on a same semiconductor substrate. However, at least one transistor may be formed on a semiconductor substrate, and the remaining transistors may be formed on a second semiconductor substrate different from the semiconductor substrate or the first semiconductor substrate. In the second semiconductor substrate, although not illustrated, for example, an insulating layer, a connection portion, and connected wiring are formed on a semiconductor substrate, on which the second semiconductor substrate is further stacked. The new semiconductor substrate it to be stacked on the surface of the interlayer insulating film opposite to the surface stacked on the first semiconductor substrate, enabling formation of desired transistors. As an example, it is possible to form the amplification transistor AMP on the semiconductor substrate and form the reset transistor RST and/or the selection transistor SEL on the second semiconductor substrate.

In addition, a plurality of new semiconductor substrates may be provided, and transistors of a desired readout circuit may be provided in each of the semiconductor substrates. As an example, the amplification transistor AMP can be formed on a semiconductor substrate. Furthermore, by stacking the insulating layer, the connection portion, and the connected wiring on the semiconductor substrate and further stacking the second semiconductor substrate on the semiconductor substrate, it is possible to form the reset transistor RST on the second semiconductor substrate. By staking the insulating layer, the connection portion, and the connected wiring on the second semiconductor substrate and further stacking the third semiconductor substrate on the second semiconductor substrate, it is possible to form the selection transistor SEL on the third semiconductor substrate. The transistors formed on the semiconductor substrate, the second semiconductor substrate, and the third semiconductor substrate may be any transistor constituting the readout circuit.

In this manner, with the configuration having the plurality of semiconductor substrates provided on the second substrate 200, it is possible to reduce the area of the semiconductor substrate used for one readout circuit. Reduction of the area of individual readout circuits and miniaturization of individual transistors leads to reduction of the area of the chip. In addition, it is possible to increase the area of a desired transistor among the amplification transistor, the reset transistor, and the selection transistor that can constitute the readout circuit. In particular, by enlarging the area of the amplification transistor, a noise reduction effect can also be expected.

11. Application Examples

Figure 47:
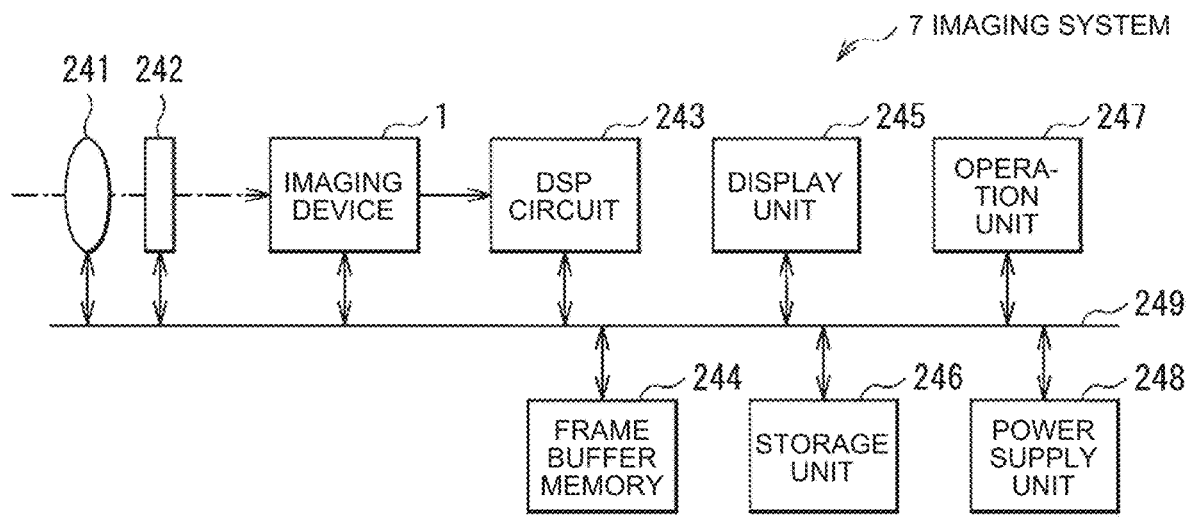
FIG. 47 is a diagram illustrating an example of a schematic configuration of an imaging system including the imaging device according to the embodiments and their modifications.

FIG. 47 is a diagram illustrating an example of a schematic configuration of an imaging system 7 including the imaging device 1 according to the embodiments and their modifications.

The imaging system 7 is an electronic device exemplified by an imaging device such as a digital still camera or a video camera, or a portable terminal device such as a smartphone or a tablet terminal. The imaging system 7 includes, for example, the imaging device 1, a DSP circuit 243, frame buffer memory 244, a display unit 245, a storage unit 246, an operation unit 247, and a power supply unit 248 according to the above-described embodiments and their modifications. In the imaging system 7, the imaging device 1, the DSP circuit 243, the frame buffer memory 244, the display unit 245, the storage unit 246, the operation unit 247, and the power supply unit 248 according to the above-described embodiments and their modifications are connected to each other via a bus line 249.

The imaging device 1 according to the above-described embodiments and their modifications outputs image data corresponding to incident light. The DSP circuit 243 is a signal processing circuit that processes a signal (image data) output from the imaging device 1 according to the above-described embodiments and their modifications. The frame buffer memory 244 temporarily holds, in units of frames, the image data processed by the DSP circuit 243. The display unit 245 includes, for example, a panel type display device such as a liquid crystal panel or an organic Electro Luminescence (EL) panel, and displays a moving image or a still image captured by the imaging device 1 according to the above embodiments and their modifications. The storage unit 246 records image data of a moving image or a still image captured by the imaging device 1 according to the above-described embodiments and their modifications in a recording medium such as a semiconductor memory device or a hard disk. The operation unit 247 issues operation commands for various functions of the imaging system 7 in accordance with an operation by the user. The power supply unit 248 appropriately supplies various types of power as operation power of the imaging device 1, the DSP circuit 243, the frame buffer memory 244, the display unit 245, the storage unit 246, and the operation unit 247 according to the above-described embodiments and their modifications to these supply targets.

Next, an imaging procedure in the imaging system 7 will be described.

Figure 48:
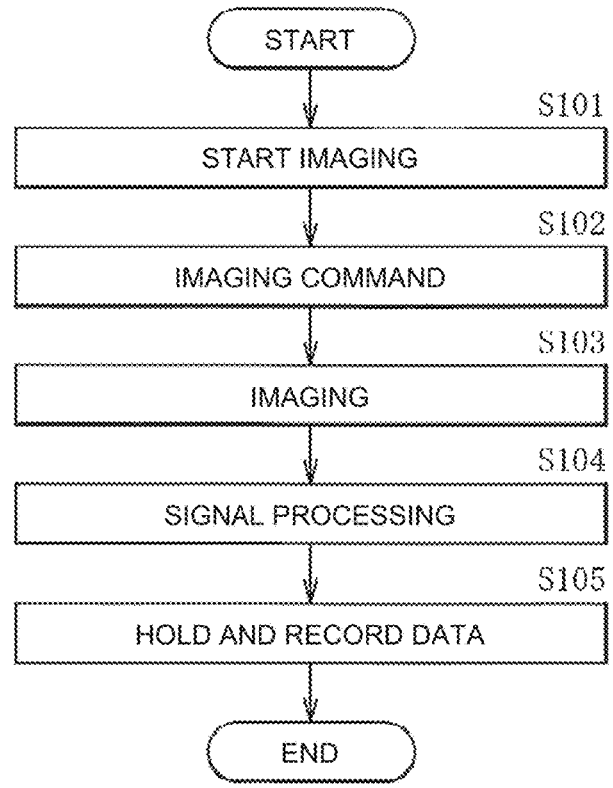
FIG. 48 is a diagram illustrating an example of an imaging procedure of the imaging system illustrated in FIG. 47.

FIG. 48 illustrates an example of a flowchart of an imaging operation in the imaging system 7. A user gives an instruction on start of imaging by operating the operation unit 247 (Step S101). In response to this, the operation unit 247 transmits an imaging command to the imaging device 1 (Step S102). Having received the imaging command, the imaging device 1 (specifically, a system control circuit 36) executes imaging by a predetermined imaging method (Step S103).

The imaging device 1 outputs image data obtained by the imaging to the DSP circuit 243. Here, the image data represents data for all the pixels of the pixel signal generated based on the charge temporarily held in the floating diffusion FD. The DSP circuit 243 performs predetermined signal processing (for example, noise reduction processing) based on the image data input from the imaging device 1 (Step S104). The DSP circuit 243 causes the frame buffer memory 244 to hold the image data that has undergone the predetermined signal processing, and then, the frame buffer memory 244 causes the storage unit 246 to store the image data (Step S105). In this manner, imaging in the imaging system 7 is performed.

In the present application example, the imaging device 1 according to the above-described embodiments and their modifications is applied to the imaging system 7. Accordingly, downsizing or high definition of the imaging device 1 can be achieved, making it possible to provide the downsized or high definition imaging system 7.

12. Examples of Application of Pixel Circuit to Products

Examples of Applications to Products 1

The technology according to the present disclosure (the present technology) is applicable to various products. The technology according to the present disclosure may be applied to devices mounted on any time of moving objects such as automobiles, electric vehicles, hybrid electric vehicles, motorcycles, bicycles, personal mobility, airplanes, drones, ships, and robots.

Figure 49:
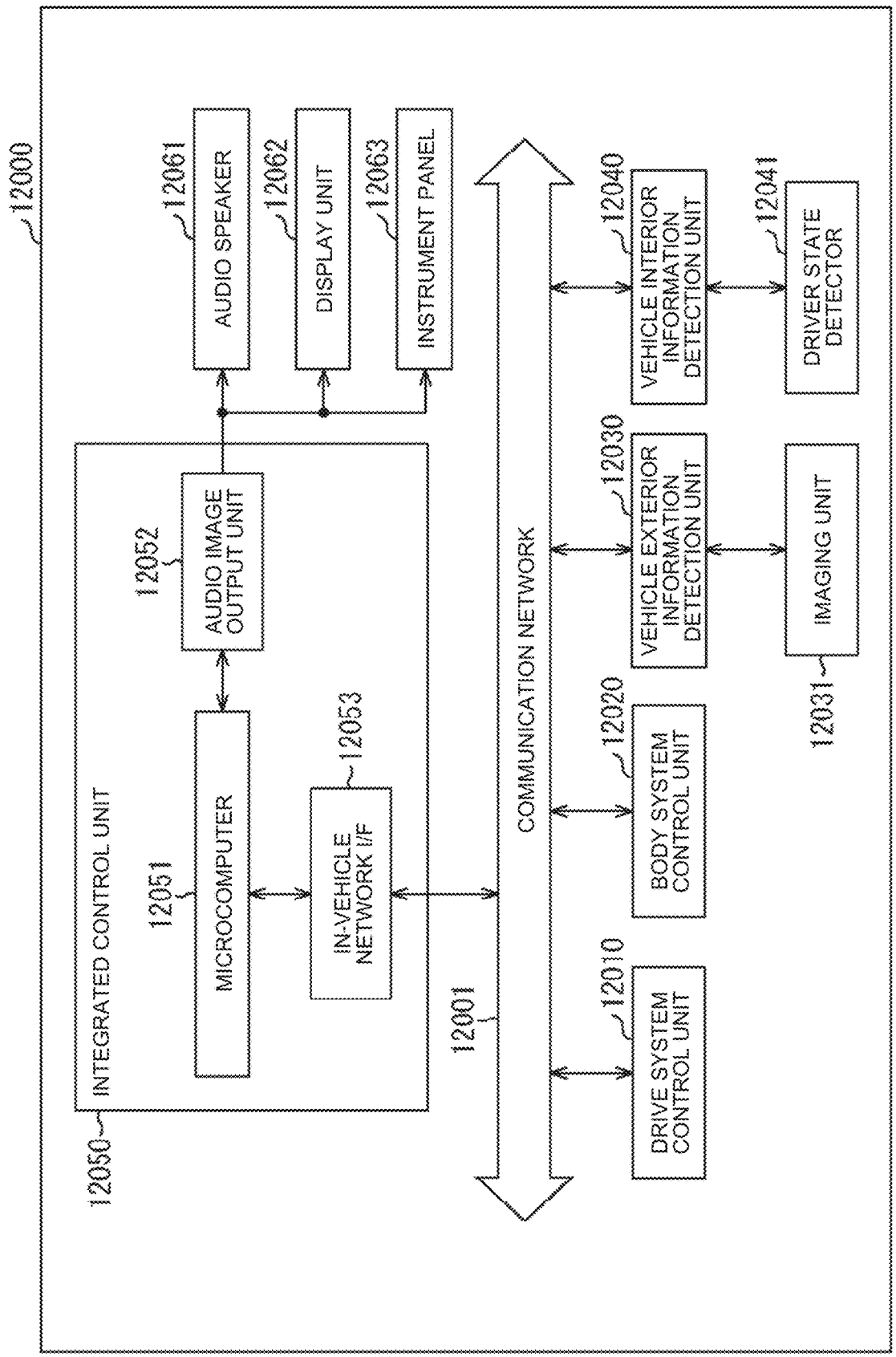
FIG. 49 is a block diagram illustrating an example of a schematic configuration of a vehicle control system.

FIG. 49 is a block diagram illustrating a schematic configuration example of a vehicle control system, which is an example of a moving body control system to which the technique according to the present disclosure is applicable.

A vehicle control system 12000 includes a plurality of electronic control units connected via a communication network 12001. In the example illustrated in FIG. 49, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, an audio image output unit 12052, and an in-vehicle network interface (I/F) 12053 are illustrated.

The drive system control unit 12010 controls the operation of the device related to the drive system of the vehicle in accordance with various programs. For example, the drive system control unit 12010 functions as a control device of a driving force generation device that generates a driving force of a vehicle such as an internal combustion engine or a driving motor, a driving force transmission mechanism that transmits a driving force to the wheels, a steering mechanism that adjusts steering angle of the vehicle, a braking device that generates a braking force of the vehicle, or the like.

The body system control unit 12020 controls the operation of various devices mounted on the vehicle body in accordance with various programs. For example, the body system control unit 12020 functions as a control device for a keyless entry system, a smart key system, a power window device, or various lamps such as a head lamp, a back lamp, a brake lamp, a turn signal lamp, or a fog lamp. In this case, the body system control unit 12020 can receive input of radio waves transmitted from a portable device that substitutes for the key or signals from various switches. The body system control unit 12020 receives the input of these radio waves or signals and controls the door lock device, the power window device, the lamp, and the like, of the vehicle.

The vehicle exterior information detection unit 12030 detects information outside the vehicle equipped with the vehicle control system 12000. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform an object detection process or a distance detection process of people, vehicles, obstacles, signs, or characters on the road surface based on the received image.

The imaging unit 12031 is an optical sensor that receives light and outputs an electrical signal corresponding to the amount of received light. The imaging unit 12031 can output the electric signal as an image and also as distance measurement information. Furthermore, the light received by the imaging unit 12031 may be visible light or invisible light such as infrared light.

The vehicle interior information detection unit 12040 detects vehicle interior information. The vehicle interior information detection unit 12040 is connected to a driver state detector 12041 that detects the state of the driver, for example. The driver state detector 12041 may include a camera that images the driver, for example. The vehicle interior information detection unit 12040 may calculate the degree of fatigue or degree of concentration of the driver or may determine whether the driver is dozing off based on the detection information input from the driver state detector 12041.

The microcomputer 12051 can calculate a control target value of the driving force generation device, the steering mechanism, or the braking device based on vehicle external/internal information obtained by the vehicle exterior information detection unit 12030 or the vehicle interior information detection unit 12040, and can output a control command to the drive system control unit 12010. For example, the microcomputer 12051 can perform cooperative control for the purpose of achieving a function of an advanced driver assistance system (ADAS) including collision avoidance or impact mitigation of vehicles, follow-up running based on an inter-vehicle distance, cruise control, vehicle collision warning, vehicle lane departure warning, or the like.

Furthermore, it is allowable such that the microcomputer 12051 controls the driving force generation device, the steering mechanism, the braking device, or the like, based on the information regarding the surroundings of the vehicle obtained by the vehicle exterior information detection unit 12030 or the vehicle interior information detection unit 12040, thereby performing cooperative control for the purpose of autonomous driving or the like, in which the vehicle performs autonomous traveling without depending on the operation of the driver.

Furthermore, the microcomputer 12051 can output a control command to the body system control unit 12020 based on the vehicle exterior information acquired by the vehicle exterior information detection unit 12030. For example, the microcomputer 12051 can control the head lamp in accordance with the position of the preceding vehicle or the oncoming vehicle sensed by the vehicle exterior information detection unit 12030, and thereby can perform cooperative control aiming at antiglare such as switching the high beam to low beam.

The audio image output unit 12052 transmits an output signal in the form of at least one of audio or image to an output device capable of visually or audibly notifying the occupant of the vehicle or the outside of the vehicle of information. In the example of FIG. 49, an audio speaker 12061, a display unit 12062, and an instrument panel 12063 are illustrated as exemplary output devices. The display unit 12062 may include, for example, at least one of an onboard display and a head-up display.

Figure 50:
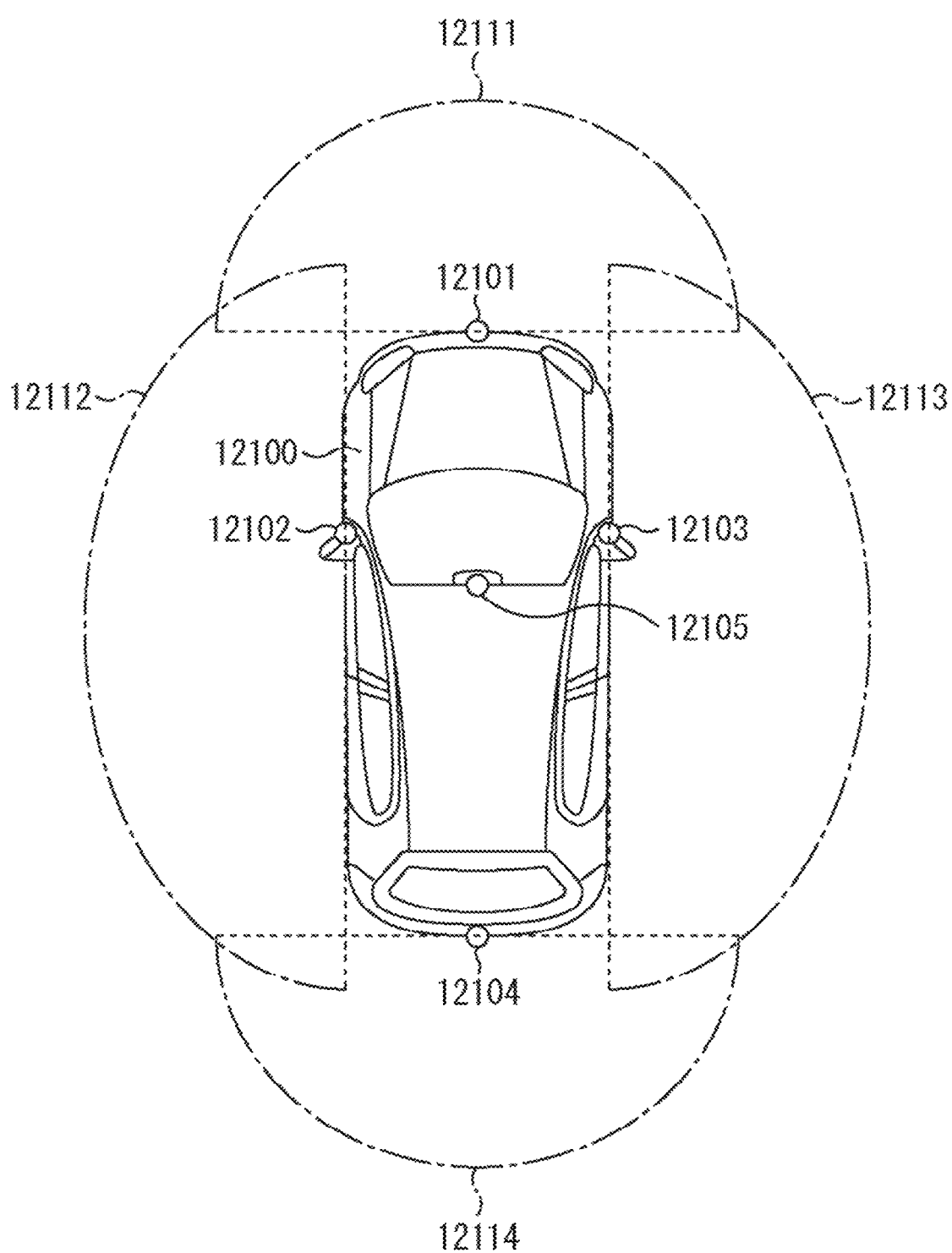
FIG. 50 is a diagram illustrating an example of installation positions of a vehicle exterior information detector and an imaging unit.

FIG. 50 is a diagram illustrating an example of an installation position of the imaging unit 12031.

In FIG. 50, a vehicle 12100 has imaging units 12101, 12102, 12103, 12104 and 12105 as the imaging units 12031.

For example, the imaging units 12101, 12102, 12103, 12104, and 12105 are installed at positions on a vehicle 12100, including a front nose, a side mirror, a rear bumper, a back door, an upper portion of the windshield in a vehicle interior, or the like. The imaging unit 12101 provided on the front nose and the imaging unit 12105 provided on the upper portion of the windshield in the vehicle interior mainly acquire an image in front of the vehicle 12100. The imaging units 12102 and 12103 provided in the side mirrors mainly acquire images of the side of the vehicle 12100. The imaging unit 12104 provided on the rear bumper or the back door mainly acquires an image behind the vehicle 12100. The images in front acquired by the imaging units 12101 and 12105 are mainly used for detecting a preceding vehicle or a pedestrian, an obstacle, a traffic light, a traffic sign, a lane, or the like.

Note that FIG. 50 illustrates an example of the imaging range of the imaging units 12101 to 12104. An imaging range 12111 indicates an imaging range of the imaging unit 12101 provided on the front nose, imaging ranges 12112 and 12113 indicate imaging ranges of the imaging units 12102 and 12103 provided on the side mirrors, respectively, and an imaging range 12114 indicates an imaging range of the imaging unit 12104 provided on the rear bumper or the back door. For example, by superimposing pieces of image data captured by the imaging units 12101 to 12104, it is possible to obtain a bird's-eye view image of the vehicle 12100 as viewed from above.

At least one of the imaging units 12101 to 12104 may have a function of acquiring distance information. For example, at least one of the imaging units 12101 to 12104 may be a stereo camera including a plurality of imaging elements, or an imaging element including pixels for phase difference detection.

For example, the microcomputer 12051 can calculate a distance to each of three-dimensional objects in the imaging ranges 12111 to 12114 and a temporal change (relative speed with respect to the vehicle 12100) of the distance based on the distance information obtained from the imaging units 12101 to 12104, and thereby can extract a three-dimensional object traveling at a predetermined speed (for example, 0 km/h or more) in substantially the same direction as the vehicle 12100 being the closest three-dimensional object on the traveling path of the vehicle 12100, as a preceding vehicle. Furthermore, the microcomputer 12051 can set an inter-vehicle distance to be ensured in front of the preceding vehicle in advance, and can perform automatic brake control (including follow-up stop control), automatic acceleration control (including follow-up start control), or the like. In this manner, it is possible to perform cooperative control for the purpose of autonomous driving or the like, in which the vehicle autonomously travels without depending on the operation of the driver.

For example, based on the distance information obtained from the imaging units 12101 to 12104, the microcomputer 12051 can extract three-dimensional object data regarding the three-dimensional object with classification into three-dimensional objects, such as a two-wheeled vehicle, a regular vehicle, a large vehicle, a pedestrian, and other three-dimensional objects such as a utility pole, and can use the data for automatic avoidance of obstacles. For example, the microcomputer 12051 distinguishes obstacles around the vehicle 12100 into obstacles having high visibility to the driver of the vehicle 12100 and obstacles having low visibility to the driver. Subsequently, the microcomputer 12051 determines a collision risk indicating the risk of collision with each of obstacles. When the collision risk is a set value or more and there is a possibility of collision, the microcomputer 12051 can output an alarm to the driver via the audio speaker 12061 and the display unit 12062, and can perform forced deceleration and avoidance steering via the drive system control unit 12010, thereby achieving driving assistance for collision avoidance.

At least one of the imaging units 12101 to 12104 may be an infrared camera that detects infrared rays. For example, the microcomputer 12051 can recognize a pedestrian by determining whether a pedestrian is present in the captured images of the imaging units 12101 to 12104. Such pedestrian recognition is performed, for example, by a procedure of extracting feature points in a captured image of the imaging units 12101 to 12104 as an infrared camera, and by a procedure of performing pattern matching processing on a series of feature points indicating the contour of the object to discriminate whether or not it is a pedestrian. When the microcomputer 12051 determines that a pedestrian is present in the captured images of the imaging units 12101 to 12104 and recognizes a pedestrian, the audio image output unit 12052 causes the display unit 12062 to perform superimposing display of a rectangular contour line for emphasis to the recognized pedestrian. Furthermore, the audio image output unit 12052 may cause the display unit 12062 to display an icon indicating a pedestrian or the like at a desired position.

Hereinabove, an example of the moving body control system to which the technology according to the present disclosure is applicable has been described. The technique according to the present disclosure can be suitably applied to, for example, the imaging unit 12031 among the configurations described above. Specifically, the imaging device 1 according to the above-described embodiments and their modifications is applicable to the imaging unit 12031. By applying the technology according to the present disclosure to the imaging unit 12031, it is possible to obtain a high-definition photographic image with little noise, leading to achievement of high-accuracy control using the photographic image in the moving body control system.

Examples of Applications to Products 2

Figure 51:
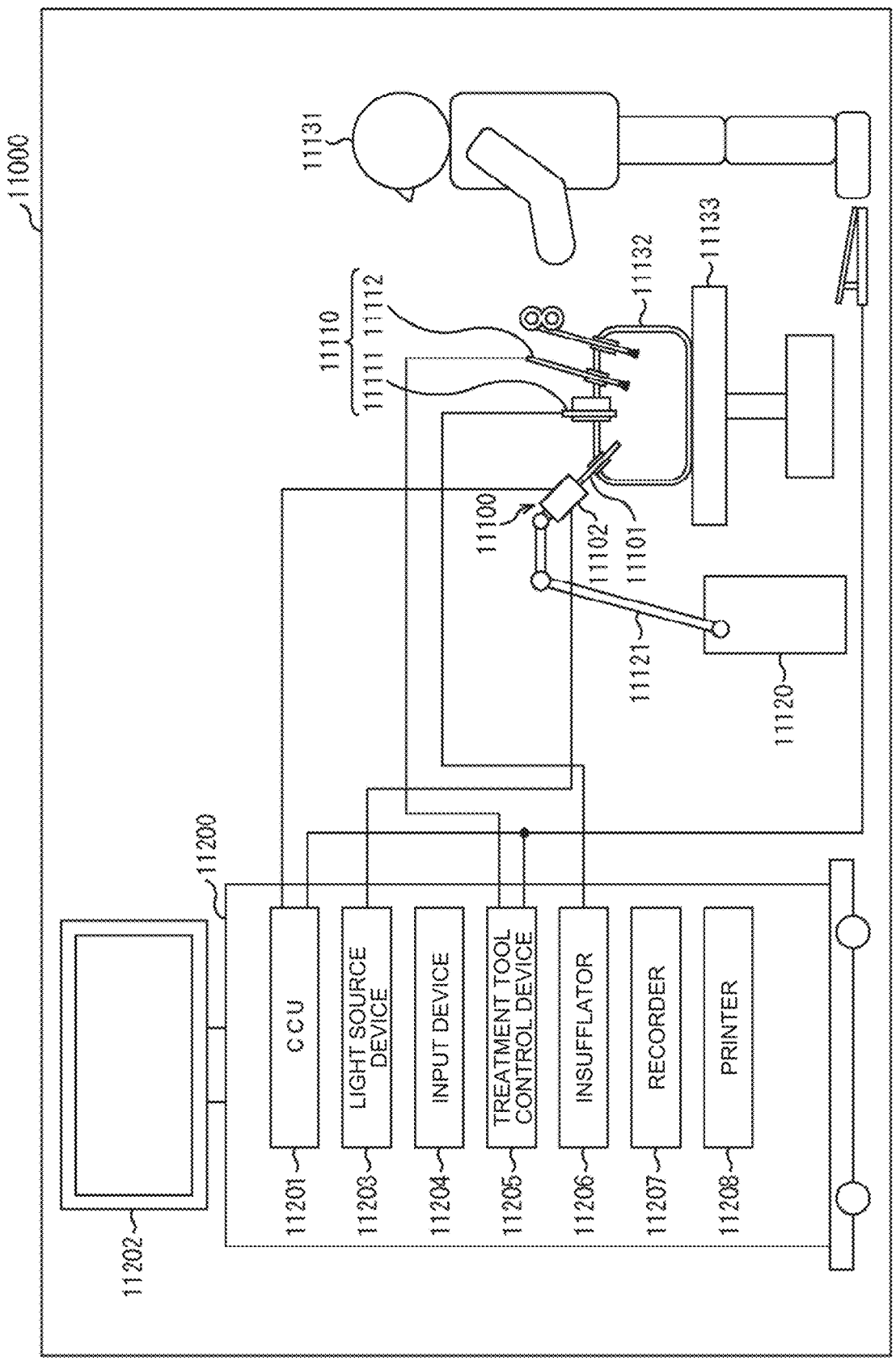
FIG. 51 is a diagram illustrating an example of a schematic configuration of an endoscopic surgery system.

FIG. 51 is a view illustrating an example of a schematic configuration of an endoscopic surgery system to which the technique (the present technology) according to the present disclosure is applicable.

FIG. 51 illustrates a scene in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 equipped with various devices for endoscopic surgery.

The endoscope 11100 includes: a lens barrel 11101, a region of a predetermined length from a distal end of which is to be inserted into the body cavity of the patient 11132; and a camera head 11102 connected to a proximal end of the lens barrel 11101. The example in the figure illustrates the endoscope 11100 as a rigid endoscope having the lens barrel 11101 of a rigid type. However, the endoscope 11100 can be a flexible endoscope having a flexible lens barrel.

The distal end of the lens barrel 11101 has an opening to which an objective lens is fitted. The endoscope 11100 is connected to a light source device 11203. The light generated by the light source device 11203 is guided to the distal end of the lens barrel by a light guide extending inside the lens barrel 11101, and the guided light will be emitted toward an observation target in the body cavity of the patient 11132 through the objective lens. The endoscope 11100 may be a forward viewing endoscope, a forward-oblique viewing endoscope, or a side-viewing endoscope.

An optical system and an imaging element are provided inside the camera head 11102. Reflected light (observation light) from the observation target is focused on the imaging element by the optical system. The observation light is photoelectrically converted by the imaging element so as to generate an electric signal corresponding to the observation light, that is, an image signal corresponding to the observation image. The image signal is transmitted as RAW data to a camera control unit (CCU) 11201.

The CCU 11201 is formed with a central processing unit (CPU), a graphics processing unit (GPU), or the like, and integrally controls operations of the endoscope 11100 and a display device 11202. Furthermore, the CCU 11201 receives an image signal from the camera head 11102, and performs various image processing on the image signal for displaying an image based on the image signal, such as developing processing (demosaicing).

Under the control of the CCU 11201, the display device 11202 displays an image based on the image signal that has undergone image processing by the CCU 11201.

The light source device 11203 includes a light source such as Light Emitting Diode (LED), for example, and supplies the irradiation light for imaging the surgical site or the like to the endoscope 11100.

An input device 11204 is an input interface to the endoscopic surgery system 11000. The user can input various types of information and input instructions to the endoscopic surgery system 11000 via the input device 11204. For example, the user inputs an instruction to change the imaging conditions (type of irradiation light, magnification, focal length, and the like) by the endoscope 11100.

A treatment tool control device 11205 controls the drive of the energy treatment tool 11112 for ablation or dissection of tissue, sealing of blood vessels, or the like. In order to inflate the body cavity of the patient 11132 to ensure a view field for the endoscope 11100 and to ensure a working space of the surgeon, an insufflator 11206 pumps gas into the body cavity through an insufflation tube 11111. A recorder 11207 is a device capable of recording various types of information associated with the surgery. A printer 11208 is a device capable of printing various types of information associated with surgery in various forms such as text, images, and graphs.

The light source device 11203 that supplies the endoscope 11100 with irradiation light when imaging a surgical site can be constituted with, for example, an LED, a laser light source, or a white light source with a combination of these. In a case where the white light source is constituted with the combination of the RGB laser light sources, it is possible to control the output intensity and the output timing of individual colors (individual wavelengths) with high accuracy. Accordingly, it is possible to perform white balance adjustment of the captured image on the light source device 11203. Furthermore, in this case, by emitting the laser light from each of the RGB laser light sources to an observation target on the time division basis and by controlling the drive of the imaging element of the camera head 11102 in synchronization with the light emission timing, it is also possible to capture the image corresponding to each of RGB colors on the time-division basis. According to this method, a color image can be obtained without providing a color filter on the imaging element.

Furthermore, the drive of the light source device 11203 may be controlled so as to change the intensity of the output light at predetermined time intervals. With the control of the drive of the imaging element of the camera head 11102 in synchronization with the timing of the change of the intensity of the light so as to obtain images on the time division basis and combine the images, it is possible to generate an image with high dynamic range without so called blackout shadows or blown out highlights (overexposure).

Furthermore, the light source device 11203 may be configured to be able to supply light in a predetermined wavelength band corresponding to special light observation. The special light observation is used to perform narrowband light observation (narrow band imaging). The narrowband light observation uses the wavelength dependency of the light absorption in the body tissue and emits light in a narrower band compared with the irradiation light (that is, white light) at normal observation, thereby imaging a predetermined tissue such as a blood vessel of the mucosal surface layer with high contrast. Alternatively, the special light observation may include fluorescence observation to obtain an image by fluorescence generated by emission of excitation light. Fluorescence observation can be performed to observe fluorescence emitted from a body tissue to which excitation light is applied (autofluorescence observation), and can be performed with topical administration of reagent such as indocyanine green (ICG) to the body tissue, and together with this, excitation light corresponding to the fluorescence wavelength of the reagent is emitted to the body tissue to obtain a fluorescent image, or the like. The light source device 11203 can be configured to be able to supply narrow band light and/or excitation light corresponding to such special light observation.

Figure 52:
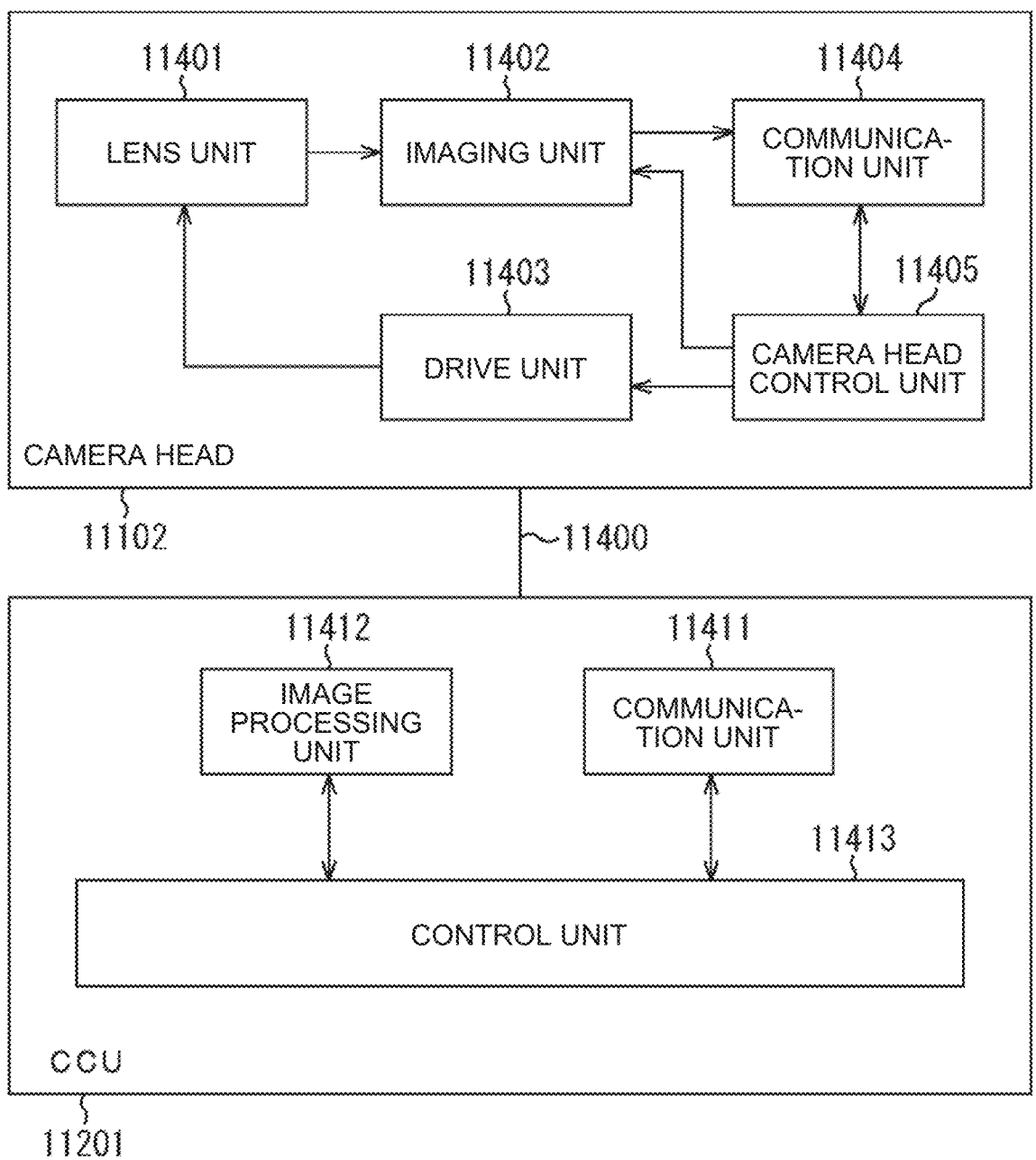
FIG. 52 is a block diagram illustrating an example of a functional configuration of a camera head and a CCU.

FIG. 52 is a block diagram illustrating an example of the functional configuration of the camera head 11102 and the CCU 11201 illustrated in FIG. 51.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected to each other by a transmission cable 11400.

The lens unit 11401 is an optical system provided at a connection portion with the lens barrel 11101. The observation light captured from the distal end of the lens barrel 11101 is guided to the camera head 11102 so as to be incident on the lens unit 11401. The lens unit 11401 is formed by a combination of a plurality of lenses including a zoom lens and a focus lens.

The imaging unit 11402 is constituted with an imaging element. The number of imaging elements forming the imaging unit 11402 may be one (single-plate type) or in plural (multi-plate type). When the imaging unit 11402 is a multi-plate type, for example, each of imaging elements may generate an image signal corresponding to one color of RGB, and a color image may be obtained by combining these individual color image signals. Alternatively, the imaging unit 11402 may include a pair of imaging elements for acquiring image signals individually for the right eye and the left eye corresponding to three-dimensional (3D) display. The 3D display enables a surgeon 11131 to grasp the depth of the living tissue more accurately in the surgical site. When the imaging unit 11402 is a multi-plate type, a plurality of the lens unit 11401 may be provided corresponding to each of the imaging elements.

Furthermore, the imaging unit 11402 does not necessarily have to be provided on the camera head 11102. For example, the imaging unit 11402 may be provided inside the lens barrel 11101 immediately behind the objective lens.

The drive unit 11403 includes an actuator, and moves the zoom lens and the focus lens of the lens unit 11401 by a predetermined distance along the optical axis under the control of the camera head control unit 11405. With this operation, the magnification and focus of the image captured by the imaging unit 11402 can be appropriately adjusted.

The communication unit 11404 includes a communication device for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201 and supplies the control signal to the camera head control unit 11405. The control signal includes information associated with imaging conditions, such as information designating a frame rate of a captured image, information designating an exposure value at the time of imaging, and/or information designating the magnification and focal point of the captured image.

Note that the imaging conditions such as the frame rate, the exposure value, the magnification, and the focus may be appropriately designated by the user, or may be automatically set by the control unit 11413 of the CCU 11201 based on the acquired image signal. In the latter case, an Auto Exposure (AE) function, an Auto Focus (AF) function, and an Auto White Balance (AWB) function are to be installed in the endoscope 11100.

The camera head control unit 11405 controls the drive of the camera head 11102 based on the control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electric communication, optical communication, or the like.

The image processing unit 11412 performs various image processing on the image signal which is the RAW data transmitted from the camera head 11102.

The control unit 11413 performs various controls related to the imaging of the surgical site or the like by the endoscope 11100 and related to the display of the captured image obtained by the imaging of the surgical site or the like. For example, the control unit 11413 generates a control signal for controlling the drive of the camera head 11102.

Furthermore, the control unit 11413 controls the display device 11202 to display the captured image including an image of a surgical site or the like based on the image signal that has undergone image processing by the image processing unit 11412. At this time, the control unit 11413 may recognize various objects in the captured image by using various image recognition techniques. For example, the control unit 11413 detects the shape, color, or the like of an edge of an object included in the captured image, making it possible to recognize a surgical tool such as forceps, a specific living body site, bleeding, a mist at the time of using the energy treatment tool 11112, or the like. When displaying the captured image on the display device 11202, the control unit 11413 may superimpose and display various surgical operation support information on the image of the surgical site by using the recognition result. By displaying the surgery support information in a superimposed manner so as to be presented to the surgeon 11131, it is possible to reduce the burden on the surgeon 11131 and enable the surgeon 11131 to proceed with the operation with higher reliability.

The transmission cable 11400 that connects the camera head 11102 and the CCU 11201 is an electric signal cable that supports electric signal communication, an optical fiber that supports optical communication, or a composite cable thereof.

Here, while an illustrated example in which wired communication is performed using the transmission cable 11400, the communication between the camera head 11102 and the CCU 11201 may be performed wirelessly.

An example of the endoscopic surgery system to which the technique according to the present disclosure can be applied has been described above. The technique according to the present disclosure can be appropriately applied to the imaging unit 11402 provided in the camera head 11102 of the endoscope 11100 among the configurations described above. Application of the technology according to the present disclosure to the imaging unit 11402, can achieve downsizing and high definition of the imaging unit 11402, making it possible to provide the endoscope 11100 having achieved downsizing or high definition.

Although the present disclosure has been described with reference to the exemplary embodiments, their modifications, application examples, and examples of application to various products, the present disclosure is not limited to the exemplary embodiments and the like, and various modifications can be made. Note that the effects described in the present specification are merely examples. The effects of the present disclosure are not limited to the effects described herein. The present disclosure may have effects other than those described herein.

Furthermore, for example, the present disclosure can have the following configurations.

(1)

An imaging device including:
a first substrate including a pixel that includes a photodiode and floating diffusion configured to hold a charge converted by the photodiode;
a second substrate including a pixel circuit that reads out a pixel signal based on the charge held in the floating diffusion in the pixel, the second substrate being stacked on the first substrate; and
a third substrate including a processing circuit that detects a pixel signal read out by the pixel circuit, the third substrate being stacked on the second substrate; and
a switching unit that enables electrical connection between the floating diffusion and floating diffusion of another pixel in the first substrate, the switching unit being provided in the second substrate.

(2)

The imaging device according to (1),
in which the switching unit enables
connection between floating diffusion of a pixel that is currently selected in the first substrate and floating diffusion of a pixel that is not currently selected in the first substrate.

(3)

An imaging device including:
a first substrate including a pixel including a photodiode and floating diffusion that holds a charge converted by the photodiode;
a second substrate including a pixel circuit that reads out a pixel signal based on the charge held in the floating diffusion in the pixel, and including a readout wiring line in which a pixel signal read out from each of pixel circuits emerges, the second substrate being stacked on the first substrate;
a third substrate including a processing circuit that detects a pixel signal emerging in the readout wiring line from the pixel circuit, the third substrate being stacked on the second substrate; and
a switching unit that is provided on the read out wiring line of the second substrate and configured to disconnect electrical connection between the pixel circuit and the processing circuit.

(4)

The imaging device according to (3),
in which the switching unit disconnects an electrical connection between a signal path on the readout wiring line in which a pixel signal emerges between the pixel circuit that is currently selected and the processing circuit, and a readout wiring line other than the signal path.

(5)

The imaging device according to (4),
in which the switching unit disconnects the electrical connection between the signal path and the readout wiring line other than the signal path by using a plurality of drive modes corresponding to the electrical connection and disconnection between the signal path and the readout wiring line other than the signal path.

(6)

The imaging device according to (5),
in which the switching unit adjusts an amount of current to supplied to the processing circuit in accordance with a plurality of drive modes corresponding to the electrical connection and disconnection between the signal path and the readout wiring line other than the signal path.

(7)

The imaging device according to any one of (3) to (6), the imaging device being configured to connect a first processing circuit in the processing circuit to one end of the read out wiring line and connect a second processing circuit in the processing circuit to the other end of the readout wiring line,
in which the switching unit
disconnects an electrical connection between a first signal path on the readout wiring line in which a pixel signal emerges between a first pixel circuit that is currently selected and the first processing circuit, and a readout wiring line other than the first signal path, and together with this, disconnects an electrical connection between a second signal path on the readout wiring line in which a pixel signal emerges between a second pixel circuit that is currently selected and the second processing circuit, and a readout wiring line other than the second signal path.

REFERENCE SIGNS LIST

1 IMAGING DEVICE
100 FIRST SUBSTRATE
200 SECOND SUBSTRATE
210 PIXEL CIRCUIT
300 THIRD SUBSTRATE
541 PIXEL
543 VERTICAL SIGNAL LINE
550 COLUMN SIGNAL PROCESSING UNIT
PD PHOTODIODE
FD FLOATING DIFFUSION
FDL FD WIRING LINE
AMP AMPLIFICATION TRANSISTOR
SEL SELECTION TRANSISTOR
FDG1 FD TRANSFER TRANSISTOR (SWITCHING UNIT)
SW VERTICAL SIGNAL LINE SWITCH

The invention claimed is:

1. An imaging device, comprising:
a first substrate including a first pixel and a second pixel, wherein
the first pixel includes:
a photodiode configured to generate a charge; and
a first floating diffusion configured to hold the charge generated by the photodiode, and
the second pixel includes a second floating diffusion;
a second substrate including:
a first pixel circuit configured to read out a pixel signal based on the charge held in the first floating diffusion in the first pixel, wherein
the first pixel circuit includes a first selection transistor, and
the second substrate is on the first substrate; and
a second pixel circuit connected to the second pixel, wherein the second pixel circuit includes a second selection transistor;
a third substrate including a processing circuit configured to detect the pixel signal read out by the first pixel circuit, wherein the third substrate is on the second substrate; and
a switching unit configured to enable, based on the first selection transistor that is in an ON state and the second selection transistor that is in an OFF state, electrical connection between the first floating diffusion of the first pixel and the second floating diffusion of the second pixel in the first substrate, wherein the switching unit is in the second substrate.

2. An imaging device, comprising:
a first substrate including a first pixel,
   wherein the first pixel includes:
      a photodiode configured to generate a charge; and
      a first floating diffusion configured to hold the charge generated by the photodiode;
a second substrate including a plurality of pixel circuits and a first readout wiring line, wherein
   a first pixel circuit of the plurality of pixel circuits is configured to read out a first pixel signal based on the charge held in the first floating diffusion in the first pixel,
   the first pixel signal read out from the first pixel circuit emerges in the first readout wiring line, and
   the second substrate is on the first substrate;
a third substrate including a processing circuit configured to detect the first pixel signal in the first readout wiring line, wherein the third substrate is on the second substrate; and
a switching unit on the first readout wiring line of the second substrate and configured to:
   disconnect a first electrical connection between the first pixel circuit and the processing circuit; and
   disconnect a second electrical connection between a first signal path on the first readout wiring line and a second readout wiring line different from the first signal path, wherein
      the first signal path is between the first pixel circuit and the processing circuit,
      the disconnection between the first signal path and the second readout wiring line is based on a plurality of drive modes, and
      the plurality of drive modes corresponds to the second electrical connection and the disconnection between the first signal path and the second readout wiring line.

3. The imaging device according to claim 2, wherein the switching unit is further configured to adjust, based on the plurality of drive modes, an amount of current supplied to the processing circuit.

4. The imaging device according to claim 3, wherein
the processing circuit includes a first processing circuit and a second processing circuit,
the imaging device is further configured to connect the first processing circuit in the processing circuit to a first end of the first readout wiring line and connect the second processing circuit in the processing circuit to a second end of the first readout wiring line, and
the switching unit is further configured to:
   disconnect a third electrical connection between a second signal path on the first readout wiring line and the second readout wiring line,
      wherein the second signal path is between a second pixel circuit of the plurality of pixel circuits and the first processing circuit; and
   disconnect a fourth electrical connection between a third signal path on the first readout wiring line and the second readout wiring line,
      wherein the third signal path is between a third pixel circuit of the plurality of pixel circuits and the second processing circuit.

* * * * *